(12) United States Patent
Chen et al.

(10) Patent No.: US 7,932,539 B2
(45) Date of Patent: Apr. 26, 2011

(54) ENHANCEMENT-MODE III-N DEVICES, CIRCUITS, AND METHODS

(75) Inventors: Jing Chen, Hong Kong (CN); Yong Cai, Hong Kong (CN); Kei May Lau, Hong Kong (CN)

(73) Assignee: The Hong Kong University of Science and Technology, Kowloon (HK)

( * ) Notice: Subject to any disclaimer, the term of this patent is extended or adjusted under 35 U.S.C. 154(b) by 33 days.

(21) Appl. No.: 11/564,766

(22) Filed: Nov. 29, 2006

(65) Prior Publication Data

US 2007/0278518 A1 Dec. 6, 2007

Related U.S. Application Data

(60) Provisional application No. 60/740,256, filed on Nov. 29, 2005, provisional application No. 60/748,339, filed on Dec. 8, 2005.

(51) Int. Cl.
 *H01L 29/66* (2006.01)
(52) U.S. Cl. ........ 257/194; 257/183; 257/192; 257/201; 257/E29.246; 257/E29.249
(58) Field of Classification Search .......... 257/194, 257/E29.249, 192, E33.028, E33.033, 200, 257/E29.246
See application file for complete search history.

(56) References Cited

U.S. PATENT DOCUMENTS

| | | | |
|---|---|---|---|
| 3,767,984 A | 10/1973 | Sinoda et al. | |
| 4,095,331 A | 6/1978 | Rutz | |
| 4,157,556 A | 6/1979 | Decker et al. | |
| 4,615,102 A | 10/1986 | Suzuki et al. | |
| 4,710,787 A | 12/1987 | Usagawa et al. | |
| 5,571,734 A | 11/1996 | Tseng et al. | |
| 5,825,079 A | 10/1998 | Metzler et al. | |
| 5,907,777 A * | 5/1999 | Joseph et al. | 438/275 |
| 6,093,952 A | 7/2000 | Bandic et al. | |
| 6,133,593 A * | 10/2000 | Boos et al. | 257/194 |
| 6,166,404 A | 12/2000 | Imoto et al. | |
| 6,316,793 B1 | 11/2001 | Sheppard et al. | |

(Continued)

FOREIGN PATENT DOCUMENTS

JP 11-121737 * 4/1999

(Continued)

OTHER PUBLICATIONS

Ralph Neuberger et al., "Observation of ion-induced changes in the channel current of high electron mobility AlGaN/GaN transistors (HEMT)", 2002, Elsevier-Materials Science and Engineering, pp. 143-146.*

(Continued)

*Primary Examiner* — Lynne A Gurley
*Assistant Examiner* — Jesse Y Miyoshi
(74) *Attorney, Agent, or Firm* — Turocy & Watson, LLP

(57) ABSTRACT

A method of fabricating AlGaN/GaN enhancement-mode heterostructure field-effect transistors (HFET) using fluorine-based plasma immersion or ion implantation. The method includes: 1) generating gate patterns; 2) exposing the AlGaN/GaN heterostructure in the gate region to fluorine-based plasma treatment with photoresist as the treatment mask in a self-aligned manner; 3) depositing the gate metal to the plasma treated AlGaN/GaN heterostructure surface; 4) lifting off the metal except the gate electrode; and 5) high temperature post-gate annealing of the sample. This method can be used to shift the threshold voltage of a HFET toward a more positive value, and ultimately convert a depletion-mode HFET to an enhancement-mode HFET (E-HFET).

18 Claims, 36 Drawing Sheets

U.S. PATENT DOCUMENTS

| | | | |
|---|---|---|---|
| 6,458,675 B1 | 10/2002 | Marukawa | |
| 6,603,179 B2* | 8/2003 | Ando et al. | 257/369 |
| 6,690,042 B2* | 2/2004 | Khan et al. | 257/192 |
| 6,773,999 B2* | 8/2004 | Yoneda | 438/287 |
| 6,797,555 B1* | 9/2004 | Hopper et al. | 438/217 |
| 6,825,133 B2 | 11/2004 | Yu et al. | |
| 7,052,942 B1 | 5/2006 | Smart et al. | |
| 7,312,472 B2 | 12/2007 | Chiyo et al. | |
| 7,339,209 B2 | 3/2008 | Brar | |
| 7,375,407 B2 | 5/2008 | Yanagihara et al. | |
| 7,402,492 B2 | 7/2008 | Jeon et al. | |
| 2001/0015437 A1 | 8/2001 | Ishii et al. | |
| 2001/0034116 A1 | 10/2001 | Lee et al. | |
| 2002/0177261 A1 | 11/2002 | Song et al. | |
| 2003/0020092 A1 | 1/2003 | Parikh et al. | |
| 2003/0205721 A1 | 11/2003 | Nishii et al. | |
| 2003/0218183 A1 | 11/2003 | Micovic et al. | |
| 2004/0041169 A1 | 3/2004 | Ren et al. | |
| 2004/0135161 A1* | 7/2004 | Taylor | 257/89 |
| 2005/0059197 A1 | 3/2005 | Yamashita et al. | |
| 2005/0110054 A1 | 5/2005 | Wohlmuth | |
| 2005/0189561 A1 | 9/2005 | Kinzer et al. | |
| 2005/0277255 A1 | 12/2005 | Asano | |
| 2006/0060871 A1* | 3/2006 | Beach | 257/94 |
| 2006/0108606 A1 | 5/2006 | Saxler et al. | |
| 2006/0121658 A1 | 6/2006 | Ahn et al. | |
| 2006/0175633 A1 | 8/2006 | Kinzer | |
| 2007/0108547 A1 | 5/2007 | Zhu et al. | |
| 2007/0114569 A1* | 5/2007 | Wu et al. | 257/194 |
| 2007/0224710 A1* | 9/2007 | Palacios et al. | 438/12 |
| 2007/0228416 A1 | 10/2007 | Chen et al. | |
| 2007/0295993 A1 | 12/2007 | Chen et al. | |
| 2008/0116492 A1 | 5/2008 | Wu et al. | |
| 2008/0128752 A1 | 6/2008 | Wu | |
| 2008/0191216 A1 | 8/2008 | Machida et al. | |
| 2009/0032820 A1 | 2/2009 | Chen | |
| 2010/0019279 A1 | 1/2010 | Chen | |

FOREIGN PATENT DOCUMENTS

| | | |
|---|---|---|
| JP | 11121737 A | 4/1999 |

OTHER PUBLICATIONS

Ambacher et al., "Two-dimensional electron gases induced by spontaneousand piezoelectric polarization charges in N-and Ga-face AlGaN/GaNheterostructures." J. Appl. Phys., vol. 85, No. 6, pp. 3222-3233, Mar. 1999.

Ando et al., "10-W/mm AlGaN—GaN HFET With a Field Modulating Plate," IEEE Electron Device Letters, vol. 24, No. 5, 289-291, May 2003.

Ando et al., "Novel AlGaN/GaN Dual-Field-Plate FET With High Gain, Increased Linearity and Stability," IEDM 2005, pp. 576-579, 2005.

Anwar et al. "Carrier trapping and current collapse mechanism in GaN metal-semiconductor field-effect transistors," Appl. Phys. Lett. vol. 84, No. 11, pp. 1970-1972, Mar. 2004.

Ao et al., "Copper gate AlGaN/GaN HEMT with low gate leakage current," IEEE Electron Device Lett., vol. 24, No. 8, pp. 500-502, Aug. 2003.

Arulkumaran et al., "Surface passivation effects on GaN high-electron-mobility transistors with $SiO_2$, $Si_3N_4$, and silicon oxynitride," J. Appl. Phys., vol. 84, No. 4, pp. 613-615, Jan. 2004.

Bahat-Treidel et al., "Punchthrough-Voltage Enhancement of AlGaN/GaN HEMTs Using AlGaN Double-Heterojunction Confinement", IEEE Trans. Electron Devices vol. 55, No. 12, pp. 3354-3359, Dec. 2008.

Bahl et al., "A New Drain-Current Injection Technique for the Measurement of Off-State Breakdown Voltage in FET's," IEEE Trans. Electron Devices, vol. 40, No. 8, pp. 1558-1560, Aug. 1993.

Bandic et al., "High voltage (450 V) GaN Schottky rectifiers," Applied Physics Letters vol. 74, No. 9, pp. 1266-1268, Mar. 1999.

Ben-Yaacov et al., "AlGaN/GaN current aperture vertical electron transistors with regrown channels,"J. Appl. Phys., vol. 95, No. 4, pp. 2073-2078, Feb. 2004.

Bern et al., "Effect of surface passivation on performance of AlGaN/GaN/Si HEMTs," Solid State Electron., vol. 47, No. 11, pp. 2097-2103, Nov. 2003.

Boguslawski et al., "Native Defects in Gallium Nitride". Phys. Rev. B, vol. 51, No. 23, pp. 17255-17259, Jun. 1995.

Cai et al., "Control of Threshold Voltage of AlGaN/GaN HEMTs by Fluoride-Based Plasma Treatment From Depletion to Enhancement Mode," IEEE Electron Device Letters, vol. 53, No. 9, pp. 2207-2215, 2006.

Cai et al., "Ill-nitride metal-insulator-semiconductor heterojunction field-effect transistor," Appl. Phys. Lett., vol. 86, No. 3, p. 032109, Jan. 2005.

Cai et al., "High-Performance Enhancement-Mode AlGaN/GaN HEMTs Using Fluoride-Based Plasma Treatment," IEEE Electron Device Lett. vol. 26, No. 7, pp. 435-437, Jul. 2005.

Cai et al., "Monolithically Integrated Enhancement/Depletion-Mode AlGaN/GaN HEMT Inverters and Ring Oscillators Using CF4 Plasma Treatment," IEEE Trans. Electron Devices, vol. 53, No. 9, pp. 2223-2230, Sep. 2006.

Cai et al., "Monolithic integration of enhancement- and depletion-mode AlGaN/GaN HEMTs for GaN digital integrated circuits," in IEDM Tech. Dig., Dec. 2005, pp. 771-774.

Cai et al., "High-Temperature Operation of AlGaN/GaN HEMTs Direct-Coupled FET Logic (DCFL) Integrated Circuits," IEEE Electron Device Lett. vol. 28, No. 5, pp. 328-331, May 2007.

Chen et al., "High-Performance InP-based Enhancement-Mode HEMTs Using Non-Alloyed Ohmic Contacts and Pt-based Buried-Gate Technologies," Feb. 1996, IEEE Trans. on Electron Devices, vol. 43, No. 2, pp. 252-257.

Chen et al., "AlGaN/GaN dual-gate modulation-doped field-effect transistors" IEEE Electronics Letters vol. 35, No. 11, pp. 933-934, May 1999.

Chen et al., "Dual-Gate AlGaN/GaN Modulation-Doped Field-Effect Transistors with Cut-Off Frequencies fT > 60 GHz," IEEE Electron Device Lett., vol. 21, No. 12, pp. 549-551, Dec. 2000.

Chini et al., "Power and linearity characteristics of GaN MISFET on sapphire substrate," IEEE Electron Device Lett., vol. 25, No. 2, pp. 55-57, Feb. 2004.

Chow et al., "Wide band gap compound semiconductors for superior high-voltage unipolar power devices," IEEE Trans. Electron Devices, vol. 41, No. 8, pp. 1481-1483, Aug. 1994.

Chu, "Recent developments and applications of plasma immersion ion implantation," J. Vac. Sci. Technol. B, vol. 22, No. 1, pp. 289-296, Jan./Feb. 2004.

Dang et al., "Fabrication and characterization of enhanced barrier AlGaN/GaN HFET", Electron. Lett. vol. 35, No. 7, pp. 602-603, 1999.

Daumiller et al., "Evaluation of the temperature stability of AlGaN/GaN heterostructure FET's," IEEE Electron Device Lett., vol. 20, No. 9, pp. 448-450, Sep. 1999.

Di Forte-Poisson et al., "Relationship between physical properties and gas purification in GaN grown by metalorganic vapor phase epitaxy," J. Cryst. Growth, vol. 195, No. 1-4 pp. 314-318, Dec. 1998.

Dora et al., "High breakdown voltage achieved on AlGaN/GaN HEMTs with integrated slant field plates," IEEE Electron Device Lett., vol. 27, No. 9, pp. 713-715, Sep. 2006.

Ketterson et al., "GaAs/AlGaAs and InGaAs/AlGaAs MODFET inverter simulations," IEEE Trans. Electron Devices, vol. ED-33, No. 11, pp. 1626-1634, 1986.

Dyakonova et al., "Temperature dependence of impact ionization in AlGaN-GaN heterostructures field effect transistors," Appl. Phys. Lett. vol. 72, No. 20, pp. 2562-2564, May 1998.

Eden et al., "Planar GaAs IC Technology: Applications for digital LSI," IEEE J. Solid-State Circuits, vol. 13, No. 4, pp. 419-426, Aug. 1978.

Egawa et al., "Characterizations of recessed gate AlGaN/GaN HEMTs on sapphire," IEEE Trans. Electron Devices, vol. 48, No. 3, pp. 603-608, Mar. 2003.

Endoh et al., "Non-recessed-gate enhancement-mode AlGaN/GaN high electron mobility transistors with high RF performance," Jpn. J. Appl. Phys., vol. 43, No. 4B, pp. 2255-2258, 2004.

Hashizume et al., "Leakage mechanism in GaN and AlGaN Schottky interfaces," Appl. Phys. Lett., vol. 84, No. 24, pp. 4884-4886, Jun. 2004.

Hashizume et al., "Suppression of current collapse in insulated gate AlGaN/GaN heterostructure field-effect transistors using ultrathin Al.sub.20.sub.3 dielectric," Appl. Phys. Lett., vol. 83, No. 14, pp. 2952-2954, Oct. 2003.

Heikman et al., "Growth of Fe doped semi-insulating GaN by metalorganic chemical vapor deposition," Appl. Phys. Lett. vol. 81, No. 3, pp. 439-441, Jul. 2002.

Horio et al., "Physics-based simulation of buffer-trapping effects on slow current transients and current collabpse in GaN field effect transistors," J. Appl. Phys., vol. 98, pp. 124502-1-124502-7, Dec. 2005.

Hu et al., "Si.sub.3N.sub.4 /AlGaN/GaN-metal-insulator-semiconductor heterostructure field-effect transistors," Appl. Phys. Lett., vol. 79, No. 17, pp. 2832-2834, Oct. 2001.

Hu et al., "Enhancement mode AlGaN/GaN HFET with selectively grown pn junction gate," Electron. Lett., vol. 36, No. 8, pp. 753-754, 2000.

Hussain, et al., "GaN HFET digital circuit technology for harsh environments," Electron. Lett., vol. 39, No. 24, pp. 1708-1709. Nov. 2003.

Irokawa et al., "Current—voltage and reverse recovery characteristics of bulk GaN p-i -n. rectifiers," Applied Physics Letters, vol. 83, No. 11, pp. 2271-2273, Sep. 2003.

Jia et al., "Enhancement-mode AlGaN/GaN HEMTs on silicon substrate" phys. stat. sol. (c) 3, No. 6, 2368-2372 (2006).

Joh et al., "Mechanisms for Electrical Degradation of GaN High-Electron Mobility Transistors," Electron Devices Meeting, 2006. IEDM '06. International Volume, Dec. 11-13, 2006.

Johnson et al., "Breakdown Voltage and Reverse Recovery Characteristics of Free-Standing GaN Schottky Rectifiers," IEEE Transactions on Electron Devices, vol. 49, No. 1, pp. 32-36, Jan. 2002.

Johnson et al., "12 W/mm AlGaN/GaN HFETs on siicon substrates," IEEE Electron Device Lett., vol. 25, No. 7, pp. 459-461, Jul. 2004.

Kanamura et al., "An over 100 W n-GaN/n-AlGaN/GaN MIS-HEMT power amplifier for wireless base station applications," in IEDM Tech. Dig., Dec. 2005, pp. 572-575.

Kanechika et al., "A vertical insulated gate AlGaN/GaN heterojunction field-effect transistor," Jpn. J. Appl. Phys., vol. 46, No. 21, pp. L503-L505, May 2007.

Karmalkar et al., "Enhancement of Breakdown Voltage in AlGaN/GaN High Electron Mobility Transistors Using a Field Plate," IEEE Trans. Electron Devices, vol. 48, No. 8, pp. 1515-1521, Aug. 2001.

Karmalkar et al., "Mechanism of the reverse gate leakage in AlGaN/GaN high electron mobility transistors," Appl. Phys. Lett., vol. 82, No. 22, pp. 3976-3978, Jun. 2000.

Khan et al., "Insulating gate III-N heterostructure field-effect transistors for high-power microwave and switching applications," IEEE Trans. Microw. Theory Tech., vol. 51, No. 2, pp. 624-633, Feb. 2003.

Khan et al., "Enhancement and depletion mode GaN/AlGaN heterostructure field effect transistors," Appl. Phys. Lett., vol. 68, No. 4, pp. 514-516, Jan. 1996.

Khan et al., "AlGaN/GaN metal oxide semiconductor heterostructure field effect transistor," IEEE Electron Device Lett., vol. 21, No. 2, pp. 63-65, Feb. 2000.

Kim et al., "Gate current leakage and breakdown mechanism in unpassivated AlGaN/GaN high electron mobility transistors by post-gate annealing" , Appl. Phys. Lett. vol. 86, 143505, Mar. 2005.

Koudymov et al., "Maximum current in nitride-based heterostructure field-effect transistors," Appl. Phys. Lett., vol. 80, No. 17, pp. 3216-3218, Apr. 2002.

Kumar et al., "AlGaN/GaN HEMTs on SiC with fT of over 120 GHz," IEEE Electron Device Lett. vol. 23, No. 8, pp. 455-457, Aug. 2002.

Kumar et al., "High transconductance enhancement-mode AlGaN/GaN HEMTs on SiC substrate," Electron. Lett., vol. 39, No. 24, pp. 1758-1760, Nov. 2003.

Lanford, et al., "Recessed-gate enhancement-mode GaN HEMT with high threshold Voltage," Electron. Lett., vol. 41, No. 7, pp. 449-450, Mar. 2005.

Lee et al., "High Breakdown Voltage GaN Schottky Barrier Diode employing Floating Metal Rings on AlGaN/GaN Hetero-junction," Proceedings of the 17 International Symposium on Power Semiconductor Devices & IC's May 23-26, 2005 Santa Barbara, CA.

Limb et al., "Low on-resistance GaN pin rectifiers grown on 6H-SiC substrates," Electronics Letters vol. 43 No. 6, Mar. 2007.

Liu et al., "AlGaN/GaN/InGaN/GaN Double Heterojunction HEMTs with an InGaN-Notch for Enhanced Carrier Confinement," IEEE Electron Device Lett. vol. 27, No. 1, pp. 10-12, Jan. 2006.

Liu et al., "DC and RF Characteristics of AlGaN/GaN/InGaN/GaN Double-Heterojunction HEMTs," IEEE Trans. Electron Devices, vol. 54, No. 1, pp. 2-10, Jan. 2007.

Mahajan et al."Fabrication and characterization of an InAlAs/InGaAs/InP ring oscillator using integrated enhancement- and depletion-mode high-electron mobility transistors," IEEE Electron Device Lett., vol. 18, No. 8, pp. 391-393, Aug. 1997.

Meneghesso et al., "Current Collapse and High-Electric-Field Reliability of Unpassivated GaN/AlGaN/GaN HEMTs," IEEE Electron Device Lett., vol. 53, No. 12, pp. 2932-2941, Dec. 2006.

Menozzi, Roberto, "Off-State Breakdown of GaAs PHEMTs: Review and New Data", IEEE Trans. Electron Devices vol. 4, No. 1, pp. 54-62, Mar. 2004.

Micovic et al., "GaN double heterojunction field effect transistor for microwave and millimeterwave power applications," in IEDM Tech. Dig. 2004, pp. 807-810.

Micovic et al., "GaN enhancement/depletion-mode FET logic for mixed signal applications," Electron. Lett., vol. 41, No. 19, pp. 1081-1083, Sep. 2005.

Mikkelson et al., "High-density GaAs integrated circuit manufacturing," IEEE Trans. Semicond. Manuf., vol. 16, No. 3, pp. 384-389, Aug. 2003.

Miller et al., "Gate leakage current mechanisms in AlGaN/GaN heterostructure field-effect transistors," J. Appl. Phys., vol. 88, No. 10, pp. 5951-5953, Nov. 2000.

Moon et al., "Submicron Enhancement-Mode AlGaN/GaN HEMTs," Jun. 2002, Digest of 60th Device Research Conference, pp. 23-44.

Nakao et al., "Study on off-state breakdown in AlGaN/GaN HEMTs," Phys. Stat. Sol. (c) vol. 0, No. 7, pp. 2335-2338, Dec. 2003.

Neudeck et al., "High-temperature electronics—A role for wide bandgap semiconductors?," Proc. IEEE, vol. 90, No. 6, pp. 1065-1076, Jun. 2002.

Nowakowski, "Choosing the Optimum Switching Frequemncy for DC-DC Converters," EE Times-India, Oct. 2006.

Ohno et al., "Effects of surface passivation on breakdown of AlGaN/GaN high-electron-mobility transistors," Appl. Phys. Lett. vol. 84, No. 12, pp. 2184-2186, Mar. 2004.

Omura et al. "Gallium Nitride Power HEMT for High Switching Frequency Power Electronics," IEEE pub. No. 978-14244-17285 (2007).

Palacios et al., "AlGaN/GaN high electron mobility transistors with InGaN back-barriers," IEEE Electron Device Lett., vol. 27, No. 1, pp. 13-15, Jan. 2006.

Palacios et al., "High-performance E-mode AlGaN/GaN HEMTs," IEEE Electron Device Lett., vol. 27, No. 6, pp. 428-430, Jun. 2006.

Cai et al., Published conference abstract of submission on Jan. 27, 2005 to the 4ih Electronics Material Conference, which was held on Jun. 22-24, 2005 in Santa Barbara, California, entitled "Threshold Voltage Control of AlGaN/GaN HEMTs by CF4 Plasma Treatment".

Rumyantsev et al., "Effect of gate leakage current on noise properties of AlGaN/GaN field effect transistors," J. Appl. Phys., vol. 88, No. 11, pp. 6726-6730, Dec. 2000.

Saito et al., "Recessed-Gate Structure Approach Toward Normally Off High-Voltage AlGaN/GaN HEMT for Power Electronics Applications," 53 IEEE Transactions of Electron Devices 356-362, Feb. 2006.

Saito et al., "High breakdown voltage AlGaN-GaN power-HEMT design and high current density switching behavior," IEEE Trans. Electron Devices, vol. 50, No. 12, pp. 2528-2531, Dec. 2003.

Sierakowski et al., "Analysis of Schottky gate electron tunneling in polarization induced AlGaN/GaN high electron mobility transistors," J. Appl. Phys., vol. 86, No. 6, pp. 3398-3401, Sep. 1999.

Song et al., "Normally Off AlGaN/GaN Low-Density Drain HEMT (LDD-HEMT) With Enhanced Breakdown Voltage and Reduced Current Collapse". IEEE Electron Device Lett., vol. 28, No. 3, pp. 189-191, 2007.

Takatani et al., "AlGaN/GaN Schottky-ohmic combined anode field effect diode with fluoride-based plasma treatment," Electronics Letters vol. 44 No. 4, Feb. 2008.

Tan et al., "Gate leakage effect and breakdown voltage in metalorganic vapor phase epitaxy AlGaN/GaN heterostructure field-effect transistors", Appl. Phys. Lett. vol. 80, No. 17, pp. 3207-3209, Apr. 2002.

Tanimoto et al., "Single-Voltage-Supply Highly Efficient E/D Dual-Gate Pseudomorphic Double-Hetero HEMT's with Platinum Buried Gates" IEEE Electron Device Lett., vol. 45, No. 6, pp. 1176-1182, Jun. 1998.

Tipirneni et al., "The 1.6-kV AlGaN/GaN HFETs" IEEE Electron Device Lett., vol. 27, pp. 716-718, 2006.

Uemoto et al., "8300V Blocking Voltage AlGaN/GaN Power HFET with Thick Poly-AlN Passivation," IEDM'07, pp. 861-864, 2007.

Uren et al., "Punchthrough in short-channel AlGaN/GaN HFETs," IEEE Trans. Electron Devices, vol. 53, No. 2, pp. 395-398, Feb. 2006.

Vetury et al., "Performance and RF Reliability of GaN-on-SiC HEMT's using Dual-Gate Architectures" pp. 714-717, 2006.

Wang et al., "Source Injection Induced Off-State Breakdown and Its Improvement by Enhanced Back Barrier with Fluorine Ion Implantation in AlGaN/GaN HEMTs," IEDM'08, pp. 149-152, 2008.

Wang et al., "Enhancement Mode $Si_3N_4$/AlGaN/GaN MISHFETs," IEEE Electron Device Letters, vol. 27, No. 10, pp. 793-795, 2006.

Wang et al., "Planar Integration of E/D-Mode AlGaN/GaN HEMTs Using Fluoride-Based Plasma Treatment," IEEE Electron Device Letters, vol. 27, No. 8, pp. 633-635, Aug. 2006.

Webb et al., "Semi-insulating C-doped GaN and high-mobility AlGaN/GaN heterostructures grown by ammonia molecular beam epitaxy," Appl. Phys. Lett. vol. 75, No. 7, pp. 953-955, Aug. 1999.

Wu et al., "High-gain Microwave GaN HEMTs with Source-terminated Field-plates" IEDM 2004, pp. 1078-1079.

Wu et al., "30-W/mm GaN HEMT by field plate optimization," IEEE Electron Device Lett. vol. 25, No. 3, pp. 117-119, Mar. 2004.

Xing et al., "High breakdown voltage AlGaN—GaN HEMTs achieved by multiple field plates," IEEE Electron Device Lett., vol. 25, No. 4, pp. 161-163, Apr. 2004.

Yoshida et al., "Low On-Voltage Operation AlGaN/GaN Schottky Barrier Diode with a Dual Schottky Structure," IEICE Trans. Electron., vol. E88—C, No. 4, pp. 690-693, Apr. 2005.

Zhang et al., "Vertical and lateral GaN rectifiers on free-standing GaN substrates," Applied Physics Letters vol. 79, No. 10, pp. 1555-1557, Sep. 2001.

Zhang et al., "Comparison of GaN P-I-N and Schottky Rectifier Performance," IEEE Transactions on Electron Devices, vol. 48, No. 3, pp. 407-501, Mar. 2001.

Zhang et al., "Kilovolt AlGaN/GaN HEMTs as Switching Devices," phys. stat. sol. (a) 188, No. 1, 213-217 (2001).

Zhou et al., "High breakdown voltage Schottky rectifier fabricatedon bulk n-GaN substrate," Solid-State Electronics 50 (2006) 1744-1747.

Ziegler, James, "Instruction Manual: The Stopping and Range of Ions in Matter," Dec. 22, 1995.

Final Office Action dated Dec. 24, 2009, issued in U.S. Appl. No. 11/564,780.

Non-Final Office Action dated Jan. 5, 2009, issued in U.S. Appl. No. 11/564,780.

Non-Final Office Action dated Jun. 29, 2009, issued in U.S. Appl. No. 11/564,780.

Final Office Action dated Dec. 12, 2008, issued in U.S. Appl. No. 11/564,795.

Non-Final Office Action dated Dec. 10, 2009, issued in U.S. Appl. No. 11/564,795.

Non-Final Office Action dated May 13, 2008, issued in U.S. Appl. No. 11/564,795.

Non-Final Office Action dated Jun. 10, 2009, issued in U.S. Appl. No. 11/564,795.

Lab notes between Mar. 29-Oct. 30, 2004 of Dr. Yong Cai, one of the inventors.

Email from Dr. Cai to Dr. Chen dated Oct. 29, 2004 and attachment report.

Cai et al. "Self-aligned Enhancement Mode AlGan/GaN HEMTs Using Fluoride-based Plasma Treatment" 2005 IEEE, pp. 179-180.

Okamoto et al., "Improved Power Performance for a Recessed-Gate AlGaN-GaN Heterojunction FET With a Field-Modulating Plate," IEEE Transactions on Microwave Theory and Techniques, vol. 52, No. 11, Nov. 2004, pp. 2536-2540.

Liu et al., "Highly Linear $Al_{0.3}Ga_{0.7}N$-$Al_{0.05}Ga_{0.95}N$-GaN Composite-Channel HEMTs," IEEE Electron Device Letters, vol. 26, No. 3, Mar. 2005, pp. 145-147.

Office Action dated Jun. 24, 2010 for U.S. Appl. No. 11/564,795, 72 pages.

Office Action dated Feb. 22, 2011, for U.S. Appl. No. 12/414,865, 46 pages.

\* cited by examiner

Figure 9

EXTRACTED BARRIER HEIGHTS AND IDEALITY FACTORS OF GATE SCHOTTKY DIODES WITH DIFFERENT PLASMA TREATMENTS FROM FORWARD GATE CURRENTS; THRESHOLD VOLTAGES ARE ALSO LISTED

| $CF_4$ Plasma treatment condition | Barrier height (eV) | Ideality factor | $V_{th}$ (V) |
|---|---|---|---|
| Conventional HEMT | 0.4 | 8 | -4.0 |
| 100W, 60s | 0.6 | 4 | -2.87 |
| 150W, 20s | 0.71 | 2.5 | -2.37 |
| 150W, 60s | 0.62 | 4.8 | -1.53 |
| 150W, 150s | 0.74 | 3.5 | 0.9 |
| 200W, 60s | 0.9 | 2.4 | -0.29 |

Figure 16

On-Wafer Measured $f_t$ And $f_{max}$ Of AlGaN/GaN HEMTs With Different Plasma Treatments

| CF$_4$ Plasma treatment condition | $f_t$ (GHz) @ V$_{gs}$, V$_{ds}$ | $f_{max}$ (GHz) @ V$_{gs}$, V$_{ds}$ |
|---|---|---|
| Conventional HEMT | 13.1 @ -3V, 12V | 37.1 @ -3V, 2V |
| 100W, 60s | 10.3 @ -0.5V, 8V | 34.1 @ -1V, 8V |
| 150W, 20s | 10.3 @ -1V, 8V | 35.7 @ -2V, 8V |
| 150W, 60s | 14.3 @ 0V, 8V | 38.9 @ 0V, 12V |
| 150W, 150s | 10.1 @ 1.9V, 12V | 34.3 @ 1.9V, 12V |
| 200W, 60s | 9.9 @ 1.2V, 12V | 31.5 @ 0.8V, 12V |

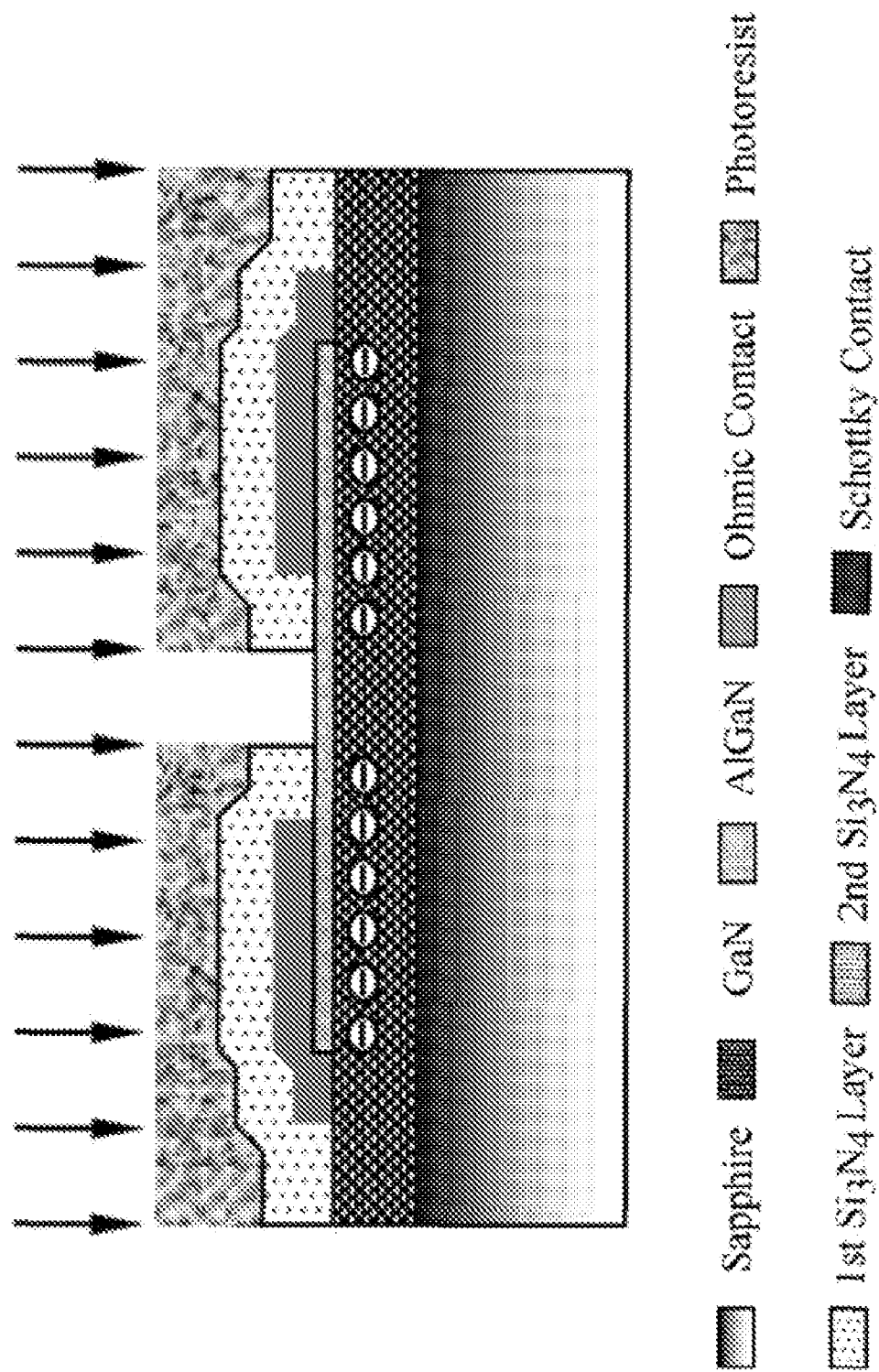

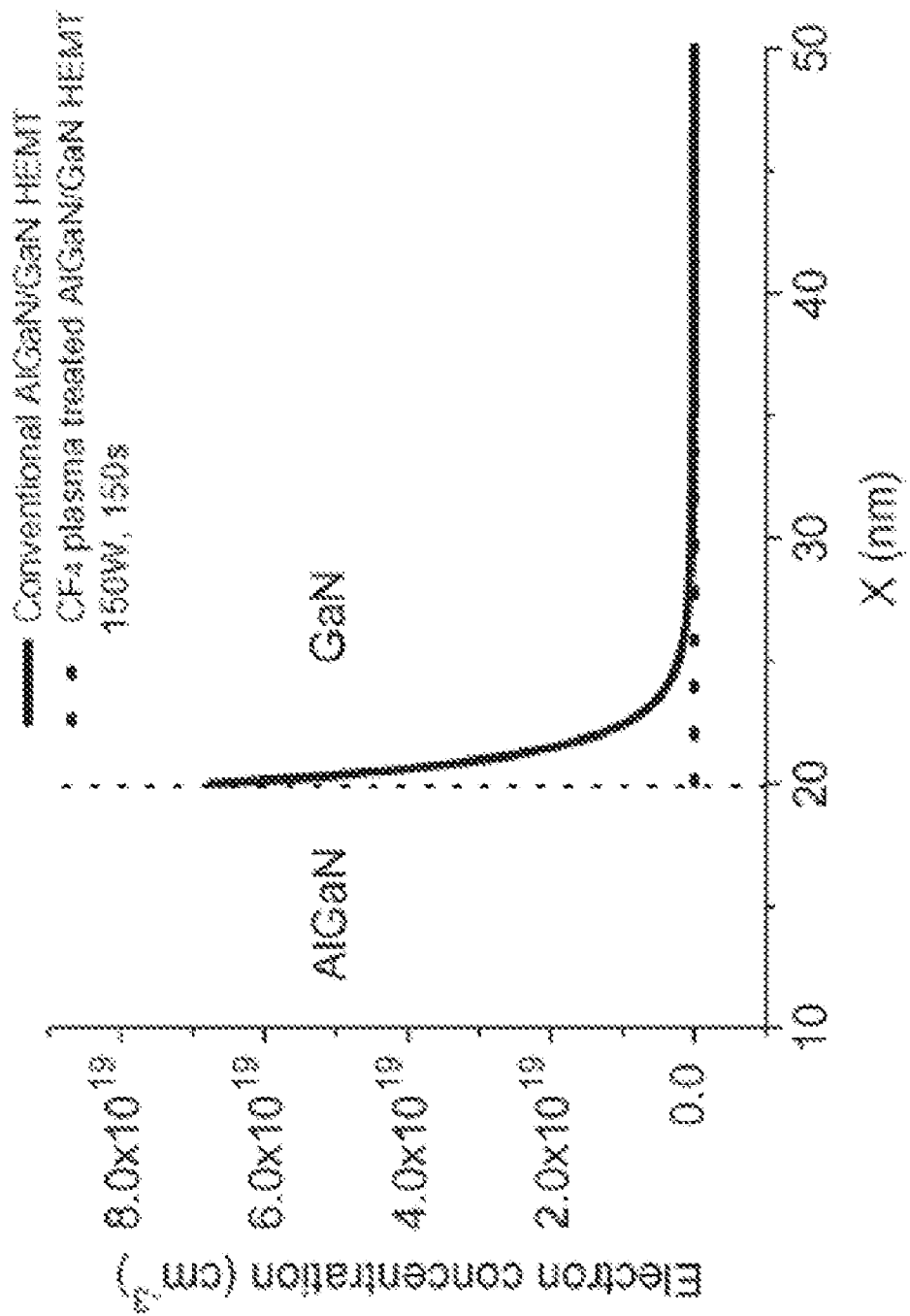

ENHANCEMENT-MODE III-N DEVICES, CIRCUITS, AND METHODS

CROSS-REFERENCE TO RELATED APPLICATIONS

This application claims priority from U.S. Provisional Patent Application No. 60/740,256 filed on Nov. 29, 2005, and also from U.S. Provisional Patent Application No. 60/748,339 filed on Dec. 8, 2005, both of which are hereby incorporated by reference.

BACKGROUND AND SUMMARY OF THE INVENTION

The present application relates to structures and methods of fabricating enhancement-mode heterostructure field effect transistors ("HFETs"), and in particular, to aluminum-gallium-nitride/gallium-nitride ("AlGaN/GaN") enhancement-mode HFETs. Group III-nitride ("III-N") compound semiconductors, such as those incorporating AlGaN/GaN, possess the advantages of having wide bandgap, high breakdown field, and large thermal conductivity, which can bring significant benefits to the design of heterostructure field-effect transistors and applications ultilizing HFETs. Because their high power handling capabilities, AlGaN/GaN HFETs can be used for radio frequency/microwave power amplifiers and high power switches. However, most power amplifiers and switches using AlGaN/GaN HFETs feature depletion-mode ("D-mode") HFETs as the building block. Since a D-mode HFET is a transistor with a negative value for the threshold voltage ("$V_{th}$"), D-mode HFETs need both a positive and negative voltage bias to be turned on and off. If an enhancement-mode ("E-mode") HFET could be made available, only a positive voltage supply would be needed for circuit applications, resulting in simplified circuits and reduced costs.

Furthermore, owing to the wide bandgap of the GaN-based semiconductor materials, AlGaN/GaN HFETs are capable of high-temperature operation (potentially up to 600° C.), and are thus suitable for high-temperature integrated circuits, such as required in aviation and automotive applications. Further, for HFET-based logic circuits, the direct-coupled field effect transistor logic ("DCFL") features the simplest configuration. In DCFLs, E-mode HFETs are used as drivers while D-mode HFETs are used as the load.

Note that at zero gate bias, a D-mode HFET is capable of conducting current, and is called "normally-on" whereas for an E-mode HFET, the transistor is not conducting current, and is called "normally-off".

FIG. 1 shows an E-mode HFET 10 using a thin AlGaN barrier layer 12, an undoped GaN layer 18, and a substrate layer 20, such as can be made from sapphire, silicon, or silicon carbide. With the help of the Schottky barrier 14 between the gate metal 16 and AlGaN barrier, the channel between source 22 and drain 24 can be pinched-off at zero gate bias as long as the AlGaN barrier is thin enough. However, E-mode HFET's fabricated in this manner have poor performance characteristics, such as low transconductance, large on-resistance, and high knee-voltage. This is due to high access resistance. As shown in FIG. 1, the access region between the gate and source also has very low carrier density because of the thin AlGaN barrier. Thus, the access region is also in the E-mode, which needs positive bias to be turned on. To produce E-mode HFETs with low access resistance, a "self-aligned" fabrication process is required, in which only the channel region directly under the gate electrode is in E-mode. Note that gates that are not self-aligned require overlap, which increases device size and stray capacitance.

There have been several attempts at fabrication of E-mode AlGaN/GaN high electron mobility transistors ("HEMTs"). Note that the terms "HEMT" and "HFET" are synonymous. Both are field effect transistors with the junction between two materials with different band gaps, e.g. a heterostructure as the channel. The effect of this heterostructure is to create a very thin layer where the Fermi energy is above the conduction band, giving the channel very low resistance, e.g. "high electron mobility". As with all the other types of FETs, a voltage applied to the gate alters the conductivity of the thin layer.

Using a thin AlGaN barrier (10 nm), Khan et al. produced an E-mode HEMT with a peak transconductance of 23 mS/mm.

Another attempt to fabricate an E-mode HFET in an AlGaN/GaN system was reported by Hu et al., "Enhancement mode AlGaN/GaN HFET with selectively grown PN junction gate," April 2000, IEE Electronics Letters, Vol. 36, No. 8, pp. 753-754, which is hereby incorporated by reference in its entirety. In this work a selectively-grown P/N junction gate is used. The selectively-grown P-type layer is able to raise the potential of the channel and therefore deplete the carriers from the channel at zero gate bias. However, such an approach is not self-aligned and the problem of large access resistance persists.

Another attempt to fabricate an E-mode HFET in an AlGaN/GaN system was reported by Moon et al. who used inductivity couple plasma reactive ion etching ("ICP-RIE") to carry out gate recess-etching. See Jeong S. MOon et al., "Submicron Enhancement-Mode AlGaN/GaN HEMTs," June 2002, Digest 60th Device Research Conference, pp. 23-24, which is hereby incorporated by reference in its entirety.

Kumar et al. used a similar approach. Note that the AlGaN barrier under the gate can be thinned by the recess-etching and the threshold voltage is then raised to a positive value. However, ICP-RIE can cause serious damage to the AlGaN barrier and results in increased gate leakage current. To remove ICP-RIE induced damage, the recess-etching patterns must be removed and followed by high-temperature (about 700° C.) annealing. Thus, the gate patterns have to be created again through photo-lithography which cannot be accurately aligned with the recess-etching windows previously generated in the gate recess stage. Therefore, the process requires double photolithography, or alignment, and is not self-aligned. To ensure that the recess windows are fully covered by the gate electrodes, the gate electrodes need to be larger than the recess windows, resulting in a larger gate size, as mentioned earlier. Another problem associated with the ICP-RIE etching is the poor uniformity in the etching depth, which is undesirable for integrated circuits because it severely affects the uniformity in the threshold voltage.

Another approach used gate metals, e.g. Platinum ("Pt") or Molybdenum ("Mo"), that have larger work function and have the tendency of reacting with III/V compound semiconductors. (Work function refers to the energy required to release an electron as it passes through the surface of a metal. For example, a Pt-based buried gate technology was previously used in realizing E-mode indium-aluminum-arsenide/indium-gallium-arsenide ("InAlAs/InGaAs") HFETs. For AlGaN/GaN HFETs, Endoh et al. created an E-mode HFET from a D-mode HFET with a Pt-based gate electrode. Through high temperature gate annealing, the gate metal front can be made to sink into the AlGaN barrier and effectively reduce the barrier thickness and raise the threshold voltage to a positive value. Such an approach requires a D-mode HFET with a threshold voltage already close to zero because the sinking depth of the Pt-gate is limited. However, for monolithically-integrated E/D-mode HFET circuits, it is desirable for the D-mode HFET (which serves as the load) to have a more negative threshold voltage.

U.S. patent application Ser. No. 20030218183 entitled "High Power-Low Noise Microwave GaN Heterostructure Field Effect Transistor" to Miroslav Micovic et al., discloses a gate recess technique as one existing process technique to fabricate E-mode HFETs. However, in an AlGaN/GaN HFET, because of the lack of effective wet etching techniques, the recess etching is carried out by dry etching. For example, ICP-RIE is used for the recess etching, as mentioned earlier, with the accompanying severe damage and defects to the device.

U.S. patent application Ser. No. 2005059197 entitled "Semiconductor Device and Method for Manufacturing the Same" to Yoshimi Yamashita et al., discloses a technique usint the approach of using gate metals with larger work function for fabricating E-mode HFETs in GaN-based material systems. However, no metal has been found to have a work function larger than 1 electron volt ("eV"). As a result, in order to fabricate an E-mode HFET using the method of Yamashita et al., a sample which already exhibits a threshold voltage closer to zero volts is needed. This is not suitable for the integration of E-mode and D-mode HEMTs, which are both required for DCFL circuits.

III-N Enhancement-Mode Devices, Circuits, and Methods

The present application describes a new family of approaches to III-N device fabrication. According to various embodiments, fluorine ions are introduced into the wider-bandgap layer under the gate electrode as a step in the fabrication of a HEMT or the like. The implanted ions are substantially immobile and can effectively deplete the electrons in the channel underneath. Rapid thermal annealing as a further fabrication step fully repairs degradation of the carrier mobility in the channel without any other adverse effects to the HFETs. The resulting HFET has an access region between the source and gate electrodes that possesses high carrier density in the channel while maintaining low access resistance.

The disclosed innovations, in various embodiments, provide on or more of at least the following advantages:

Provides a self-aligned approach to fabricating E-mode AlGaN/GaN HEMTs with low on-resistance, low knee-voltage, and high extrinsic transconductance.

Allows for monolithic integration of enhancement-mode and depletion-mode AlGaN/GaN HEMTs for the implementation of DCFL circuits, with the simplest circuit configuration among several choices.

Allows for a single positive polarity voltage supply for radio-frequency and microwave front-end circuit blocks including power amplifiers, low-noise amplifiers, mixers and oscillators.

Provides an E-mode HFET with a Vt several volts higher than a AlGaN/GaN HFET not using the benefits of the present inventions.

Provides a method to manufacture self-aligned E-mode HFETs using readily available microelectronic fabrication equipment.

Provides a method enabling the production of reproducible and stable E-mode HEFT devices, particularly suitable for high temperature digital circuit applications.

Provides a method enabling the production of protection-circuit-free low-noise amplifiers.

Provides a method enabling the production of 1 μm-gate E-mode HEMT with a high cutoff frequency Provide a method for fabricating ehancement-mode metal-insulator-semiconductor HFETs (MIS-HFETs) with more positive threshold voltages and higher gate turn-on voltages.

BRIEF DESCRIPTION OF THE DRAWINGS

The disclosed innovations will be described with reference to the accompanying drawings, which show important sample embodiments of the innovations and which are incorporated in the specification hereof by reference, wherein:

FIG. 9 shows the extracted barrier heights and ideality factors of gate Schottky diodes with different $CF_4$ plasma treatments for various embodiments of the present innovations as illustrated in Example 3.

FIG. 16 shows on-wafer measured $f_t$ and $f_{max}$ with different $CF_4$ plasma treatments for various embodiments of the present innovations as illustrated in Example 3.

FIGS. 17A through 17F show on embodiment of the present innovations illustrating the process of fabricating an E-mode $Si_3N_4$AlGaN/GaN MISHFET according to the present innovations as illustrated in Example 4.

FIG. 24 shows the electron concentration of a conventional D-mode AlGaN/GaN HEMT without $CF_4$ plasma treatment and an E-mode AlGaN/GaN HEMT with $CF_4$ plasma treatment.

DETAILED DESCRIPTION OF THE PREFERRED EMBODIMENTS

The numerous innovative teachings of the present application will be described with particular reference to the presently preferred embodiments (by way of example, and not limitation).

Figure 3A:
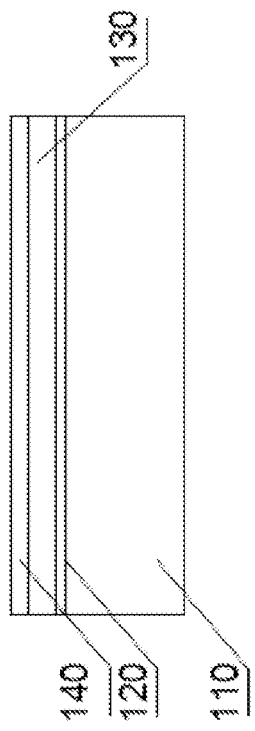
FIGS. 3A through 3F show one embodiment of the present innovations illustrating the process of fabricating an E-mode AlGaN/GaN HEFT according to a first embodiment of the present innovations as illustrated in Example 1.
Figure 3B:
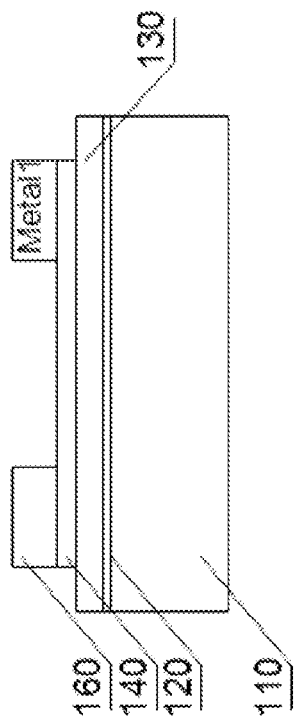
Figure 3C:
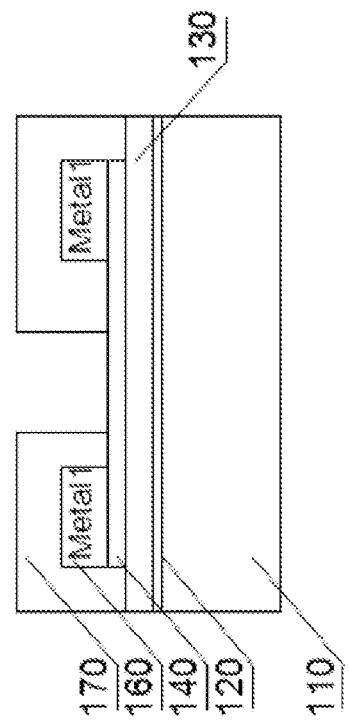
Figure 3D:
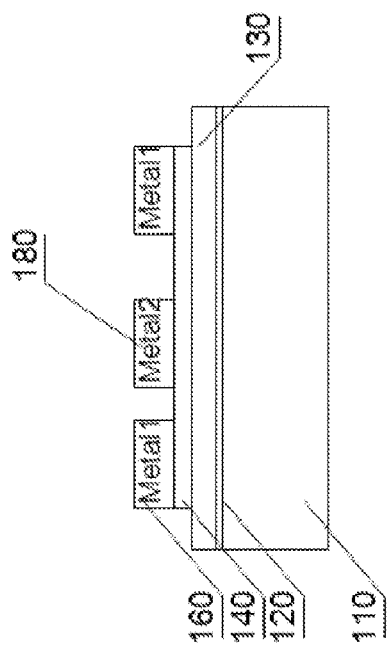
Figure 3E:
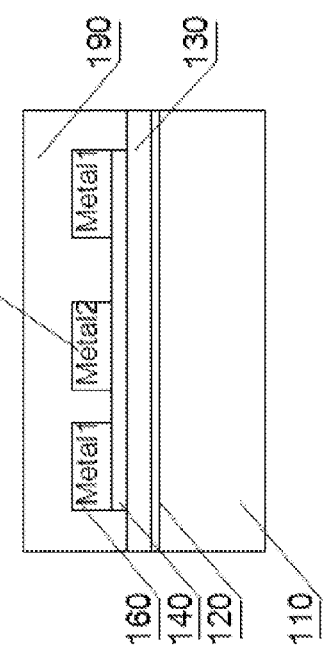
Figure 3F:
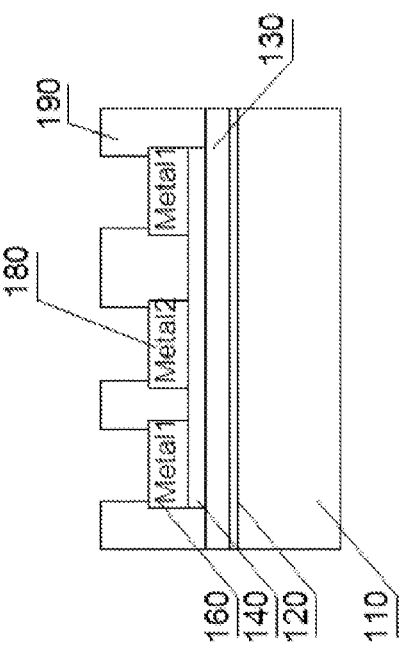

FIGS. 3A through 3F illustrate the process of fabricating an enhancement-mode III-nitride HFET according to a first embodiment of the present innovations. FIG. 3A illustrates a preferred epitaxial structure of the present innovations, where the reference numerals 110, 120, 130 and 140 denote substrate (e.g. sapphire, silicon or SiC), nucleation layer (low temperature grown GaN nucleation layer, AlGaN or AlN), high temperature-grown GaN buffer layer, and $Al_xGa_{1-x}N$ barrier layer including the modulation doped carrier supply layer. The manufacturing method of enhancement mode III-nitride HFET of one embodiment is described below. The mesa isolation is formed using $Cl_2$/He plasma dry etching followed by the source/drain ohmic contact formation 160 with Ti, Al, Ni and Au annealed at 850° C. for 45 seconds as shown in FIG. 3B. Next, photoresist 170 is patterned with the gate windows exposed. Then, the fluorine ions are incorporated into $Al_xGa_{1-x}N$ barrier layer by, for examples, either fluorine plasma treatment or fluorine ions implantation as shown in FIG. 3C. The gate electrode 180 is formed on the barrier layer 140 by depositing and lift-off Ni and Au as shown in FIG. 3D. Thereafter, post-gate RTA is conducted at 400-450° C. for 10 minutes. A passivation layer 190 is grown on top of the wafer as shown in FIG. 3E. Finally, the contact pads are opened by removing portions of the passivation layer on the contact pads as shown in FIG. 3F.

EXAMPLE 1

An AlGaN/GaN HEMT structure was grown on a (0001) sapphire substrate in an Aixtron AIX 2000 HT metal-organic chemical vapor deposition (MOCVD) system. The HEMT structure consists of a low-temperature GaN nucleation layer, a 2.5-m-thick unintentionally doped GaN buffer layer and an AlGaN barrier layer with nominal 30% Al composition. The barrier layer consists of a 3-nm undoped spacer, a 15-nm carrier supplier layer doped at $2.5\times10^{18}$ $cm^{-3}$, and a 2-nm undoped cap layer. Room temperature Hall measurements of the structure yield an electron sheet density of $1.3\times10^{13}$ $cm^{-2}$ and an electron mobility of 1000 $cm^2/Vs$. The device mesa was formed using $Cl_2$/He plasma dry etching in an STS ICP-RIE system followed by the source/drain ohmic contact formation with Ti/Al/Ni/Au annealed at 850° C. for 45 seconds. The ohmic contact resistance was typically measured to be 0.8 ohn-nm.

After gate windows with 1 nm length were opened by contact photolithography, the sample was treated by $CF_4$ plasma in an RIE system at an RF plasma power of 150 W for 150 seconds. Pressure of the treatment is typically 50 mTorr. The typical depth distribution profile of the fluorine ions thus incorporated via the treatment is Gaussian, and the typical depth when the fluorine concentration drops from the peak by one order of magnitude is 20 nm. Note that ion implantation is another method for incorporating the fluorine ions, and it is estimated that an energy of about 10 KeV would be required.

Ni/Au electron-beam evaporation and liftoff were carried out subsequently to form the gates electrodes. The plasma treated gate region and the gate electrode were self-aligned. Post-gate TRA was conducted at 400° C. for 10 minutes. This RTA temperature was chosen because RTA at temperatures higher than 500° C. can degrade both the gate Schottky contact and the source/drain ohmic contacts. The devices have a source-gate spacing of $L_{sg}$=1 µm and a gate-drain spacing of $L_{gd}$=2 µm. D-mode HEMTs were also fabricated on the same sample without plasma treatment to the gate regions.

Figure 1:
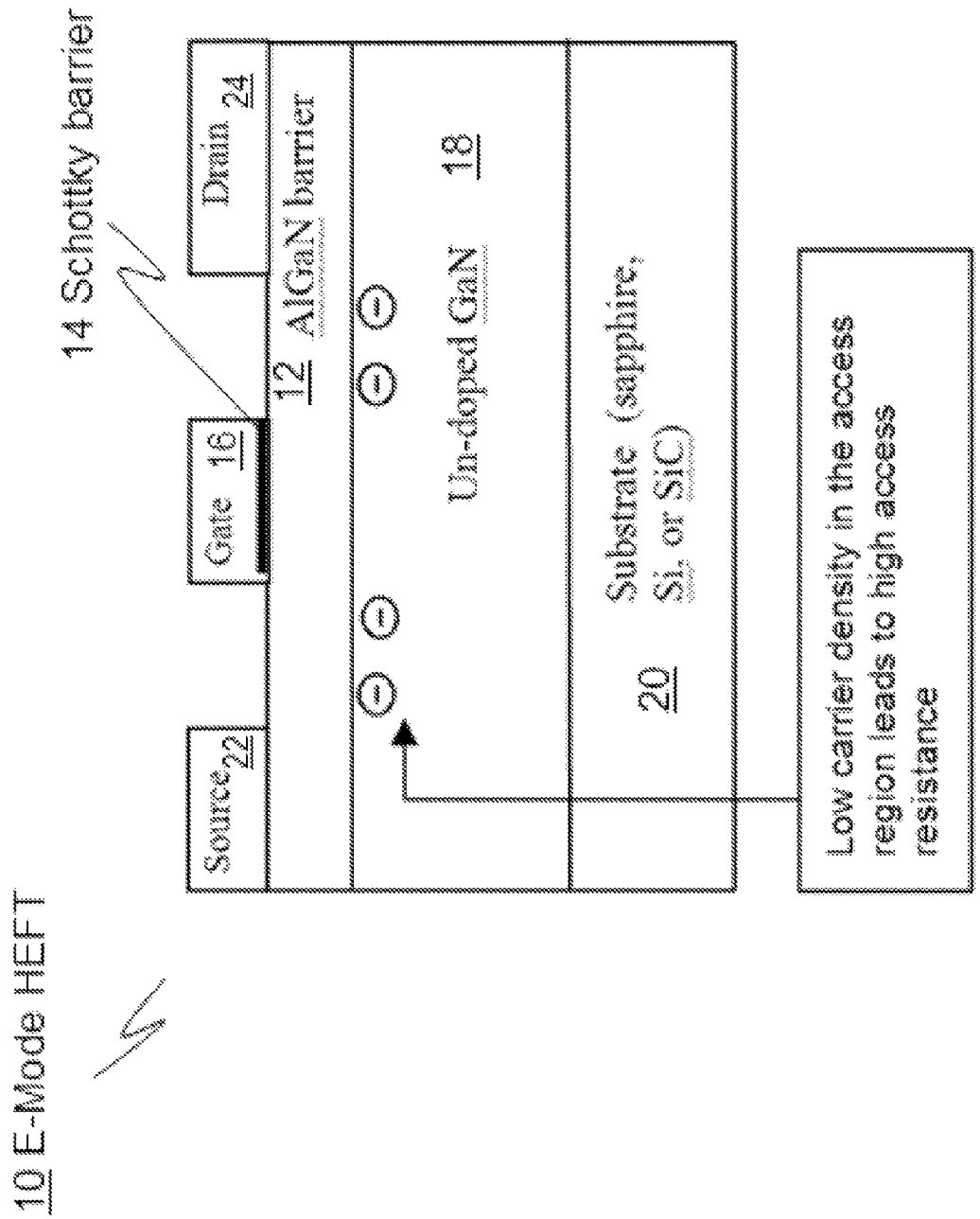
FIG. 1 shows a prior art E-mode HFET.
Figure 2:
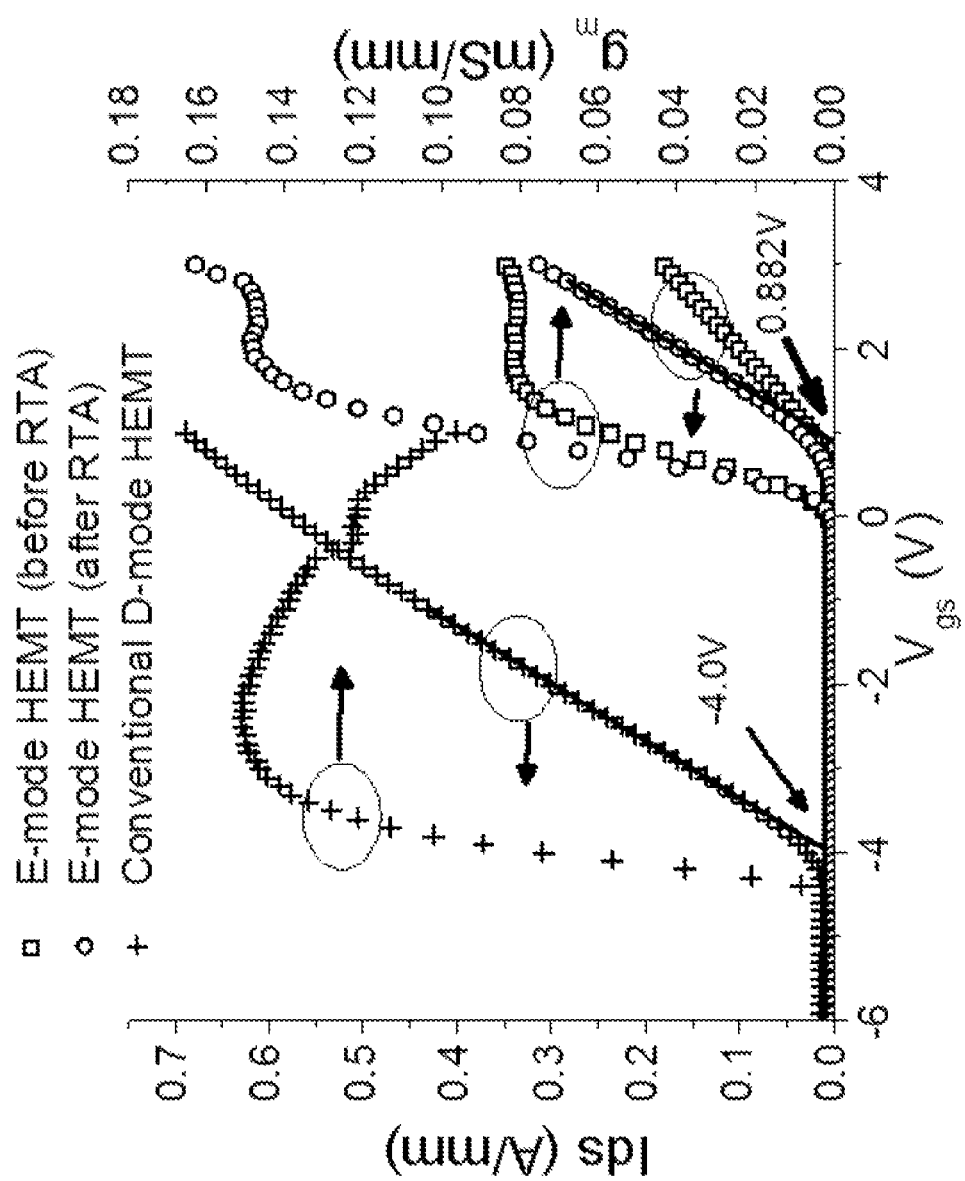
FIG. 2 shows transfer characteristics of a conventional D-mode HEMT, and E-mode HEMT without the benefit of the present innovations, and one embodiment of the present innovations.
Figure 4A:
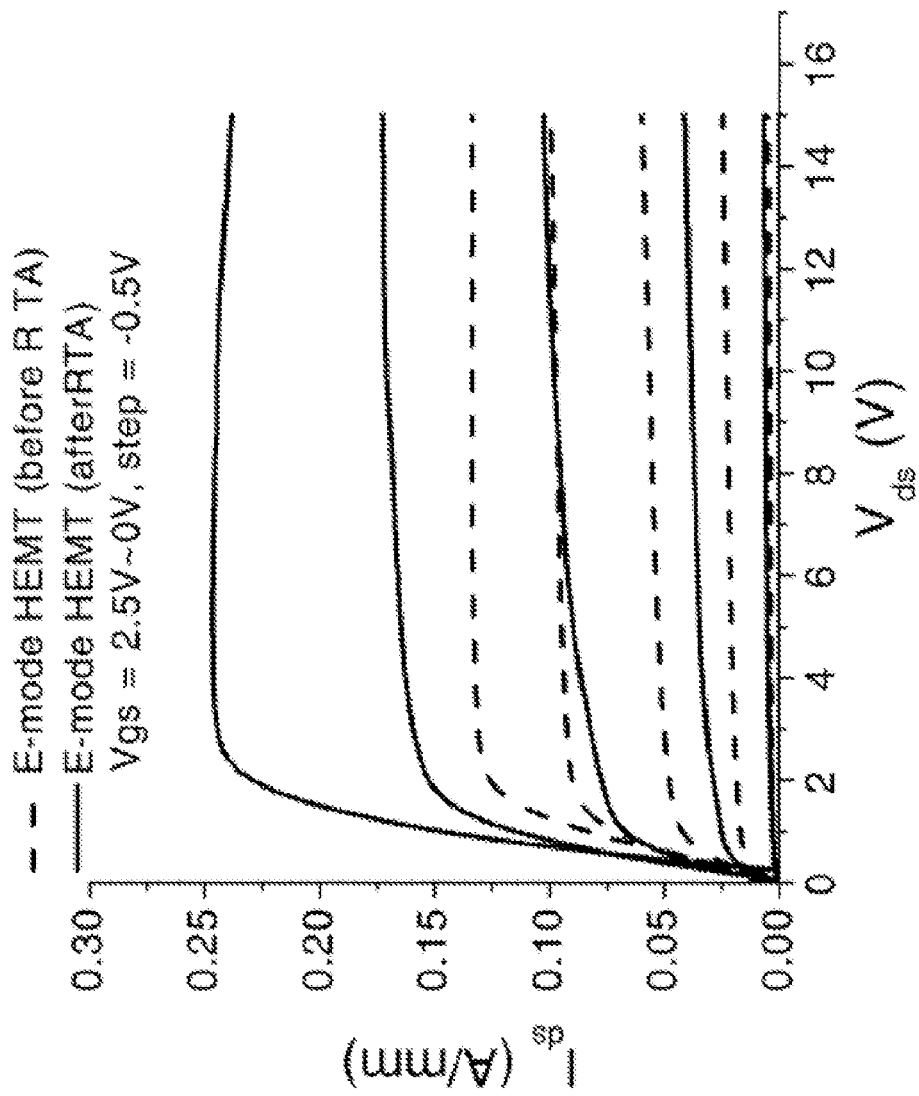
FIG. 4A shows I-V output characteristics for one embodiment of the present innovations as illustrated in Example 1.
Figure 4B:
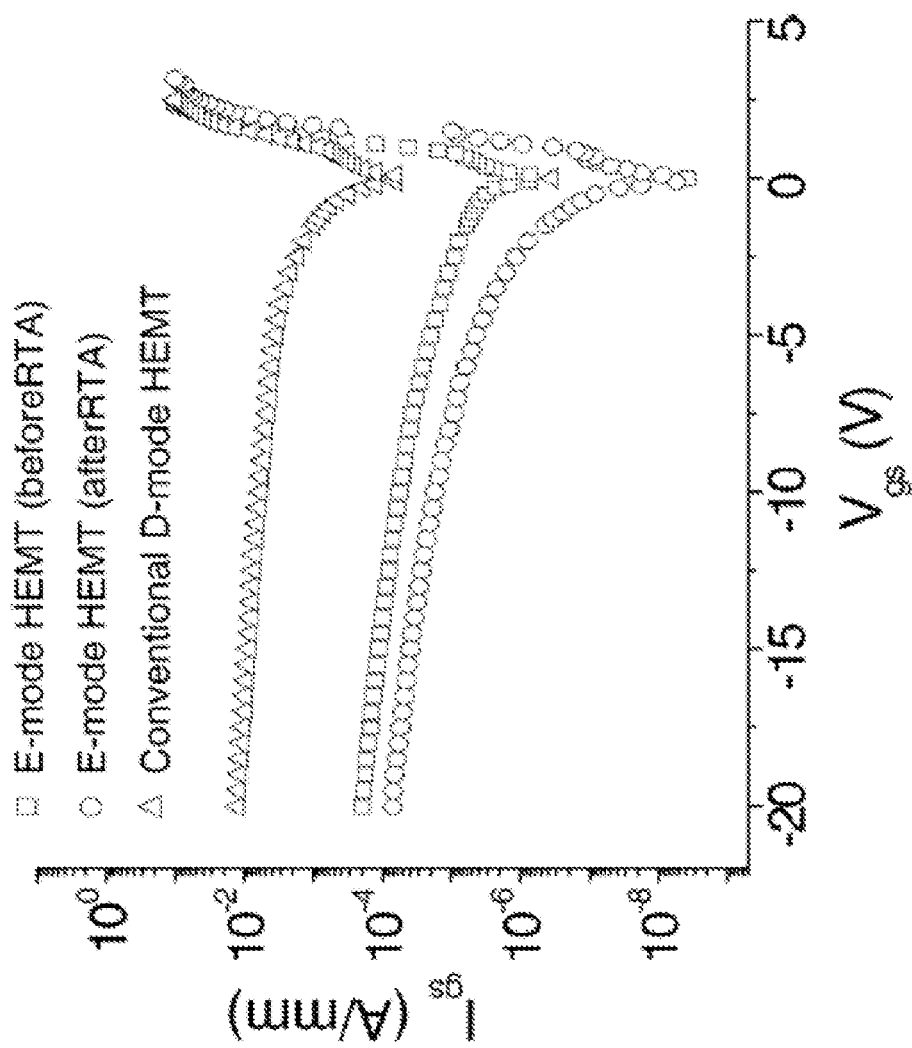
FIG. 4B shows $I_g$-$V_{gs}$ characteristics for one embodiment of the present innovations as illustrated in Example 1.

FIG. 2 shows the transfer characteristics of both D-mode and E-mode (before and after post-gate annealing) AlGaN/GaN HEMTs. Defining $V_{th}$ as the gate bias intercept of the linear extrapolation of drain current at the point of peak transconductance ($g_m$), the $V_{th}$ of the E-mode device was determined to be 0.9 V, while the $V_{th}$ of the D-mode device is –4.0 V. More than 4 V of $V_{th}$ shift was achieved by the plasma treatment. At $V_{gs}$=0, the transconductance reaches zero, indicating a true E-mode operation. The drain current is well pinched-off and shows a leakage of 28 µA/mm at $V_{ds}$=6 V, the smallest value reported up to date for E-mode AlGaN/GaN HEMTs. The peak $g_m$ is 151 mS/mm for the D-mode HEMT and 148 mS/mm for the E-mode HEMT, respectively. The maximum drain current ($I_{max}$) reaches 313 mA/mm at the gate bias ($V_{gs}$) of 3 V for the E-mode HEMT. Comparison of the current-voltage (I-V) characteristics of E-mode device before and after RTA suggests that RTA at 400° C. for 10 minutes plays an important role in recovering the damages induced during the plasma treatment and achieving high current density and transconductance. FIG. 4A shows the output curves of the E-mode device before and after the RTA process. No change in threshold voltage was observed after the RTA. At a $V_{gs}$ of 2.5 V, the saturation drain current (247 mA/mm) of E-mode device after RTA at 400° C. is 85% higher than that (133 mA/mm) before RTA. and the knee voltage of the E-mode device with RTA is 2.2 V, where the drain current is 95% saturation drain current. The off-state drain breakdown voltage at $V_{gs}$=0V is larger than 80 V, showing no degradation compared to that observed in the D-mode HEMTs. FIG. 4B shows $I_g/V_{gs}$ curves of these three devices. Lower gate leakage currents were achieved fro E-mode HEMT, especially after RTA.

Figure 5:
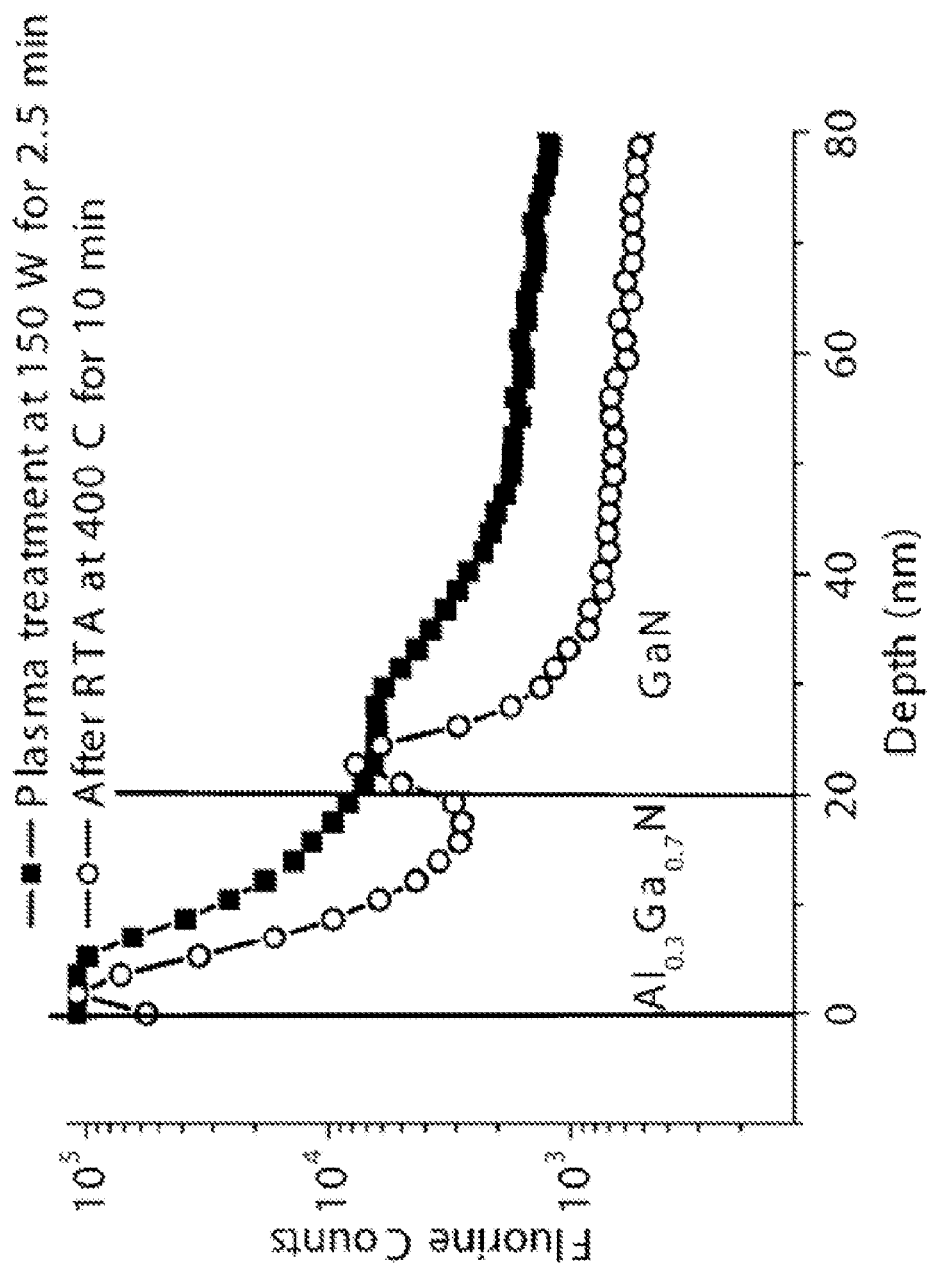
FIG. 5 shows fluorine ion concentration profiles as measured by "SIMS" for one embodiment of the present innovations as illustrated in Example 1.
Figure 6:
FIG. 6 shows the cross section of one embodiment of the present innovations prior to implantation of fluorine ions as used in Example 1, 2 and 3.

In order to investigate the mechanisms of the $V_{th}$ shift by $CF_4$ plasma treatment, secondary ion mass spectrum (SIMS) measurements were carried out on accompanying samples to monitor the atomic compositions changes of the $CF_4$ plasma treated AlGaN/GaN materials. In addition to Al, Ga, and N, significant amount of fluorine atoms were detected in the plasma treated sample. FIG. 5 shows the fluorine atom concentration profile of the sample treated at a $CF_4$ plasma power of 150 W for 2.5 minutes. The concentration of fluorine atoms is the highest near the AlGaN surface and drops by one order of magnitude in the channel. It can be deduced that the fluorine ions produced by the $Cf_4$ plasma were incorporated into the sample surface, similar to the effects of plasma immersion ion implantation ("PIII"), a technique developed to realize ultra-shallow junctions in advanced silicon technology. Because of the strong electro-negativity of the fluorine ions, the incorporated fluorine ions can provide immobile negative charges in the AlGaN barrier and effectively deplete the electrons in the channel. With enough fluorine ions incorporated in the AlGaN barrier, the D-mode HEMT can be converted to an E-mode HEMT. The $CF_4$ plasma treatment can result in a threshold voltage shift as large as 4.9 V. After RTA at 400° C. for 10 minutes, the peak fluorine atom concentration near the AlGaN surface is unchanged while that around the AlGaN/GaN interface experiences more significant reduction. It should be noted, however, SIMS measurement results from different runs do not offer accurate quantitive comparison because of the lack of reference criterion. Nevertheless, the minute change in $V_{th}$ before and after RTA indicates that the total number of fluorine ions incorportated into the AlGaN barrier is near constant before and after RTA, while the plasma damages are significantly recovered by the RTA. The lower gate reverse leakage currents of an E-mode HEMT can be attributed to an upward band bending of the AlGaN layer as a result of fluorine ion incorporation. After the RTA process, the defects at the interface of metal and AlGaN induced by $CF_4$ were recovered, leading to further suppression of gate leakage current. From the atomic force microscopy ("AFM") measurement conducted on a patterned sample, it was observed that the plasma treatment only results in a 0.8 nm reduction in the overall AlGaN barrier layer (20 nm thick).

On-wafer small-signal RF characteristics of D-mode and E-mode AlGaN/GaN HEMTs were measured from 0.1 to 39.1 GHz. The current gain and maximum stable gain/maximum available gain (MSG/MAG) of both types of devices with 1 μm-long gate were derived from measured S-parameters as a function of frequency, as shown in FIG. 5. At $V_{ds}$=12 and $V_{gs}$=1.9 V, current gain cutoff frequency ($f_T$) of 10.1 GHz and a power gain cutoff frequency ($f_{max}$) of 34.3 GHz were obtained for the E-mode AlGaN/GaN HEMT, a little lower than that of its D-mode counterpart, whose and were measured at the drain bias of 12 V and gate bias of –3 V to be 13.1 GHz, respectively.

One advantage of the present innovations is that the E-mode HFET with fluorine ions incorporated in barrier layer can stand a larger gate bias (>3V) corresponding to a larger input voltage swing.

Also, thermal reliability testing has shown that the fluorine ion incorporation in the AlGaN barrier is stable up to 700° C. However, Schottky contact, made of nickel, is only stable up to 500° C. Therefore, the application temperature range is up to 500° C. unless another Schottky contact technique is used. Tungsten gate is one open possible candidate.

Figure 7:
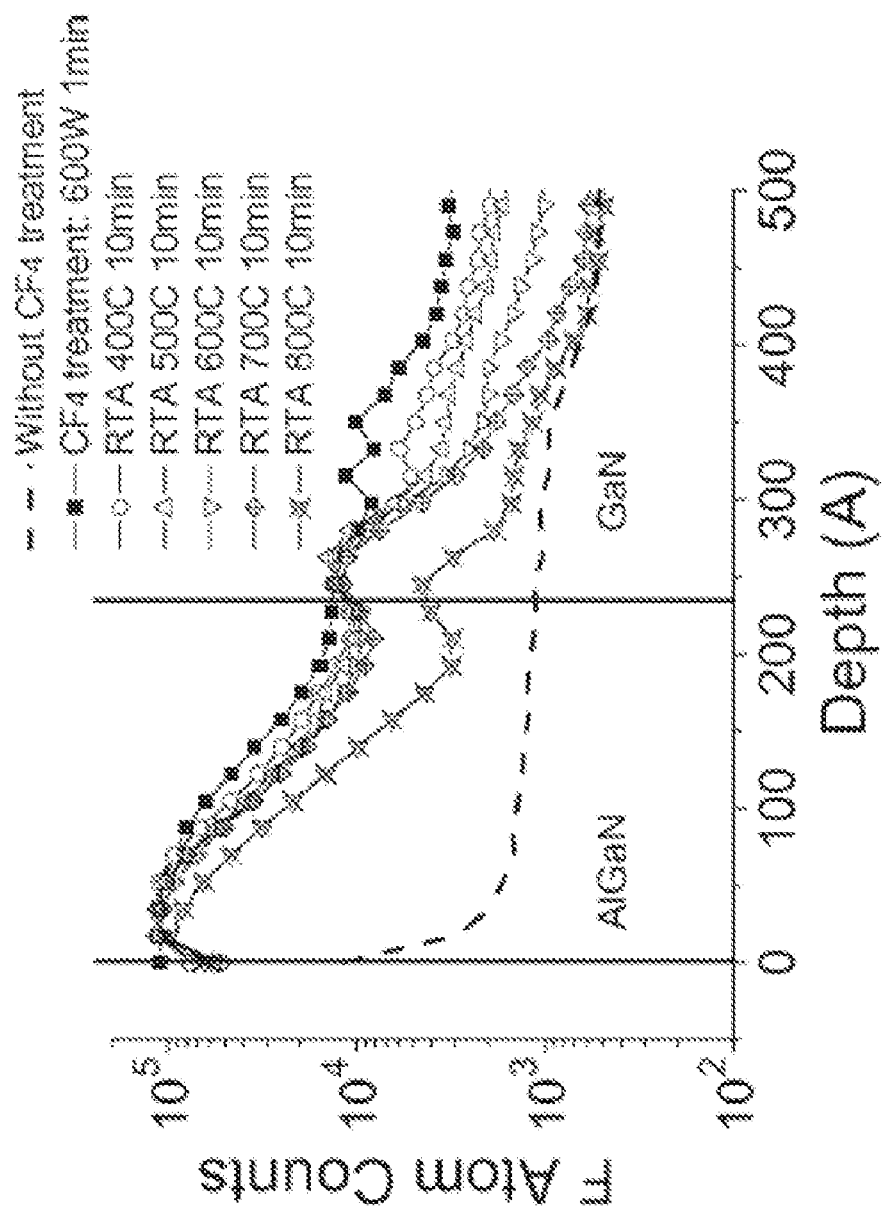
FIG. 7 shows fluorine ion concentration profiles as measured by "SIMS" for various embodiments of the present innovations as illustrated in Example 2.

In FIG. 7, the effect of different post-gate RTA's on the fluorine atoms' distributions in AlGaN/GaN heterostructures, as measured by SIMS, is shown. The untreated device is used as a reference.

It was found that the fluorine ions, which were incorporated into AlGaN barrier layer by $CF_4$ plasma treatment, could effectively shift the threshold voltage positively. The fluorine ions' incorporation in the AlGaN layer was confirmed by secondary-ion-mass-spectrum (SIMS) measurements, as shown in FIG. 7. During $CF_4$ plasma treatment, fluorine ions are implanted into AlGaN/GaN heterostructure in a self-built electrical field stimulated by the RF power.

It is also concluded from the results shown in FIG. 7 that the implanted fluorine ions have a good thermal stability in the AlGaN layer up to 700° C. Deep-level transient spectroscopy ("DLTS") has been conducted on the HEMT samples treated by $CF_4$ plasma. The fluorine ions incorporated in the AlGaN barrier appear to introduce a deep-level state that is at least 1.8 eV below the conduction-band minimum. As a result, the fluorine ions are believed to introduce a negatively charged acceptor-like deep level in the AlGaN.

Note that in SIMS plots such as FIG. 7, it is difficult to make accurate calculation of concentration from SIMS measurement because the beam size is not known. However, based on the band structure and the threshold voltage calculation, the peak value of the F concentration can be as high as about $1\times20$ cm$^{-3}$.

Recent DLTS and photo-conductivity experiments have revealed that the incorporation of fluorine ions in the AlGaN layer is predominantly substitutional, with the fluorine atoms filling nitrogen vacancies in the AlGaN layer.

Figure 7A:
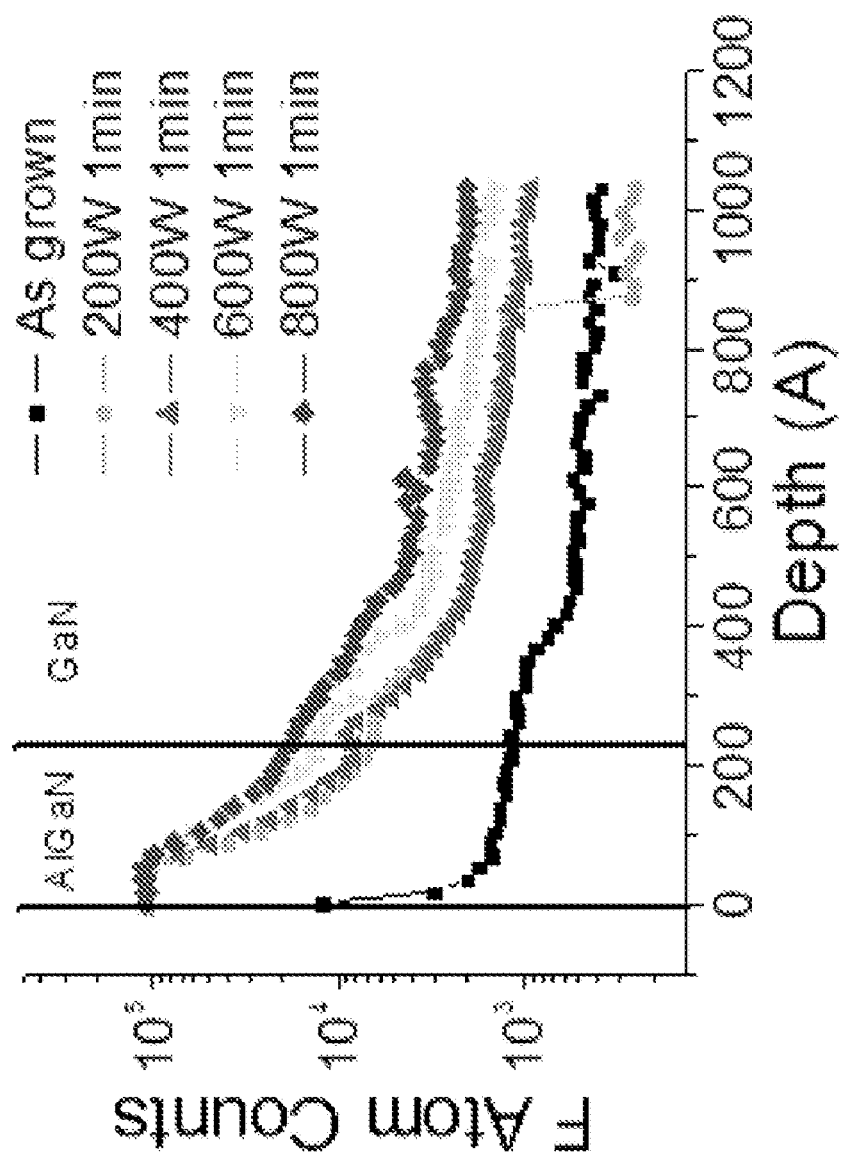
FIG. 7A shows fluorine ion concentration profiles as measured by "SIMS" for various embodiments of the present innovations as illustrated in Example 2A.

In FIG. 7A, the effect of different plasma power levels without RTA on the fluorine atoms' distribution in AlGaN/GaN heterostructures, as measured by SIMS, is shown.

Note that the 200 W and 400 W lines show a "bump" at the interface between the AlGaN/GaN interface. During an incorporation process, the fluorine ions can fill up surface or interface states (or "traps"), producing "anomalous stopping". Therefore, this indicates there are more traps at the interface. Further, the 600 W and 800 W lines do not show the bump most likely because of the greater penetration depth and overall concentration.

Figure 7B:
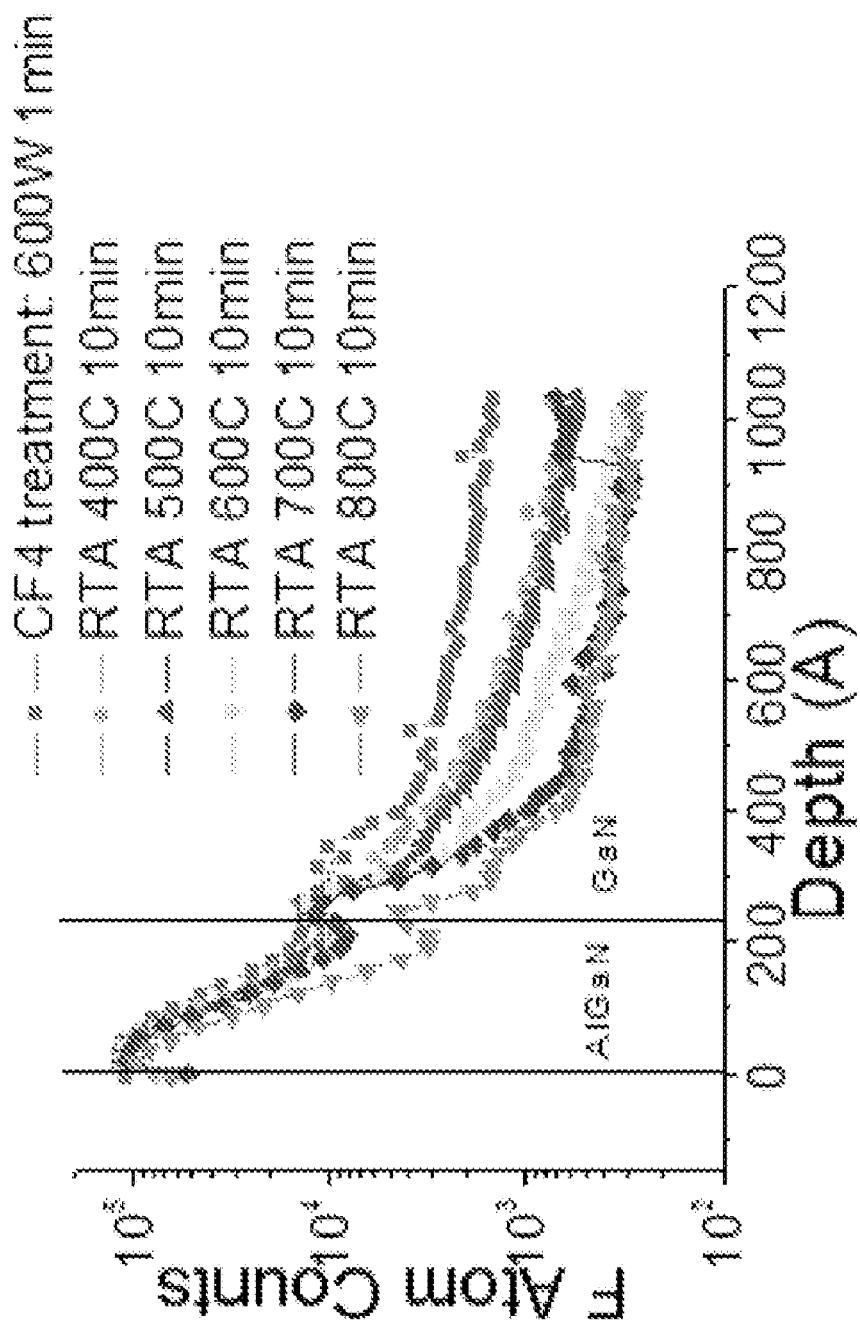
FIG. 7B shows fluorine ion concentration profiles as measured by "SIMS" for various embodiments of the present innovations as illustrated in Example 2A.

The untreated device is used as a reference. In FIG. 7B, the effect of different post-gate treatment temperatures at a fixed power of 600 W for RTA on the fluorine atoms' distributions in AlGaN/GaN heterostructures, as measured by SIMS, is shown. The untreated device is used as a reference. Note that the distributions in the AlGaN for 700° C. and below show a normal effect of root Dt, but the distribution in the AlGaN layer seems to reflect a very different diffusivity (or perhaps some other activation energy effect). Thus, the data indicates that fluorine ions are more stable in AlGaN than in GaN. Further, the building energy can be higher, and the fluorine-related energy states are deeper below the conduction band in AlGaN than in GaN.

Figure 8A:
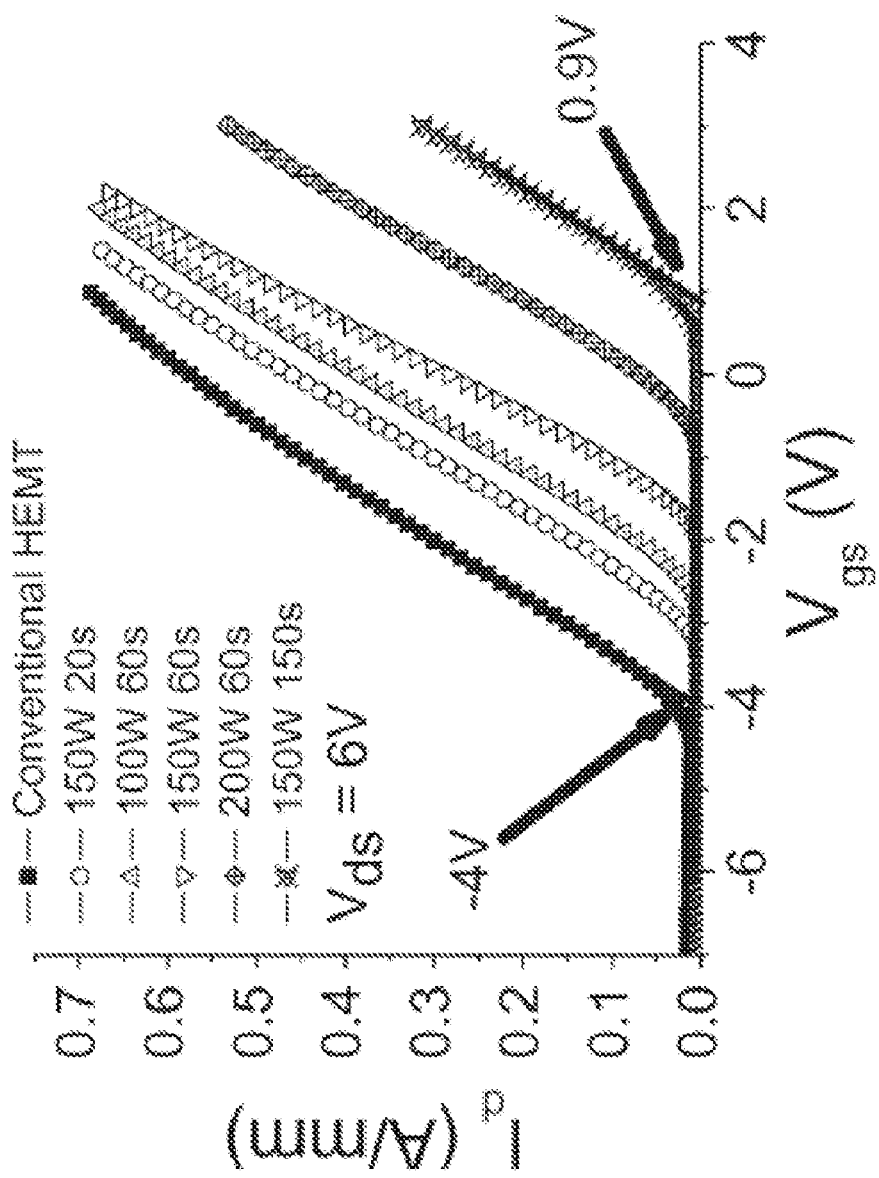
FIG. 8A shows the $I_d$ versus $V_{gs}$ transfer characteristics of various embodiments of the present innovations at different $CF_4$ plasma-treatment conditions as illustrated in Example 3.
Figure 8B:
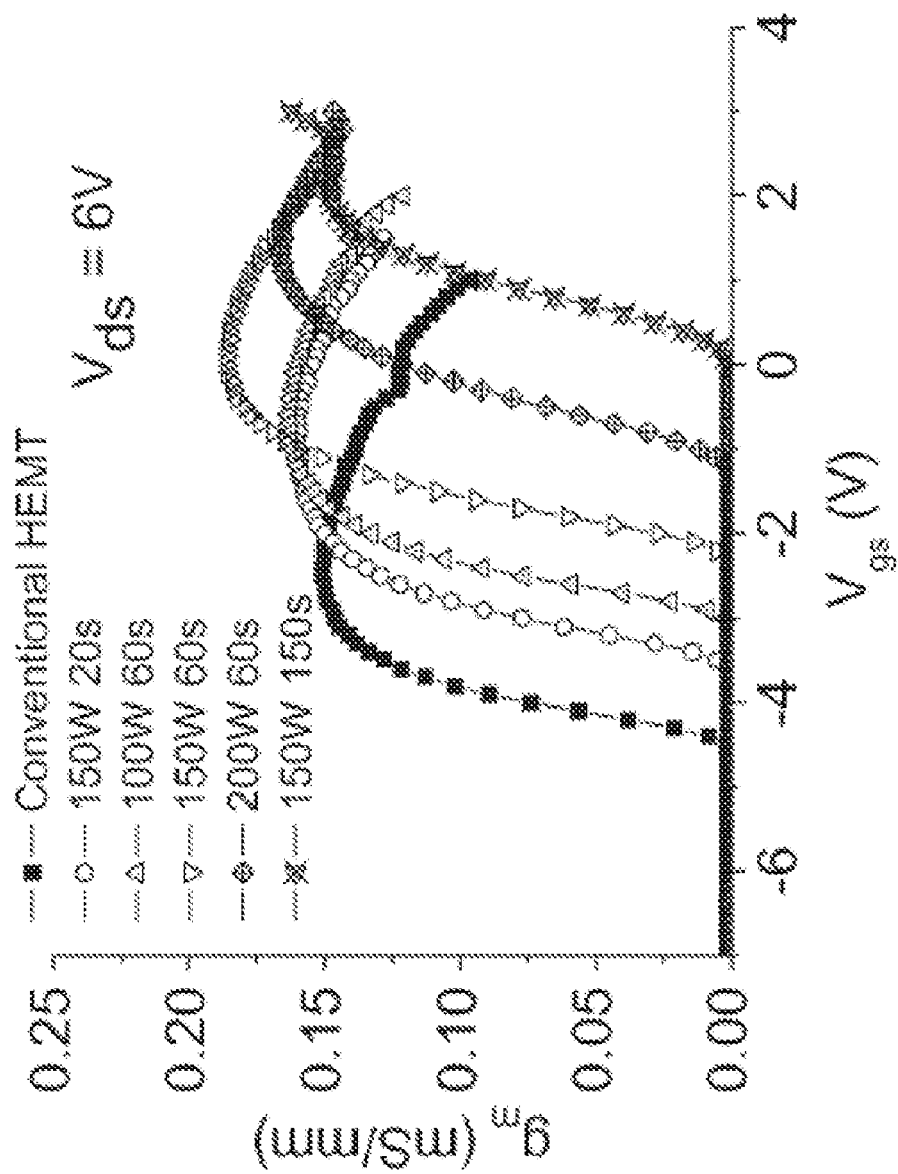
FIG. 8B shows the $g_m$ versus $V_{gs}$ transfer characteristics of various embodiments of the present innovations at different $CF_4$ plasma-treatment conditions as illustrated in Example 3.
Figure 10:
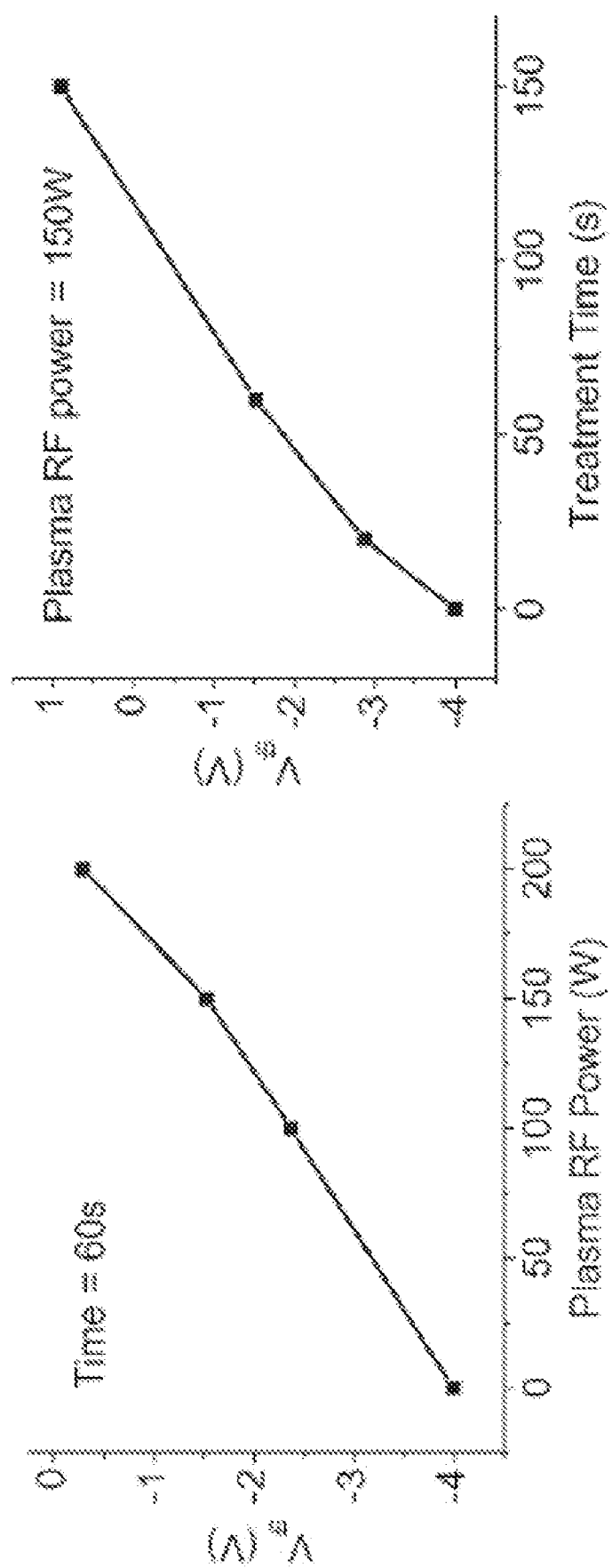
FIG. 10 shows the $V_{th}$ dependency on plasma power and treatment time for various embodiments of the present innovations as illustrated in Example 3.
Figure 11:
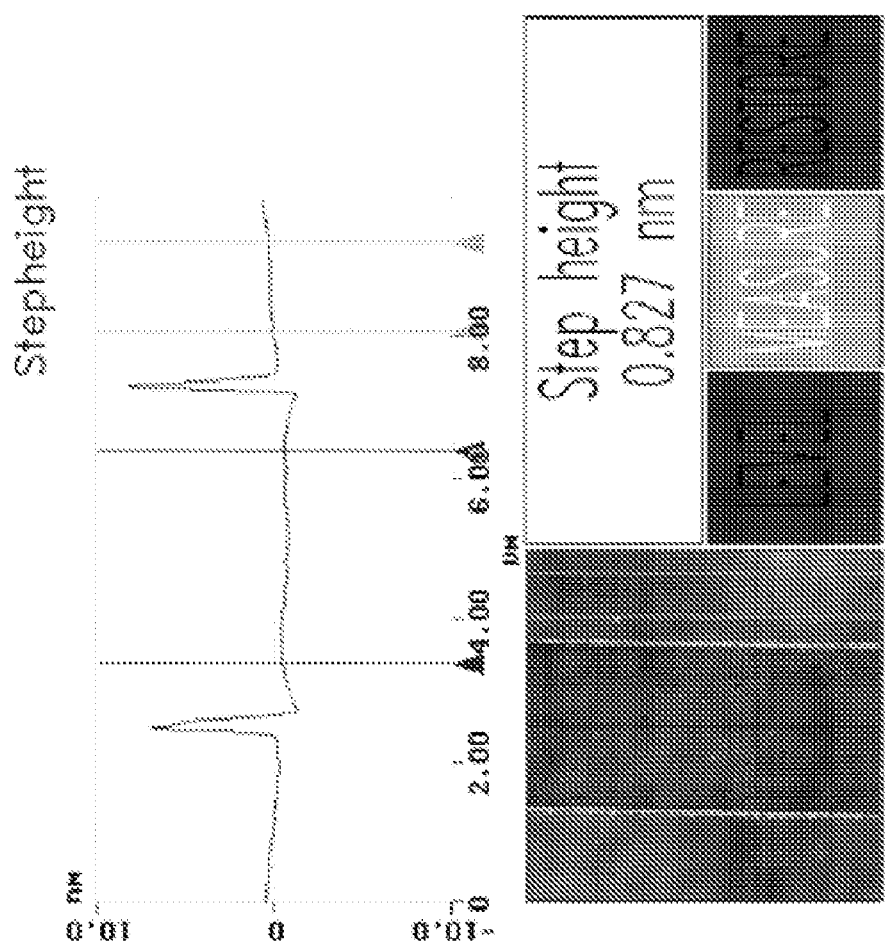
FIG. 11 shows an AFM image depicting the insignificant etching effect of the $CF_4$ plasma treatment on the AlGaN layer for one embodiments of the present innovations as illustrated in Example 3.

Sensitivity to plasma treatment parameters was also investigated. Devices were fabricated with different $V_{th}$ values by applying different $CF_4$ plasma power and treatment times. Five different combinations were used: 100 W for 60 seconds, 150 W for 20 seconds, 150 W for 60 seconds, 150 W for 150 seconds, and 200 W for 60 seconds. For comparison, an HEMT without CF$_4$ treatment was also fabricated on the same sample and in the same processing run. All devices were unpassivated in order to avoid any confusion caused by the passivation layer, which may change the stress in the AlGaN layer and alter the piezoelectric polarization. All the HEMT devices have a gate length of 1 µm, a source-gate spacing of $L_{sg}$=1 µm and a gate-drain spacing of $L_{gd}$=2 µm. DC current-voltage (I-V) characteristics of the fabricated devices were measured using an HP4156A parameter analyzer. Transfer characteristis and transconductance ($g_m$) characteristics are shown in FIGS. 8A and 8B, respectively. Taking the conventional HEMT (i.e., without CF$_4$ plasma treatment) as the baseline devices, the threshold voltage of all the other CF$_4$ plasma-treated HEMTs are shifted to the positive direction. Defining V$_{th}$ as the gate-bias intercept of the linear extrapolation of the drain-current at the point of peak transconductance ($g_m$), the V$_{th}$ of all the devices were extracted and the listed in FIG. 9. For the conventional HEMT, V$_{th}$ is −4 V. For the HEMT treated by CF$_4$ plasma at 150 W for 150 seconds, the V$_{th}$ is 0.9 V, which corresponds to the E-mode HEMT. A maximum V$_{th}$ shift of 4.9 V was achieved. In order to further reveal the effects of CF$_4$ plasma treatment, the dependencies of V$_{th}$ on both CF$_4$ plasma treatment time and RF power are plotted in FIG. 10. As the plasma power is increased and as longer treatment time are utilized, larger shifts in V$_{th}$ are effected. With the increase in the plasma treatment time, more fluorine ions were implanted into AlGaN layer. The increased fluorine ion concentrations leads to a reduced electron density in the channel, and causes the positive shift of the V$_{th}$. When the plasma power increases, fluorine ions obtain a higher energy and fluorine ion flux increases due to the enhanced ionization rate of CF$_4$, With higher energy, fluorine ions can reach at a deeper depth closer to the channel. The closer the fluorine ions are to the channel, the more effective they at delpleting 2DEG, and a larger shift in V$_{th}$ is achieved. The increased fluorine ions flux has the same effect on V$_{th}$ as the increase of the plasma treatment time by raising the fluorine atoms concentration in AlGaN layer. It should be noted that the nearly linear V$_{th}$ versus time and V$_{th}$ versus power relationships imply the possibilities of a precise control of V$_{th}$ of AlGaN/GaN HEMTs. Although the V$_{th}$ is shifted by CF$_4$ plasma treatment, the gm is not degraded. As shown in FIG. 8B, all the devices' maximum g$_m$ are in the range of 149-166 mS/mm, except for that treated at 150 W for 60 seconds, which has a higher peak gm of 186 mS/mm. It is suspected that this singularity point was caused by the non-uniformity in epitaxial growth. Confirmed by an AFM measurement conducted on a CF$_4$-treated patterned sample (with part of the sample treated and other parts protected from the plasma treatment), the CF$_4$ plasma treatment only results in an AlGaN-thickness reduction of less than 1 nm, as shown in FIG. 11. Thus, the almost constant transconductance indicates that the 2DEG mobility in the channel is maintained in the device fabrication according to the present innovations. A key step in maintaining the transconductance is the post-gate annealing process.

Recovery of Plasma-Induced Damages by Post-Gate Annealing

Figure 12A:
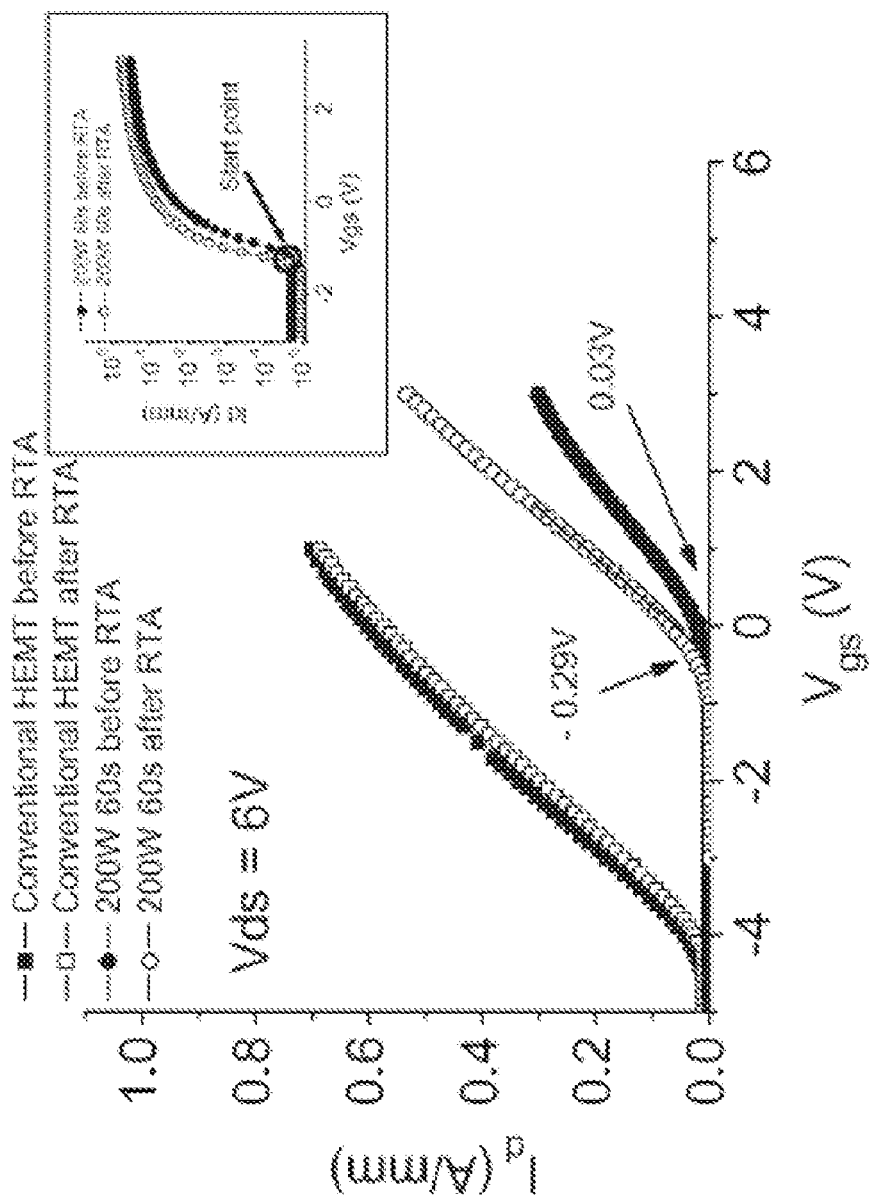
FIG. 12A shows the DC $I_d$ versus $V_{gs}$ transfer characteristics for various embodiments of the present innovations as illustrated in Example 3.
Figure 12B:
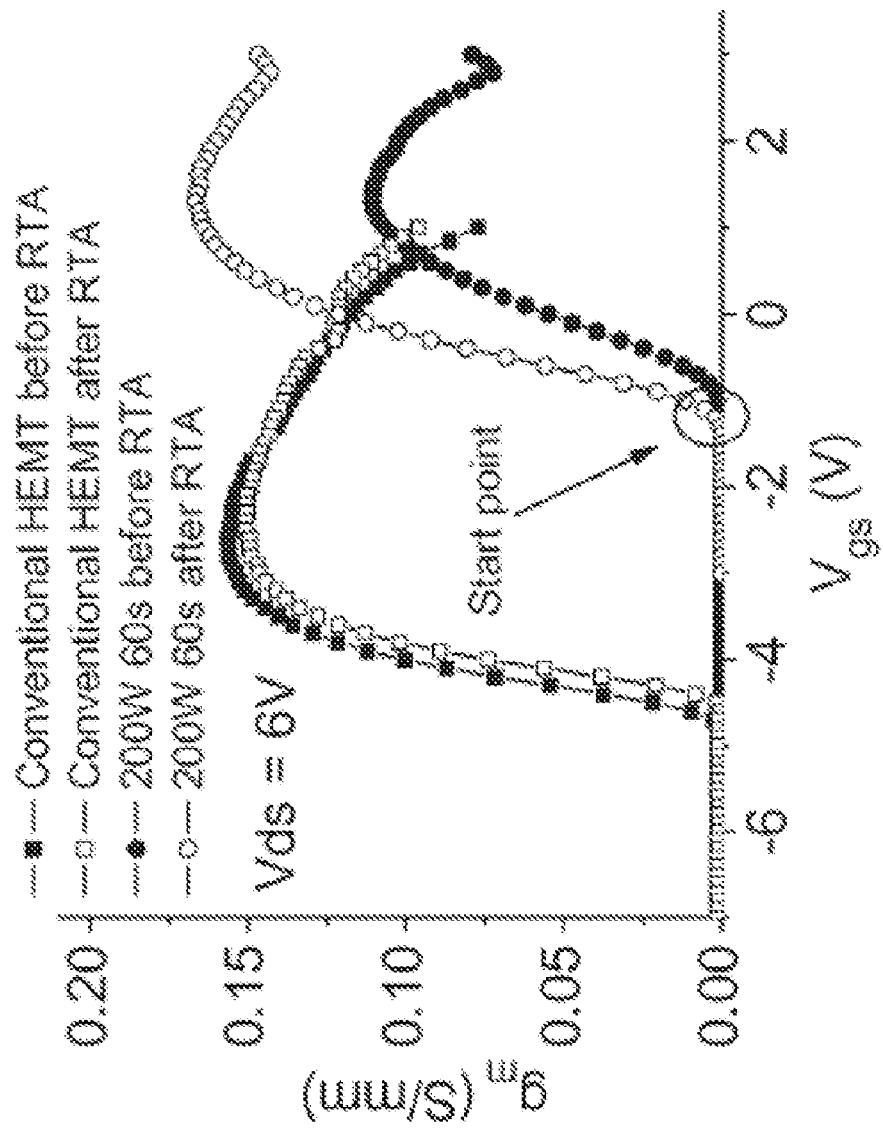
FIG. 12B shows the DC $g_m$ versus $V_{gs}$ transfer characteristics for various embodiments of the present innovations as illustrated in Example 3.
Figure 13:
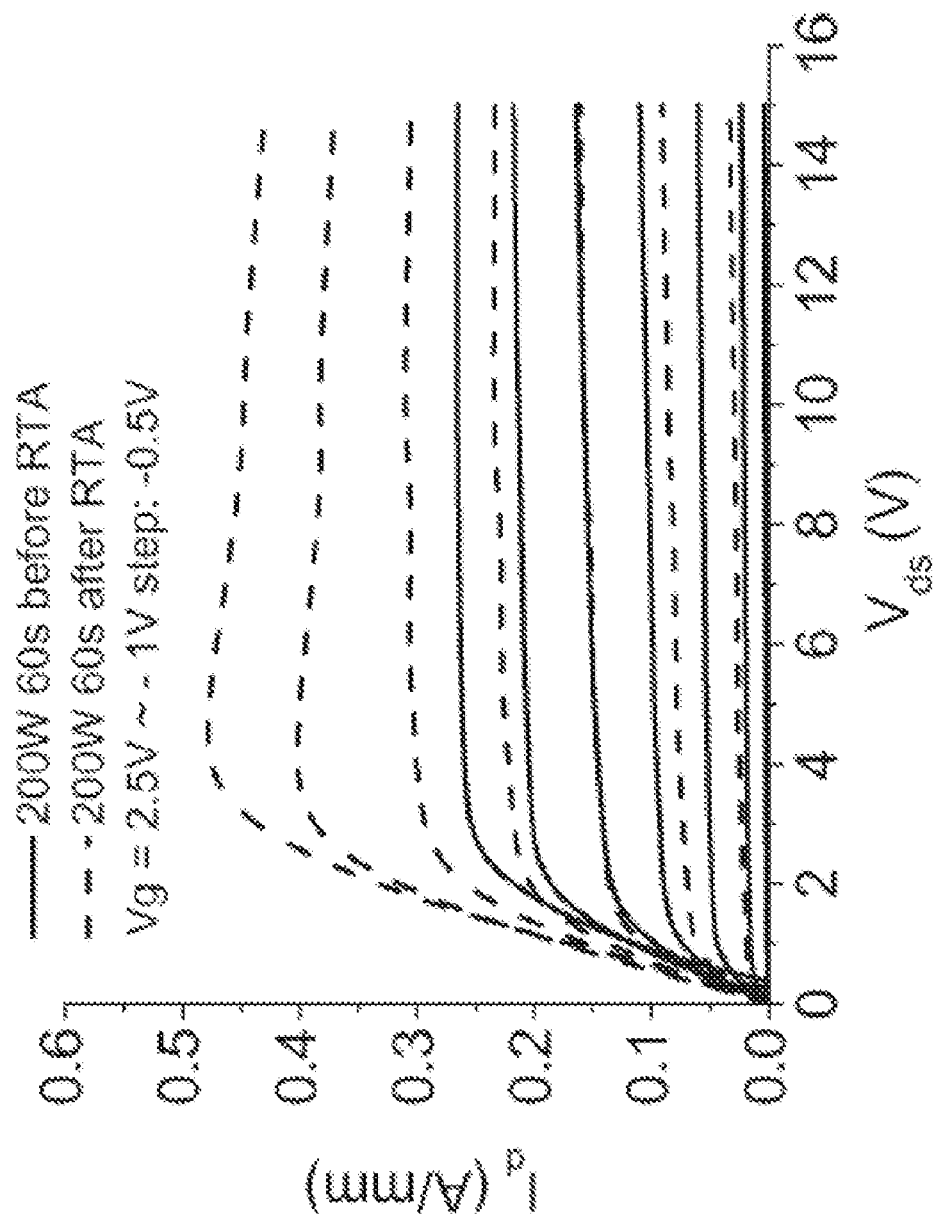
FIG. 13 shows the DC output characteristics for one embodiment of the present innovations as illustrated in Example 3.

As previously discussed, the plasma normally induces damages and creates defects in semiconductor materials, and consequently degrades carriers' mobility. RTA is an effective method to repair these damages and recover the mobility. In the CF$_4$ plasma-treated AlGaN/GaN HEMTs, drain-current and transconductance degradation occurs just after the plasma treatment. In FIGS. 12A and 12B, the drain-current and transconductance measured on an untreated device and a treated device (200 W, 60 seconds) before and after RTA (400° C. for 10 minutes) are plotted. FIG. 13 compares the output characteristics of the treated device before and after RTA. The drain-current was 76% and the transconductance was 51% higher after the RTA in the treated device. The RTA process can recover majority of the mobility degradation in the plasma-treated device, while showing an insignificant effect on the conventional untreated device. Therefore, the recovery of I$_d$ and g$_m$ in the CF$_4$ plasma-treated device is the result of the effective recovery of the 2DEG mobility at this RTA condition. Compared to a higher annealing temperature of 700° C., which is needed to recover damages induced by chlorine-based ICP-RIE in the case of recessed gate, this lower RTA temperature implies that the CF$_4$ plasma treatment creates lower damages than the chlorine-based ICP-RIE. It also enables the RTA process to be carried out after the gate deposition, fulfilling the goal of a self-aligned process. If the previous definition of V$_{th}$ is used, the V$_{th}$ of the CF$_4$ plasma-treated device seems to be shifted from 0.03 to −0.29 V after the RTA. When the start point of g$_m$, as shown in FIG. 12B, or the start point of I$_d$ at the logarithm scale, as shown in the inset of FIG. 12A, is used as the criteria to evaluate V$_{th}$, the V$_{th}$ of the CF$_4$ plasma-treated device is not changed after the RTA. The good thermal stability of V$_{th}$ is consistent with the previously mentioned good thermal stability of fluorine atoms in AlGaN layer.

Suppression of Schottky Gate-Leakage Current

AlGaN/GaN HEMTs always show much higher reverse gate leakage currents than the values theoretically predicted by the thermionic-emission ("TE") model. The higher gate currents degrade the device's noise performance and raise the standby power consumption. In particular, forward gate currents limit the gate input voltage swing, hence the maximum drain-current. Other approaches have been attempted to suppress gate currents of AlGaN/GaN HEMTs. These efforts include using the gate metal with higher work function, using copper, modifying the HEMTs structure (such as adding a GaN cap), or diversion to metal-insulator-semiconductor heterostructure field-effect transistors (MISHFETs). In the CF$_4$ plasma-treated AlGaN/GaN HEMTs of the present innovations, suppressions of gate currents in both reverse and forward bias regions can be achieved. Gate-current suppressions show dependencies on CF$_4$ plasma-treatment conditions.

Figure 14A:
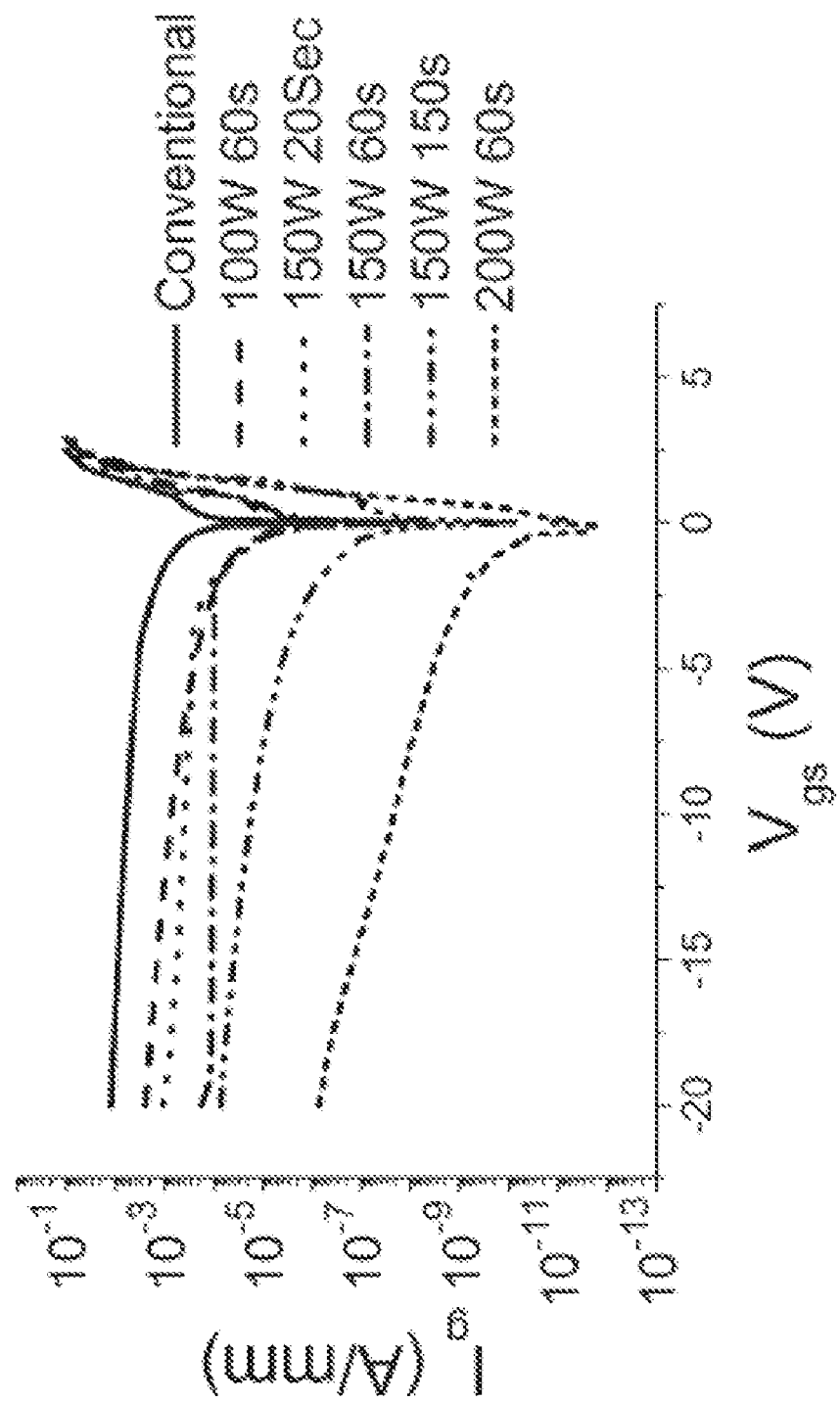
FIG. 14A shows both reverse and forward gate currents with different $CF_4$ plasma treatments for various embodiments of the present innovations as illustrated in Example 3.
Figure 14B:
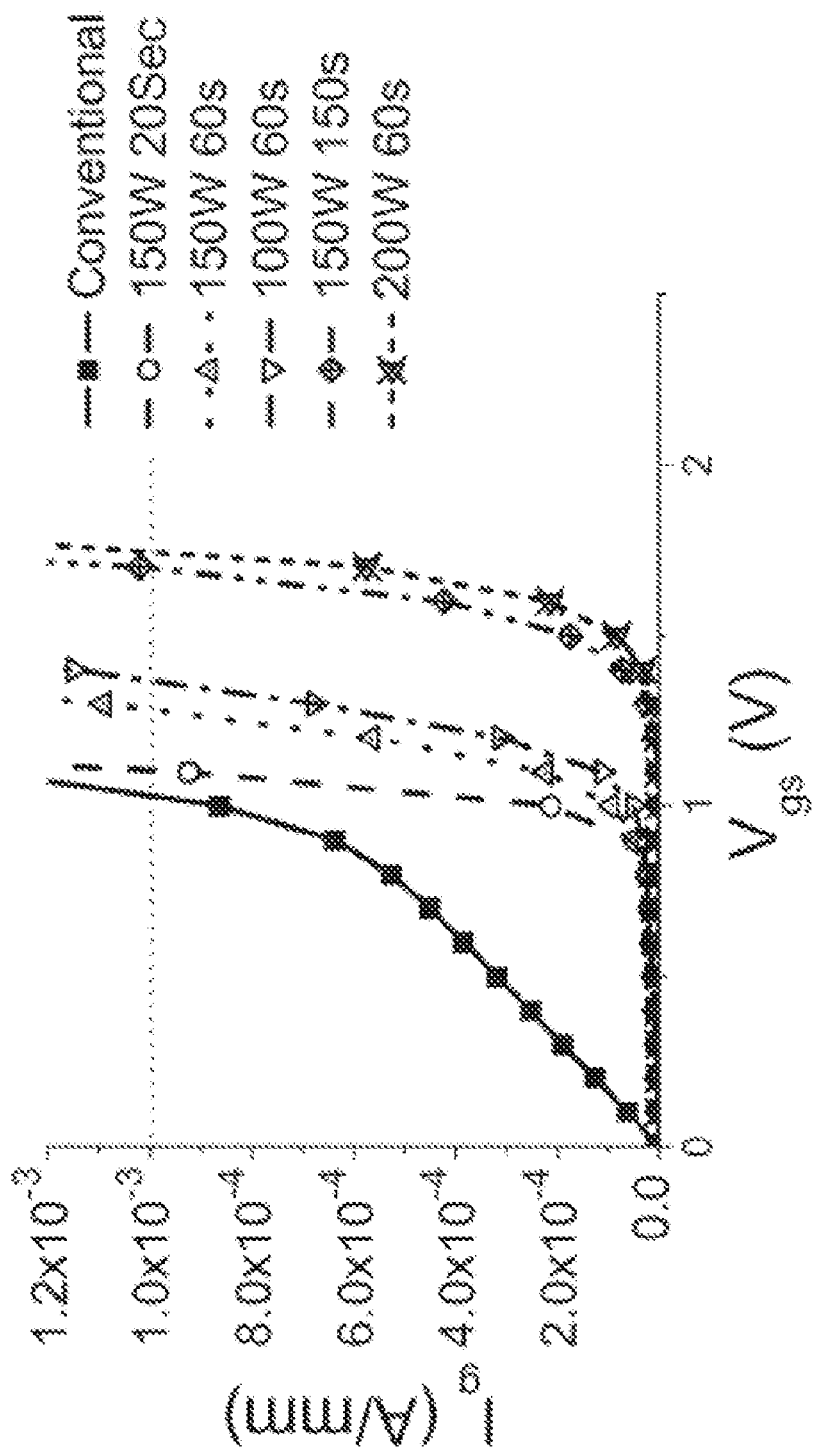
FIG. 14B shows enlarged and forward gate currents with different $CF_4$ plasma treatments for various embodiments of the present innovations as illustrated in Example 3.

FIGS. 14A and 14B shows gate currents of AlGaN/GaN HEMTs with different CF$_4$ plasma treatments. FIG. 14B is the enlarged plot of the forward gate bias region. In reverse bias region, compared to the conventional HEMT without CF$_4$ plasma treatment, the gate-leakage currents of all the CF$_4$ plasma-treated AlGaN/GaN HEMTs decreased. At V$_g$=−20 V, the gate-leakage current drops by more than four orders of magnitude from $1.2 \times 10^{-2}$ A/mm for conventional HEMT to $7 \times 10^{-7}$ A/mm for the AlGaN/GaN HEMT plasma treated at 200 W, 60 seconds. In the forward region, the gate currents of all the CF$_4$ plasma-treated AlGaN/GaN HEMTs also decrease. As a result, the turn-on voltages of the gate Schottky diode are extended, and the gate input voltages swings are increased. Using 1 mA/mm as the criterion, the turn-on voltage of the gate Schottky diode increases from 1 V for conventional HEMT to 1.75 V for the CF$_4$ plasma-treated AlGaN/GaN HEMT at 200 W for 60 seconds.

Figure 23:
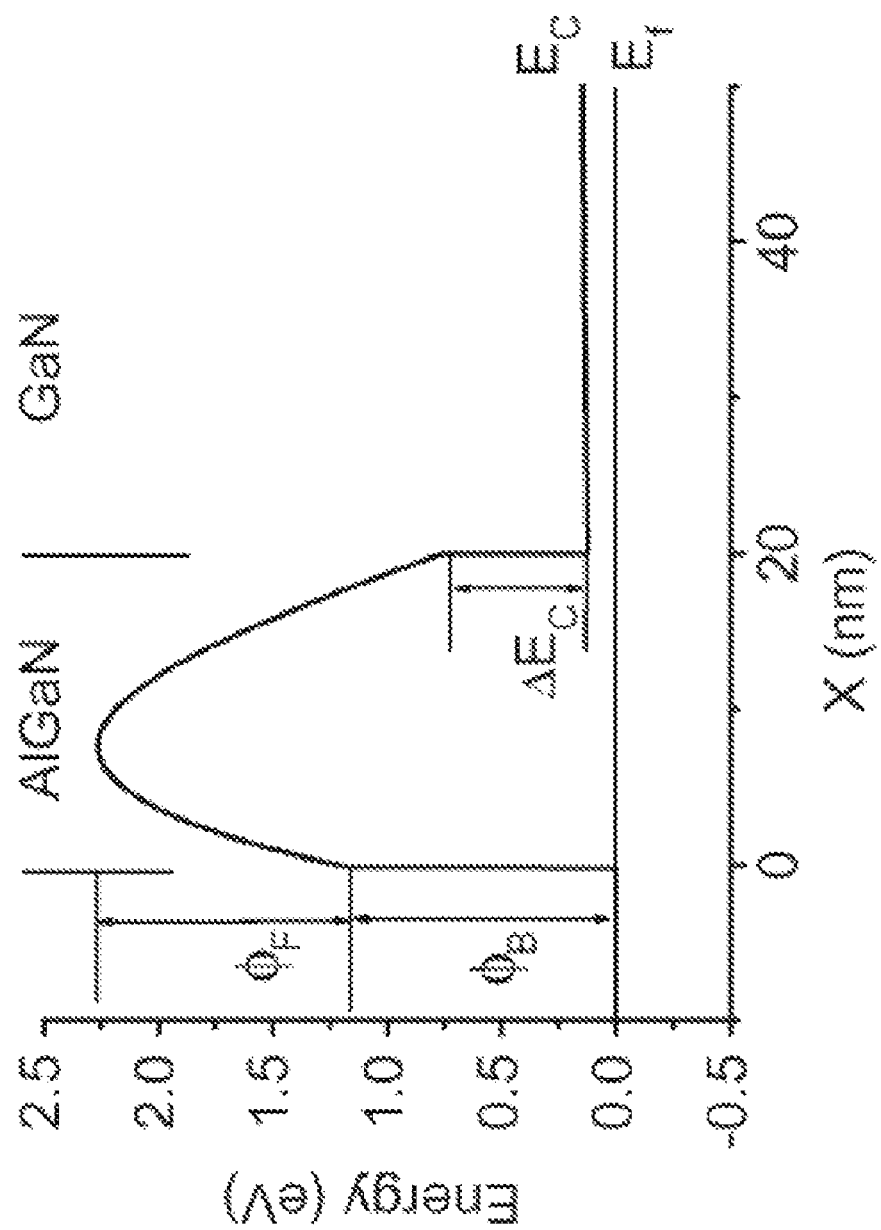
FIG. 23 shows simulated conduction-band diagrams of E-mode AlGaN/GaN HEMT with $CF_4$ plasma treatment.

The suppression of the gate-leakage current in the CF$_4$ plasma-treated AlGaN/GaN HEMT can be explained as follows. During CF$_4$ plasma treatment, fluorine ions are incorporated into the AlGaN layer. These ions with a strong electronegativity act as immobile negative charges that cause the upward conduction-band bending in the AlGaN barrier layer due to the electrostatic induction effect. Thus, an additional barrier height $\phi_F$, as shown in FIG. 23 is formed, and the effective metal-semiconductor barrier height is increased from $\phi_B$ to $\phi_B+\phi_F$. This enhanced barrier height can effectively suppress the gate Schottky diode current in both reverse and forward bias regions. With higher plasma power and longer treatment time, the fluorine ion concentration in the AlGaN layer increases, and the effective barrier height is raised further, leading to a more significant gate-current suppression. In FIG. 9 the effective barrier heights and ideality factors that were extracted from the forward region of the measured gate currents by using the TE model are detailed. The effective barrier height of conventional HEMT is 0.4 eV, while the effective barrier height increased to 0.9 eV for the $CF_4$ plasma-treated HEMT at 200 W for 60 seconds. The effective barrier heights of the $CF_4$ plasma-treated HEMT also show a trend of increase with the plasma power and treatment time, except for the HEMT treated at 150 W for 20 seconds, which has a relatively higher effective barrier height. This exception is thought to be due to the process variations. The fact that the extracted effective barrier height is much lower than the theoretically predicted values and very large ideality factors (>2.4) indicates that the gate currents of fabricated AlGaN/GaN HEMTs are not dominated by teh TE mechanism but other mechanisms, such as vertical tunneling, surface barrier thinning, and trap-assisted tunneling. Thus, the barrier heights and ideality factors, which are extracted by using the TE model, are not accurate. Nevertheless, they provide sufficient qualitative information for explaining the mechanism of the gate-current suppression in $CF_4$ plasma-treated AlGaN/GaN HEMTs.

Dynamic I-V characterizations were conducted by using an Accent DIVA D265 system to investigate the effects of $CF_4$ plasma treatment of drain-current dispersion. The pulse width is 0.2 µs and the pulse separation is 1 ms. The quiescent point is at VGS slightly (~0.5 V) below the pinch-off and $V_{DS}=15$ V. Compared to static I-V characteristics, the maximum drain-current of conventional D-mode HEMT dropped by 63%, while that of E-mode HEMT with $CF_4$ plasma treatment at 150 W for 150 seconds dropped by 6%.

The alleviation of drain-current drops for E-mode HEMT is likely due to a raised gate bias of the quiescent point ($V_{GS}=0$ V for E-mode HEMT, $V_{GS}=-4.5$ V for D-mode HEMT).

RF Small-Signal Characteristics

Figure 15:
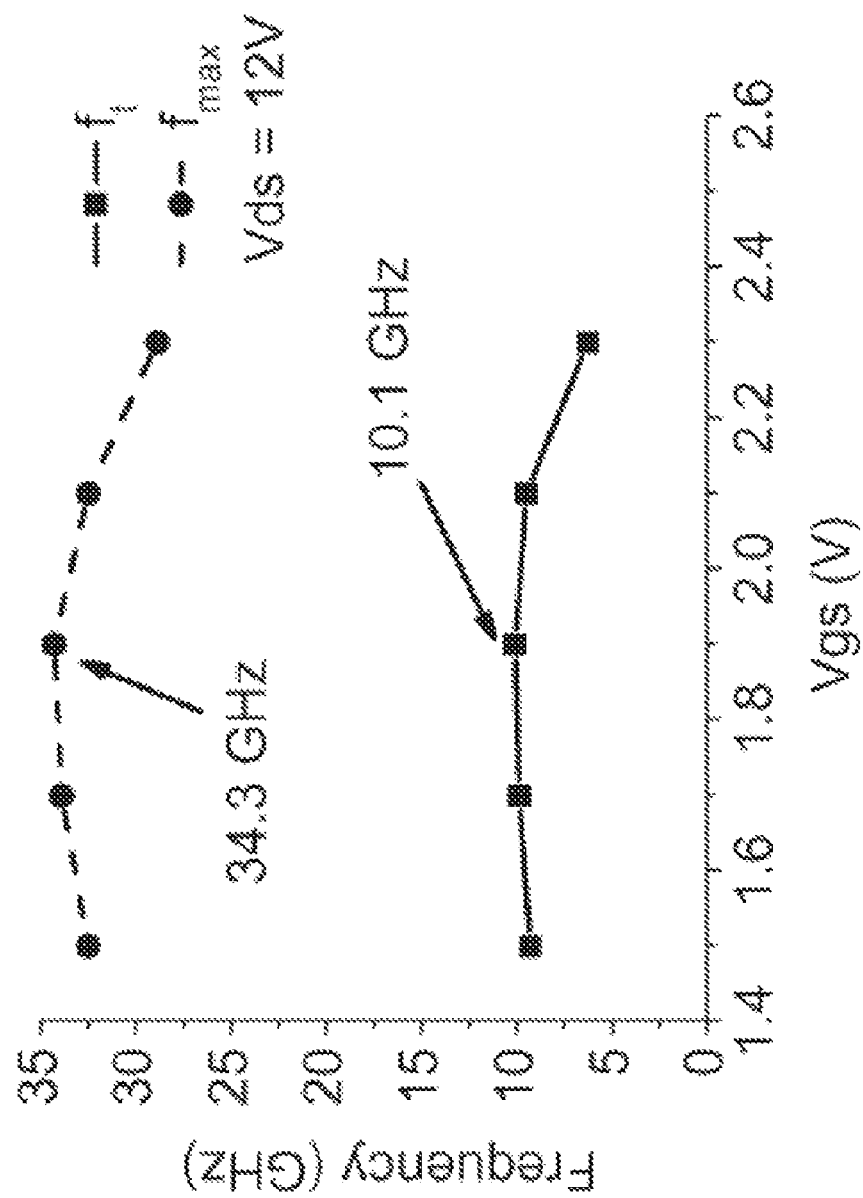
FIG. 15 shows dependencies of $f_t$ and $f_{max}$ on gate bias, where $V_{ds}$ is fixed at 12V for one embodiment of the present innovations as illustrated in Example 3.

On-wafer small-signal RF characterization of the fabricated AlGaN/GaN HEMTs were carried out at the frequency range of 0.1-39.1 GHz using Cascade microwave probes and an Agilent 8722ES network analyzer. Open-pad de-embeddings with the S-parameters of dummy pads were carried out to eliminate a parasitic capacitance of the probing pads. The current gain and maximum stable gain/maximum available gain (MSG/MAG) of all devices with 1-µm long gate were derived from the de-embedded S-parameters as a function of frequency. The current cutoff frequency ($f_t$) and maximum oscillation frequency ($f_{max}$) were extracted from current gains and MSG/MAGs at unit gain. It has been observed that the intrinsic $f_t$ and $f_{max}$ are generally 10-15% higher than the extrinsic ones without the de-embeddings process. The dependencies of $f_t$ and $f_{max}$ on the gate bias are shown in FIG. 15 for the E-mode HEMT. Both $f_t$ and $f_{max}$ are relatively constant at both low and high gate bias, indicating a good linearity. FIG. 16 lists $f_t$ and $f_{max}$ of all samples. For the conventional HEMT, $f_t$ and $f_{max}$ are 13.1 and 37.1 GHz, while for the $CF_4$ plasma-treated HEMTs, $f_t$ and $f_{max}$ are approximately 10 and 34 GHz, slightly lower than that of the conventional HEMT, except for the HEMT treated at 150 W for 60 seconds. This higher $f_t$ and $f_{max}$ in the 150 W/60 second device are consistent with the higher gm presented before, and are attributed to a material non-uniformity and process variation. The slightly lower $f_t$ and $f_{max}$ in the $CF_4$ plasma-treated HEMTs indicate that the post-gate RTA at 400° C. can effectively recover the 2DEG mobility degraded by the plasma treatment, but the recovery is less than 100%. It suggests that the optimization of the RTA temperature and time is needed to further improve the 2DEG mobility, while not degrading the gate Schottky contact.

MISHFETs

In another embodiment, E-mode $Si_3N_4$/AlGaN/GaN MISHFET were constructed with a two-step $Si_3N_4$ process which features a thin layer of $Si_3N_4$ (15 nm) under the gate and a thick layer of $Si_3N_4$ (about 125 nm) in the access region. Fluorine-based plasma treatment was used to convert the device from D-mode to E-mode. The E-mode MISHFETs with 1-µm long gate footprint exhibited a threshold voltage of 2 V, a forward turn-on gate bias of 6.8 V (compared to about a 3 V realized in E-mode AlGaN/GaN HMETs) and a maximum current density of 420 mA/mm.

Figure 17A:
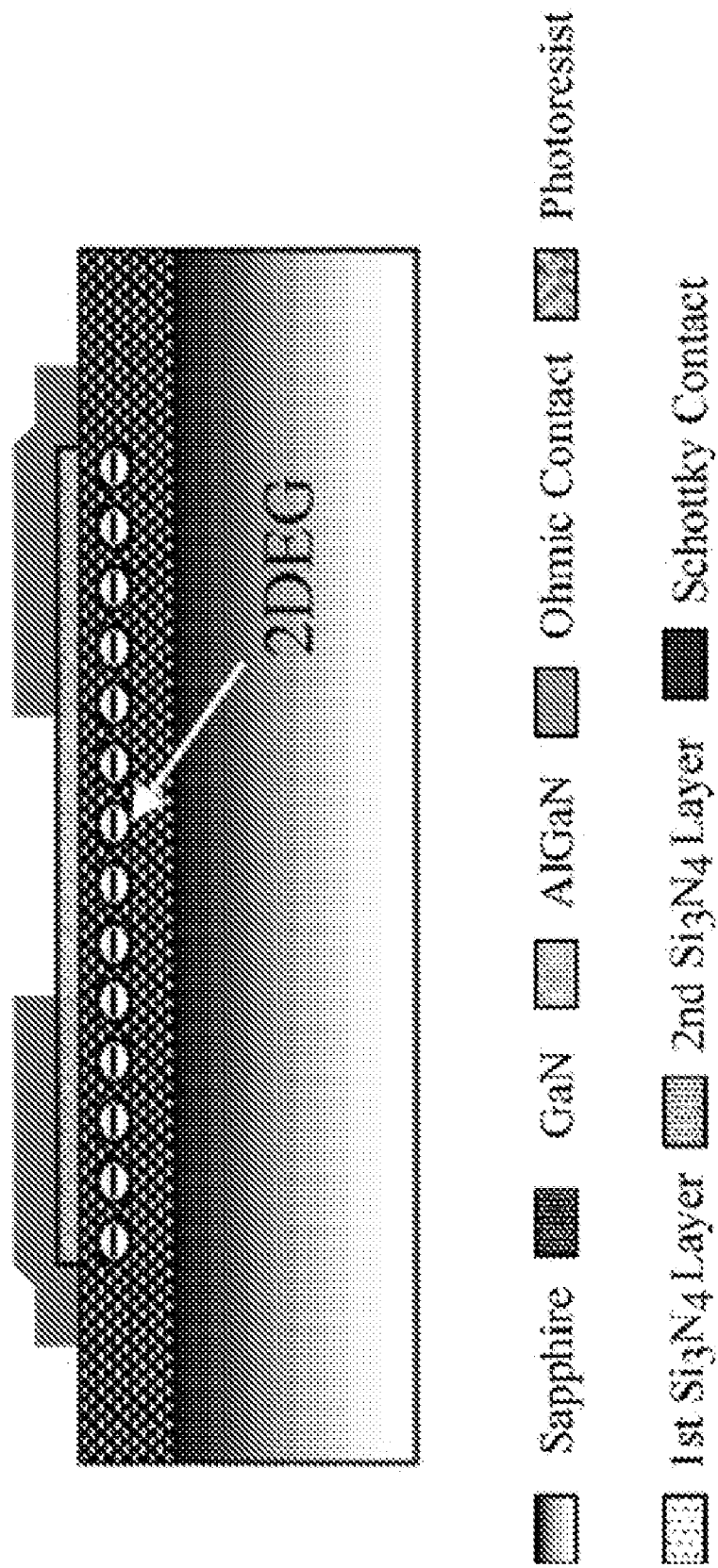
Figure 17B:
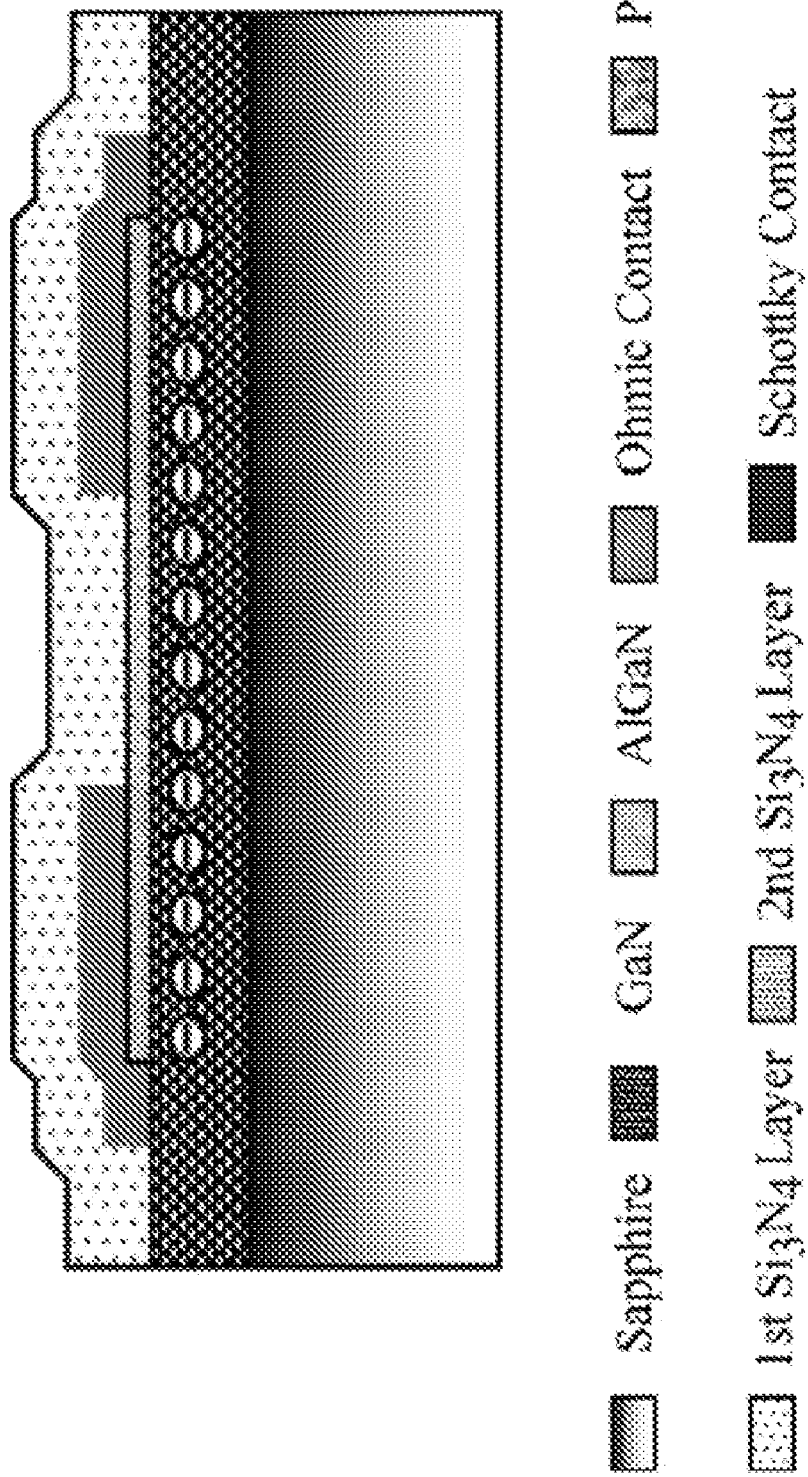
Figure 17D:
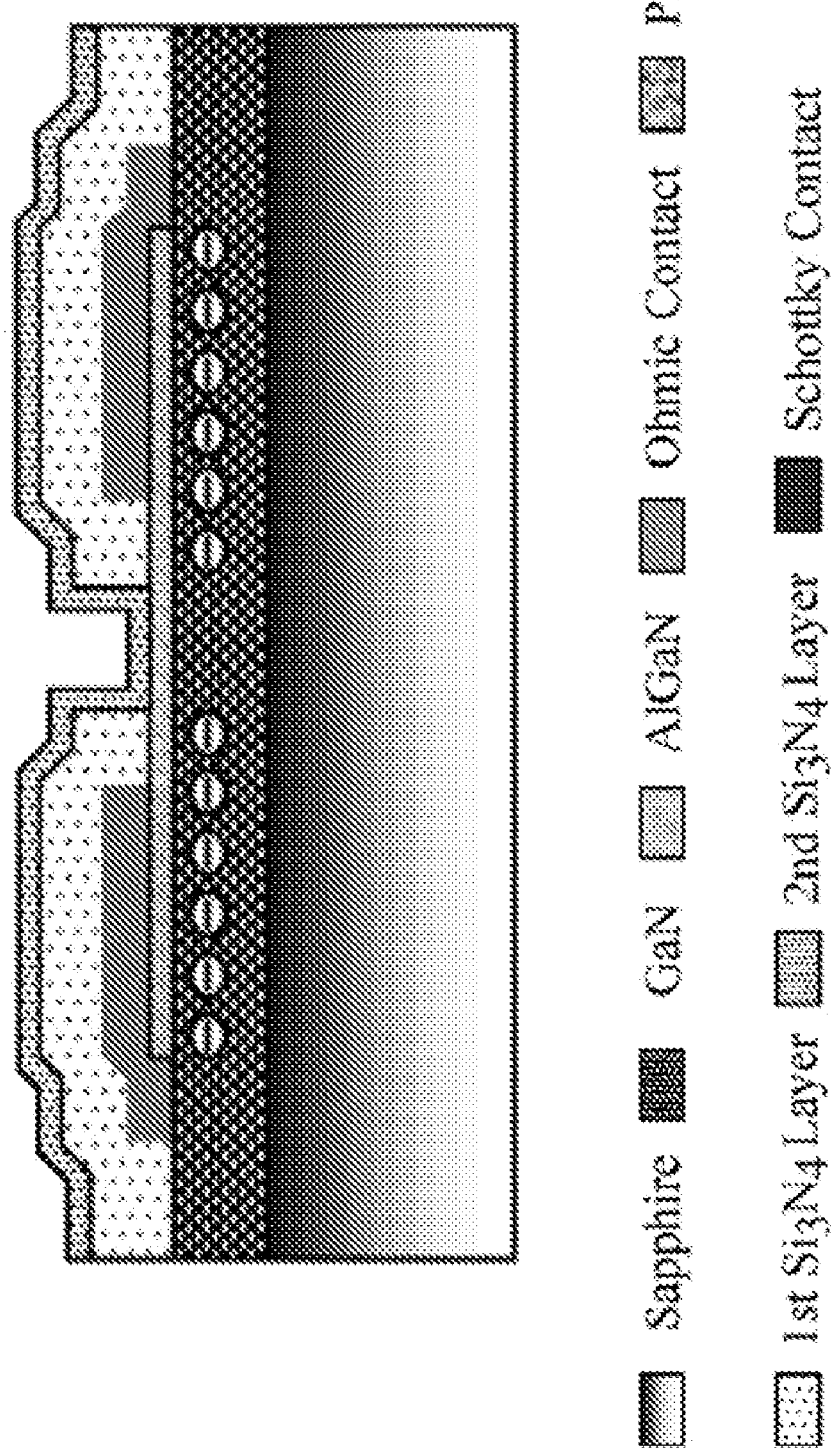
Figure 17E:
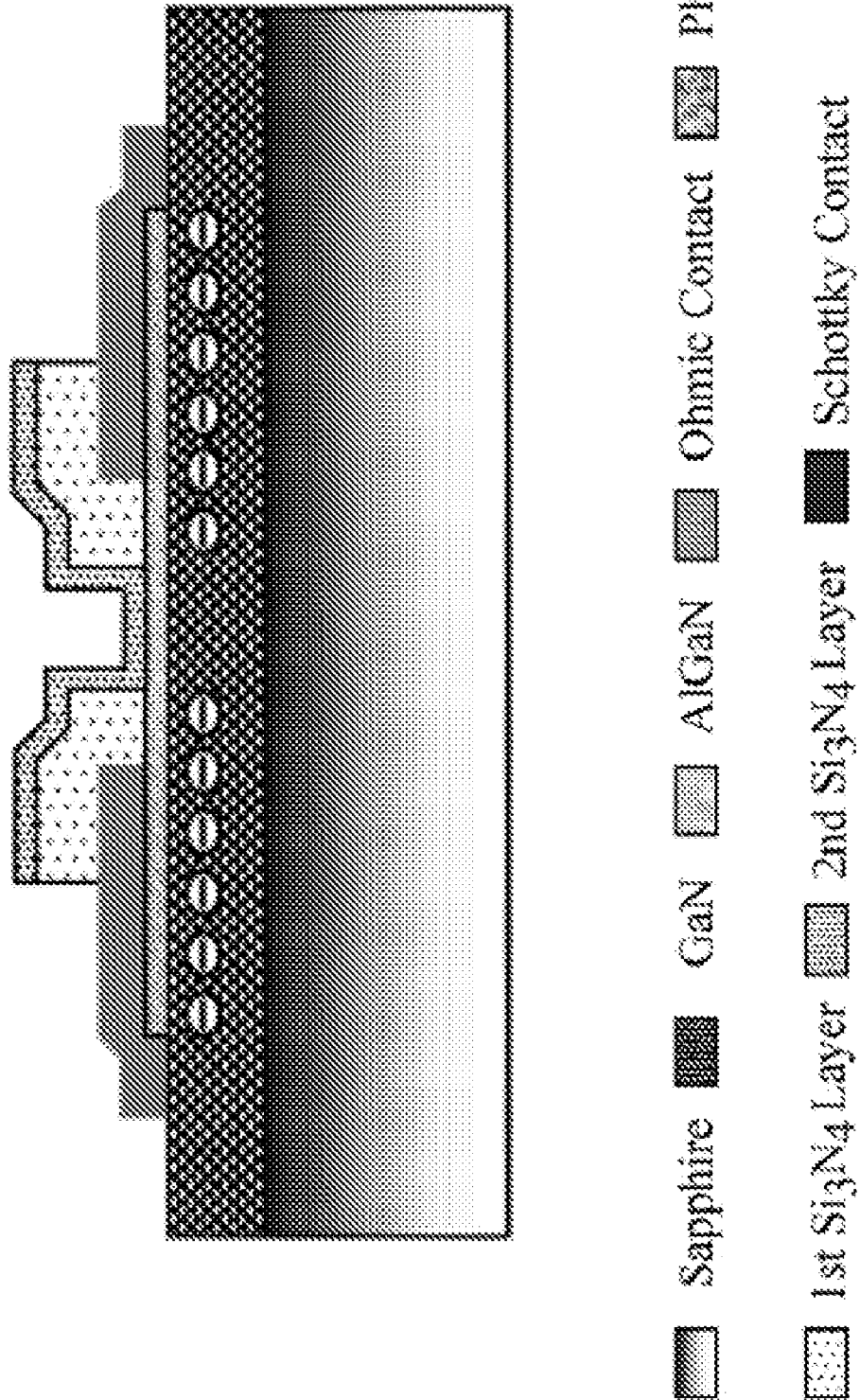
Figure 17F:
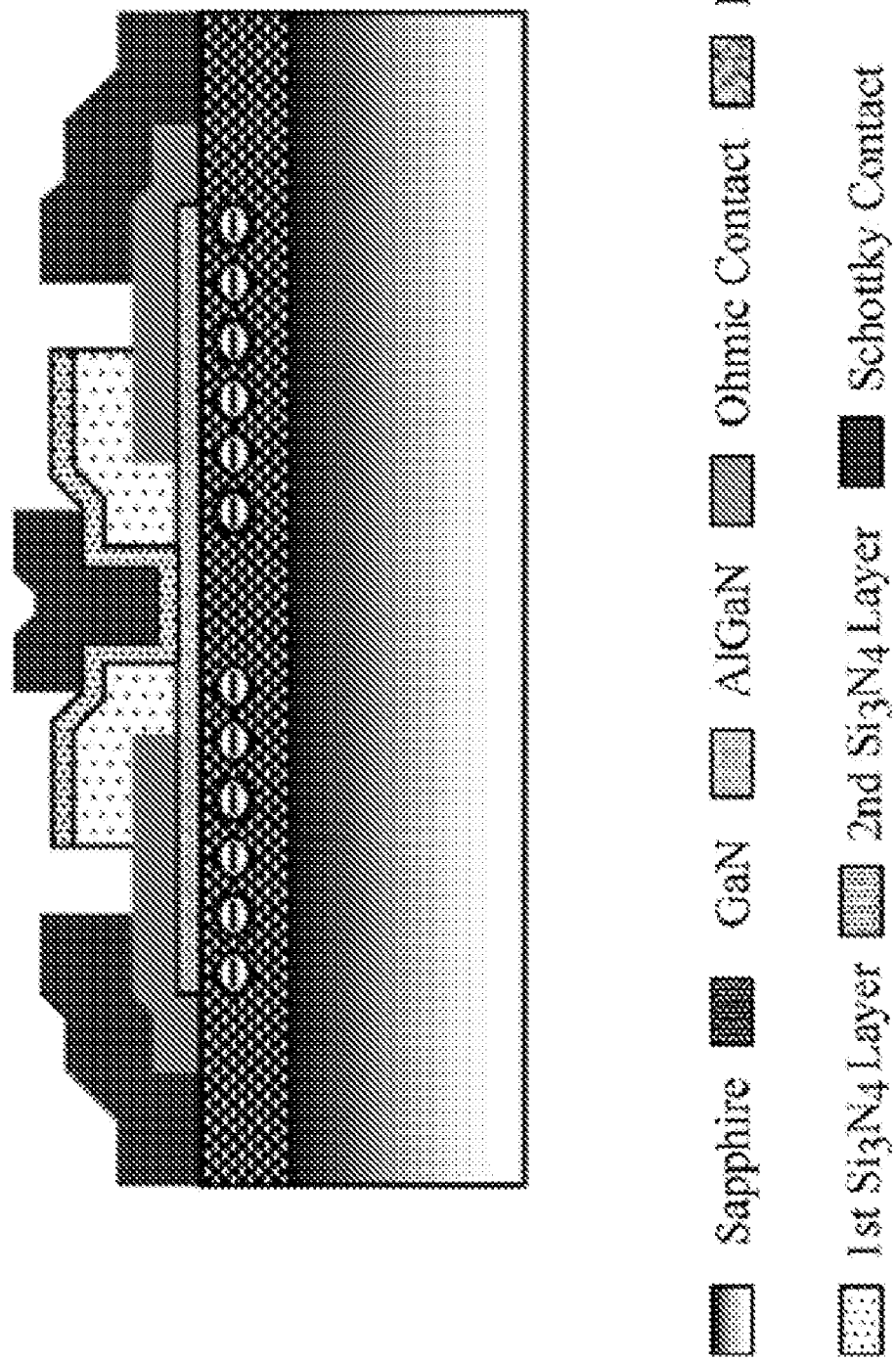

The AlGaN/GaN HFET structure used in this letter was grown on (0001) sapphire substrates in an Aixtron AIX 2000 HT MOCVD system. The HFET structure consists of a 50-nm thick low temperature GaN nucleation layer, a 2.5-µm thick not-intentionally doped GaN buffer layer, and an AlGaN barrier layer with nominal 30% Al composition. The barrier layer is composed of a 3-nm undoped spacer, a 16-nm carrier supplier layer doped at $2\times10^{18}$ cm$^{-3}$, and a 2-nm undoped cap layer. The capacitance-voltage ("C-V") measurement by mercury probe yields an initial threshold voltage of –4 V for this sample. The process flow is illustrated in FIGS. 17A through 17F. The device mesa is formed using $Cl_2$/He plasma dry etching in an STS ICP-RIE system followed by the source/drain ohmic contact formation with Ti/Al/Ni/A (20 nm/150 nm/50 nm/80 nm) annealed at 850° C. for 30 seconds, as shown in FIG. 17A. Then, the first $Si_3N_4$ layer (about 125 nm) is deposited on the sample by plasma enhanced chemical vapor deposition (PECVD) as in FIG. 17B. After gate windows with 1-µm length are opened by photolithography, the sample was put in an RIE system under $CF_4$ plasma treatment, which removed the $Si_3N_4$ and incorporated fluorine ions in the AlGaN. The RF power of the plasma was 150 W, as shown in FIG. 17C. The gas flow was controlled to be 150 sccm, and the total etching and treatment time is 190 seconds. After removing the photoresist, the second $Si_3N_4$ film (about 15 nm) was deposited by PECVD to form the insulating layer between gate metal and AlGaN as in FIG. 17D. Subsequently, the $Si_3N_4$ layer was patterned and etched to open windows in the source and drain ohmic contact regions, as shown in FIG. 17E. Next, the 2-µm long gate electrodes were defined by photolithography followed by e-beam evaporation of Ni/Au (~50 nm/300 nm) and liftoff as in FIG. 17F. To ensure that the gate electrode covers the entire plasma-treated region, the metal gate length (2 µm) was chosen to be larger than the treated gate area (1 µm), leading to T-gate configuration. The gate overhang in the source/drain access regions is insulated from the AlGaN layer by thick $Si_3N_4$ layer, keeping the gate capacitances at low level. Finally, the whole sample was annealed at 400° C. for 10 minutes to repair the plasma-induced damage in the AlGaN barrier and channel. Measured from the foot gate, the gate-source and gate-drain spacings are both 1.5 µm. The E-mode MISHFETs are designed with gate width of 10 µm for dc testing and 100 µm for RF characterizations.

Figure 18:
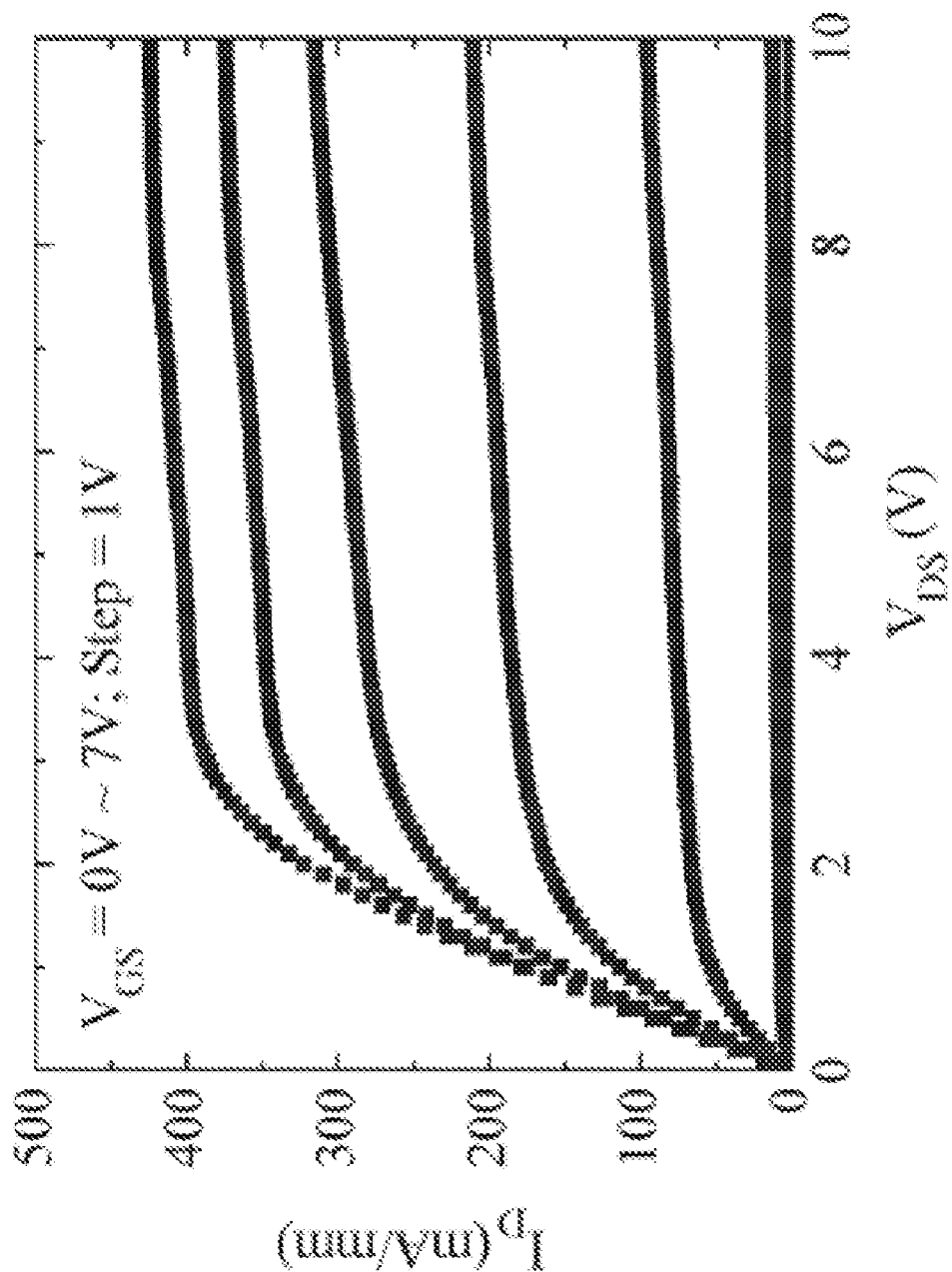
FIG. 18 shows the DC output characteristics of one embodiment of the present innovations as illustrated in Example 4.
Figures 19A, 19B:
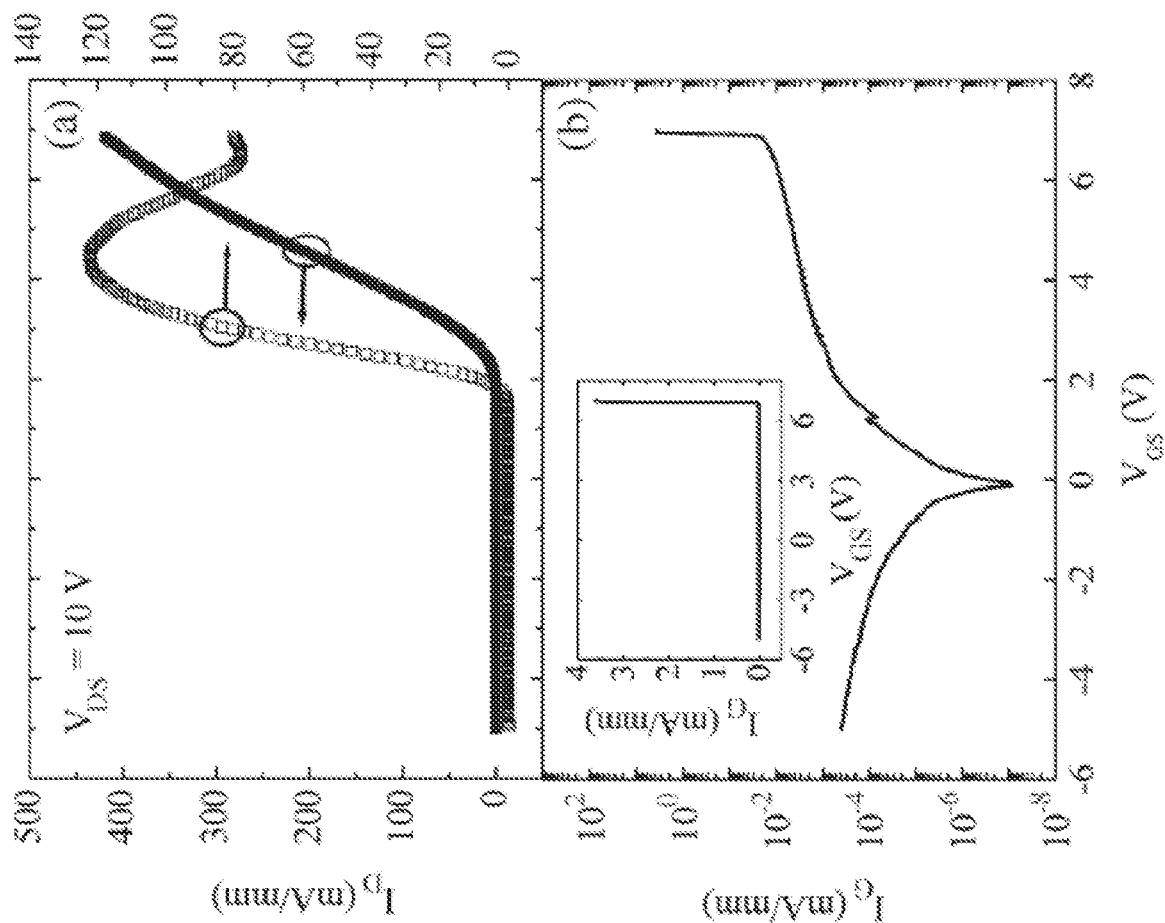
FIG. 19A shows the transfer characteristics of on embodiment of the present innovations as illustrated in Example 4.
FIG. 19B shows the gate leakage currents of one embodiment of the present innovations as illustrated in Example 4.
Figure 20:
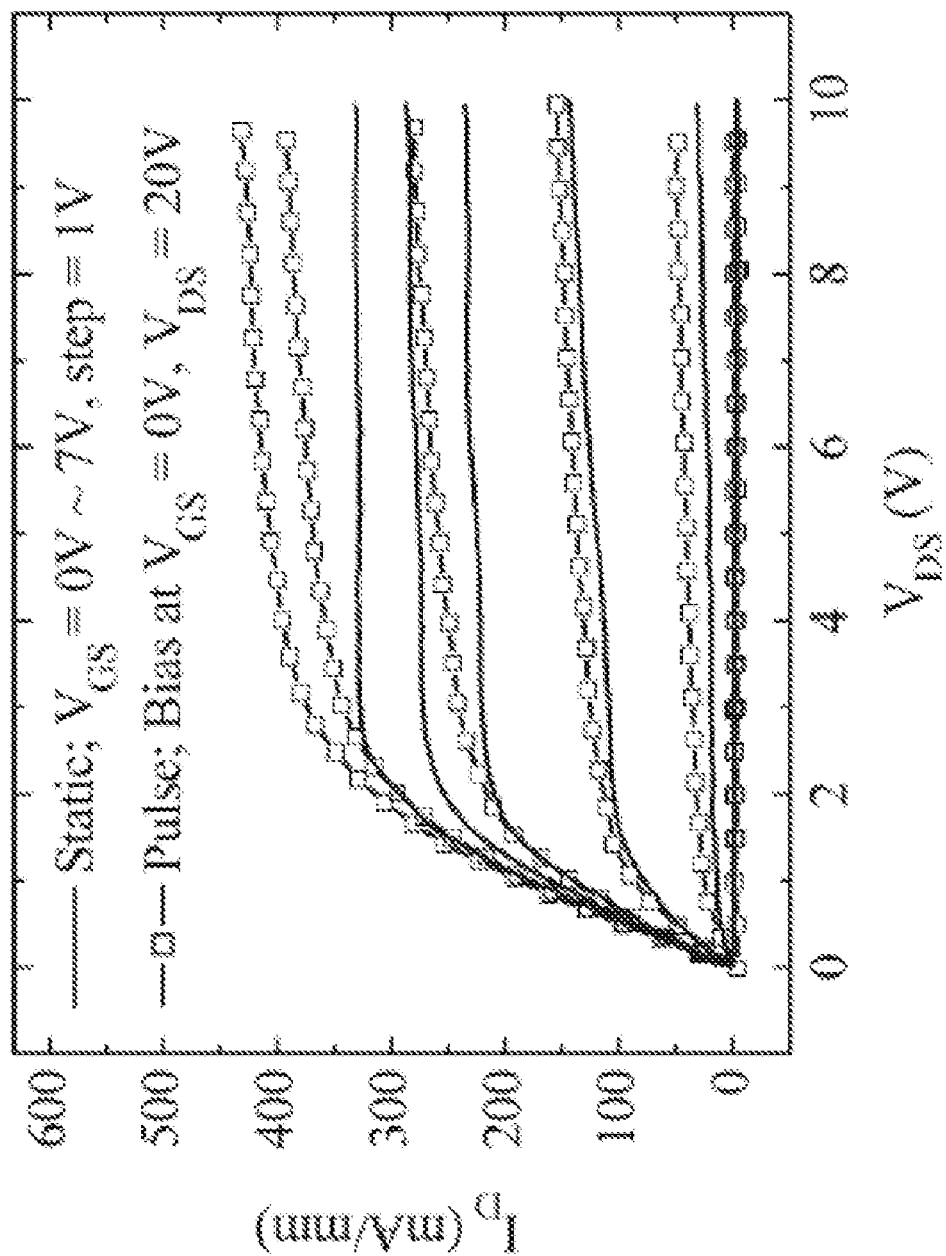
FIG. 20 shows pulse measurements of one embodiment of the present innovations as illustrated in Example 4.
Figure 21:
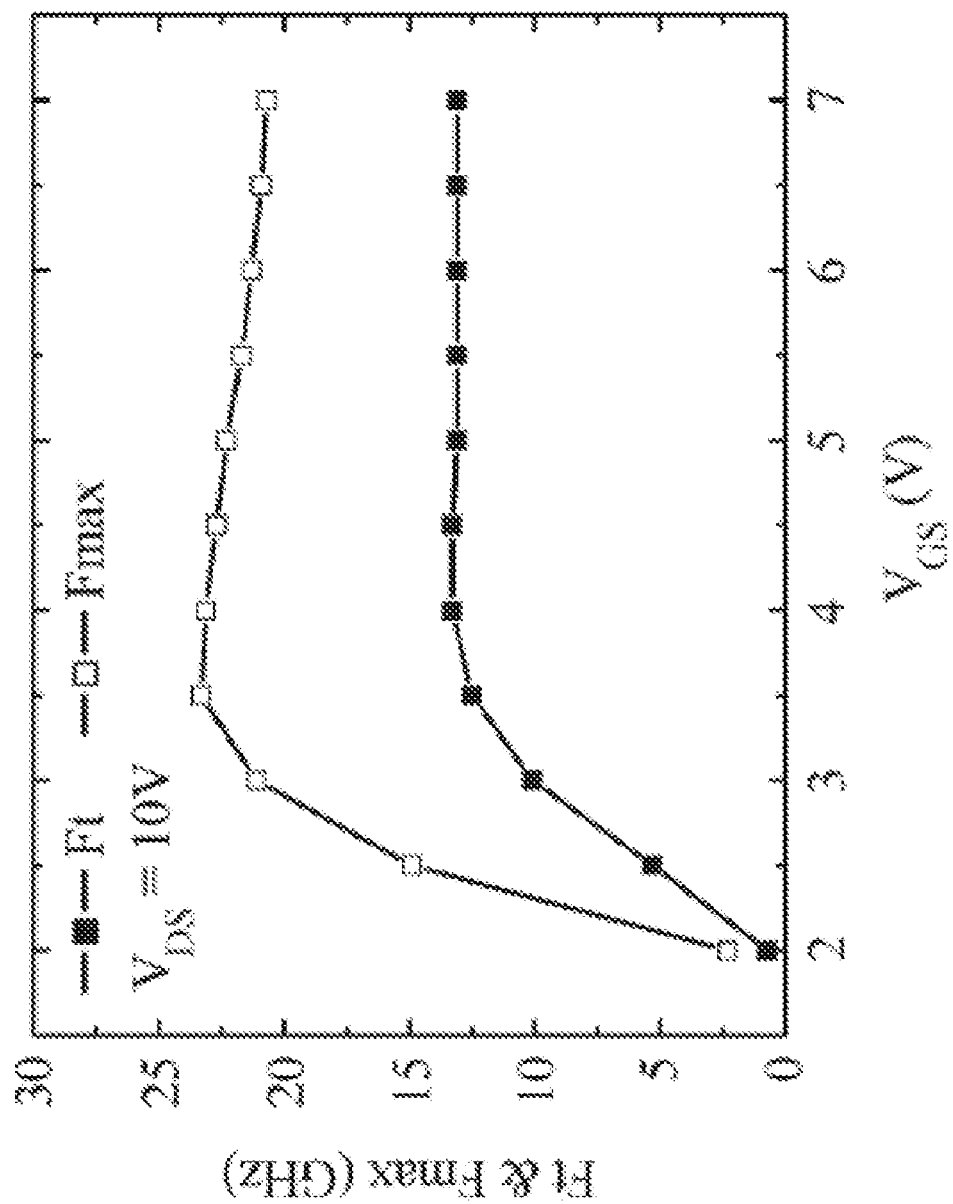
FIG. 21 shows small signal RF characteristics of one embodiment of the present innovations as illustrated in Example 4.

The constructed device was then characterized. The DC output characteristics of the E-mode MISHFETs are plotted in FIG. 18. The devices exhibit a peak current density of about 420 mA/mm, an ON-resistance of about 5.67 Ω·mm and a knee voltage of about 3.3 V at $V_{gs}$=7 V. FIG. 19A shows the transfer characteristics of the same device with 1×10-μm gate dimension. It can be seen that the $V_{th}$ is about 2 V, indicating a 6-V shift of $V_{th}$ (compared to a conventional D-mode HFET) achieved by the insertion of the $Si_3N_4$ insulator and plasma treatment. The peak transconductance gm is about 125 mS/mm. FIG. 19B shows the gate leakage current at both the negative bias and forward bias. The forward bias turn-on voltage for the gate is about 6.8 V, providing a much larger gate bias swing compared to the E-mode HFETs. Pulse measurements were taken on the E-mode MISHFETs with 1×100-μm gate dimensions with a pulse length of 0.2 μs and a pulse separation of 1 ms. The quiescent bias point is chosen at $V_{GS}$=0 V (below $V_{th}$) and $V_{DS}$=20 V. FIG. 20 shows that the pulsed peak current is higher than the static one, indicating no current collapse in the device. The static maximum current density of the large device with a 100-μm gate width is about 330 mA/mm, smaller than the device with 10-μm gate width (about 420 mA/mm). The lower peak current density in the larger device is due to the self-heating effect that lowers the current density. Since little self-heating occurs during pulse measurements, the maximum current for the 100-μm wide device can reach the same level as the 10-μm wide device. On wafer small-signal RF characteristics were performed from 0.1 to 39.1 GHz on the 100-μm wide E-mode MISHFETs at $V_{DS}$=10 V. As shown in FIG. 21, the maximum current gain cutoff frequency ($f_T$) and power gain cutoff frequency ($f_{max}$) are 13.3 and 23.3 GHz, respectively. When the gate bias is 7 V, the small-signal RF performance does not significantly degrade, with an $f_T$ of 13.1 GHz and an $f_{max}$ of 20.7 GHz, indicating that the $Si_3N_4$ insulator offers an excellent insulation between gate metal and semiconductor.

Models

A theoretical characterization model was developed for some of the present innovations. For a conventional AlGaN/GaN HEMT with silicon modulation doped layer, as shown in FIG. 7, the polarization charges need to be taken into account in the calculation of HEMTs threshold voltage. Modified from a generally used formed by taking into account the effects of charge polarization, surface and buffer traps, the threshold voltage of the AlGaN/GaN HEMT can be expressed as:

$$V_{th} = \phi_B/e - d\sigma/\varepsilon - \Delta E_C/e + E_{f0}/e - \frac{e}{\varepsilon}\int_0^d dx \int_0^x N_{si}(x)dx - edN_{st}/\varepsilon - eN_b/C_b. \quad (1)$$

Where the parameters are defined as follows:
  $\Phi_B$ is the metal-semiconductor Schottky barrier height.
  σ is the overall net (both spontaneous and piezoelectric) polarization charge at the barrier-AlGaN/GaN interface.
  d is the AlGaN barrier/layer thickness.
  $N_{si}(x)$ is the silicon-doping concentration.
  $\Delta E_c$ is the conduction-band offset at the AlGaN/GaN heterostructure.
  $E_{f0}$ is the difference between the intrinsic Fermi level and the conduction band edge of the GaN channel.
  ε is the dielectric constant of AlGaN.
  $N_{st}$ is the net-charged surface traps per unit area.
  $N_b$ is the effective net-charged buffer traps per unit area.
  $C_b$ is the effective buffer-channel capacitance per unit area.
The last two terms in equation (1) describe the effects of the surface traps and buffer traps, respectively. The AlGaN surface is at x=0, and the direction pointing to the channel is the positive direction for the integration. To represent the devices described above, immobile negative charges are introduced into the AlGaN barrier layer under the gate. Because of electrostatic induction, these immobile negative charges can deplete 2DEG in the channel, raise the energy band, and hence modulate $V_{th}$. Including the effect of the negative charges confined in the AlGaN barrier, the modified threshold voltage from equation (1) is given by:

$$V_{th} = \phi_B/e - d\sigma/\varepsilon - \Delta E_C/e + E_{f0}/e - \frac{e}{\varepsilon}\int_0^d dx \int_0^x (N_{si}(x) - N_F(x))dx - edN'_{st}/\varepsilon - eN_b/C_b. \quad (2)$$

The positive-charge distribution profile $N_{si}(x)$ is replaced by the net charge distribution $N_{si}(x)-N_F(x)$, where $N_F(x)$ is the concentration of the negatively charged fluorine ion. The surface-trap density ($N_{st}$) could be modified by the plasma treatment.

Figure 22:
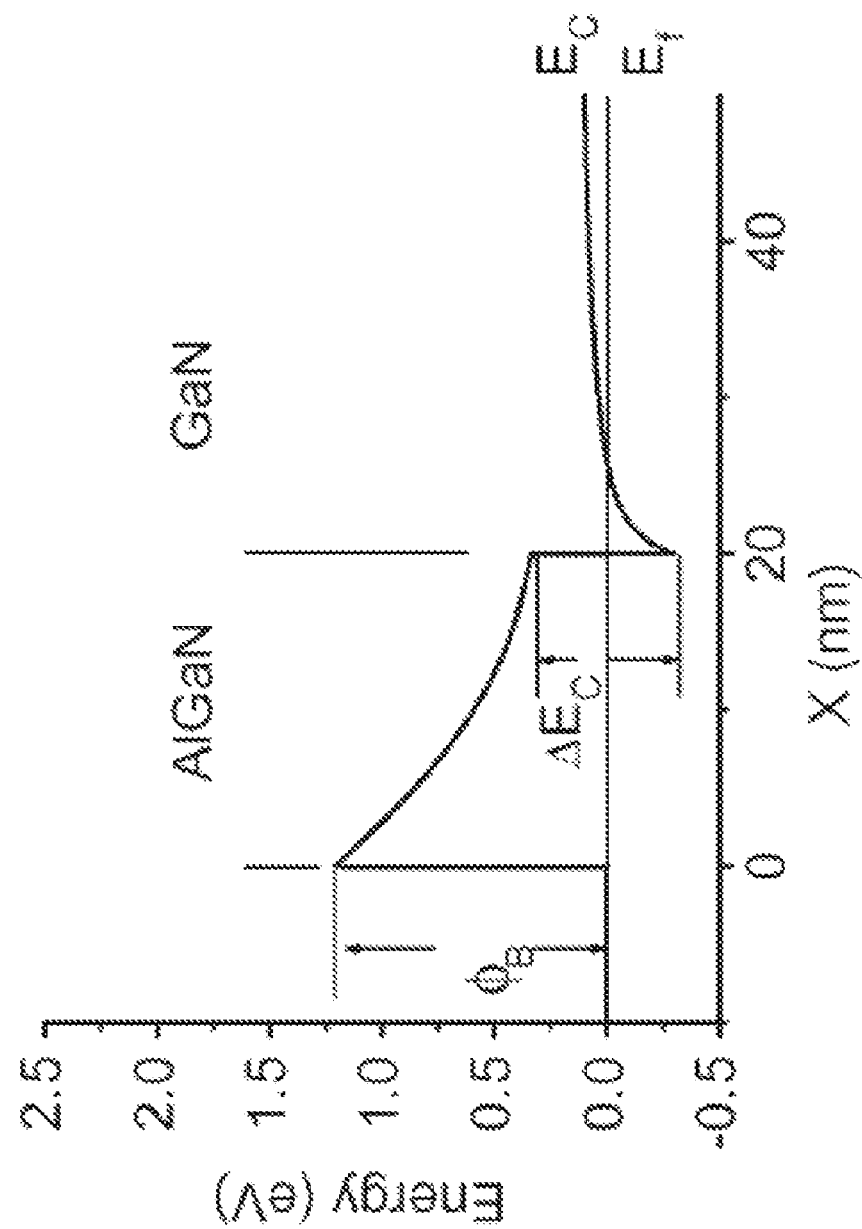
FIG. 22 shows simulated conduction-band diagrams of conventional D-mode AlGaN/GaN HEMT without $CF_4$ plasma treatment.

By applying Poisson's equation and Fermi-Dirac statistics, a simulation was made of the conduction-band profiles and the electron distributions of AlGaN/GaN HEMT structures with and without fluorine ions incorporated in AlGaN layer. Both structures have the same epitaxial structure, shown in FIG. 7. For the fluorine ions incorporated HEMT structure, the negatively charged fluorine ions' profile was extracted for SIMS measurement results of the fluorine atoms' distribution of an AlGaN/GaN HEMT structure that was treated by $CF_4$ plasma at 150 W for 150 s and converted to an E-mode HEMT. The stimulated conduction band diagrams at zero gate bias were plotted in FIGS. 22 and 23 For the simulated conduction band E-mode HEMT, as shown in FIG. 22 the fluorine concentration is approximated by using a linear distribution that the peak fluorine concentration is $3\times10^{19}$ cm$^{-3}$ at the AlGaN surface, and the fluorine concentration is assumed to be negligible at the AlGaN/GaN interface. A total fluorine ion sheet concentration of about $3\times10^{13}$ cm$^{-2}$ is sufficient to not only compensate for the doping (about $3.7\times10^{18}$ cm$^2$) in the AlGaN barrier but also to compensate for the piezoelectric and spontaneous polarization-induced charges (about $1\times10^{13}$ cm$^{-2}$). Two significant features can be observed. First, compared to the untreated AlGaN/GaN HEMT structure, the plasma-treated structure has its 2DEG channel's conduction-band minimum above Fermi level, indicating a completely depleted channel and E-mode HEMT. As shown in the electron profiles in FIG. 24, there are no electrons in the channel under the zero gate bias in the plasma-treated structure, indicating an E-mode HEMT operation. Second, the immobile negatively charged fluorine ions cause an upward bending of the conduction band, especially in AlGaN barrier, yielding an additional barrier height φF, as shown in FIG. 23 Such an enhanced barrier can significantly suppress the gate Schottky diode current of AlGaN/GaN HEMT in both the reverse and forward bias regions.

According to a disclosed class of innovative embodiments, there is provided: a semiconductor active device, comprising: first and second conductive source/drain regions, separated by a channel consisting essentially of a Group III nitride compound; a wider-bandgap semiconductor layer overlying said channel, which also consists essentially of a Group III nitride compound, and which has a higher fraction of aluminum than does said channel; a conductive gate electrode which lies above said wider-bandgap layer, and is capacitively coupled to said channel to control conduction therein; wherein said wider-bandgap layer comprises fluorine ions which shift the threshold voltage of said channel, as seen by said gate, sufficiently that said channel operates in enhancement mode.

Also provided is a device as above, wherein said wider-bandgap layer comprises dopant atoms, and said channel has fewer than one-tenth as many dopant atoms per unit volume.

Also provided is a device as above, wherein said wider-bandgap layer has inhomogeneous doping.

Also provided is a device as above, further comprising a gate insulator layer below said gate electrode.

Also provided is a device as above, wherein said channel layer is GaN, and said wider-bandgap layer is AlGaN.

Also provided is a device as above, wherein said wider-bandgap layer comprises dopant atoms, and said channel has fewer than one-tenth as many dopant atoms per unit volume.

Also provided is a device as above, wherein said gate electrode overlies a planar portion of said wider-bandgap semiconductor, without any recess etch.

Also provided is a device as above, wherein said wider-bandgap semiconductor includes more than $10^{18}$ cm$^{-3}$ of fluorine atoms.

According to a disclosed class of innovative embodiments, there is provided: a semiconductor active device, comprising: first and second condutive source/drain regions, separated by a channel consisting essentially of a Group III nitride compound; a wider-bandgap semiconductor layer overlying said channel, which also consists essentially of a Group III nitride compound, and which has a higher fraction of aluminum than does said channel; a conductive gate electrode which lies above said wider-bandgap layer, and is capacitively coupled to said channel to control conduction therein; wherein said wider-bandgap layer comprises fluorine ions in a dosage of more than $10^{13}$ cm$^{-2}$.

Also provided is a device as above, wherein said wider-bandgap layer comprises dopant atoms, and said channel has fewer than one-tenth as many dopant atoms per unit volume as said wider-bandgap layer.

Also provided is a device as above, further comprising a gate insulator layer below said gate electrode.

Also provided is a device as above, wherein said channel layer is GaN, and said wider-bandgap layer AlGaN.

Also provided is a device as above, wherein said gate electrode overlies a planar portion of said wider-bandgap semiconductor, without any recess etch.

According to a disclosed class of innovative embodiments, there is provided: a semiconductor active device, comprising: first and second conductive souce/drain regions, connected by a channel, all consisting essentially of a Group III nitride semiconductor compound; a wider-bandgap semiconductor layer, overlying and lattice matched to said channel, which has a higher fraction of aluminum than does said channel; a conductive gate electrode which lies above said wider-bandgap layer, and is capacitively coupled to said channel to control conduction therein; wherein said wider-bandgap layer comprises fluorine ions in a concentration which shifts the threshold voltage of said channel, as seen by said gate, by at least 100 millivolts.

Also provided is a device as above, further comprising a gate insulator layer below said gate electrode.

Also provided is a device as above, wherein said channel layer is GaN, and said wider-bandgap layer is AlGaN.

Also provided is a device as above, wherein said gate electrode overlies a planar portion of said wider-bandgap semiconductor, without any recess etch.

According to a disclosed class of innovative embodiments, there is provided: a semiconductor active device, comprising: first and second conductive source/drain regions, separated by a semiconductor channel consisting primarily of GaN; a wider-bandgap semiconductor layer overlying said channel, and consisting primarily of AlGaN semiconductor, and having a higher fraction of aluminum than does said channel; a conductive gate electrode which lies above said wider-bandgap layer, and is capacitively coupled to said channel to control conduction therein; wherein said wider-bandgap layer comprises fluorine ions in a dosage of more than $10^{13}$ cm$^{-2}$.

Also provided is a device as above, further comprising a gate insulator layer below said gate electrode.

Also provided is a device as above, wherein said gate electrode overlies a planar portion of said wider-bandgap semiconductor, without any recess etch.

Also provided is a device as above, wherein said wider-bandgap layer comprises dopant atoms, and said channel has fewer than one-tenth as many dopant atoms per unit volume.

Also provided is a device as above, wherein said wider-bandgap layer has inhomogeneous doping.

According to a disclosed class of innovative embodiments, there is provided: a method of operating a III-N semiconductor active device, comprising the actions of: controlling accumulation/depletion of majority carriers in a III-N semiconducting channel, using capacitance coupling through a wider-bandgap III-N semiconductor layer which overlies said channel layer, and which has a higher fraction of aluminum than does said channel layer; while applying a constant bias to said accumulation/depletion, by a fixed charge component provided by substitutional impurities in said wider-bandgap semiconductor layer, whereby said channel layer can operate in enhancement mode.

Also provided is a method as above, wherein said wider-bandgap layer comprises dopant atoms, and said channel has fewer than one-tenth as many dopant atoms per unit volume.

Also provided is a method as above, wherein said gate electrode is separated from said wider-bandgap layer by a gate insulator layer.

Also provided is a method as above, wherein said channel layer is GaN, and said wider-bandgap layer AlGaN.

According to a disclosed class of innovative embodiments, there is provided: a process for fabricating a semicondutor active device, comprising the actions of: a) introducing fluorine into a vertically inhomogeneous semicondutor layer having the general composition of $Al_xM_{1-x}Y$, where M is predominantly Ga and Y is pridominantly N, and the Al fraction is higher near a surface of said layer; and b) positioning a gate electrode, in proximity to said surface, over a channel area of said semiconductor layer, to control conduction therethrough; wherein said action a) shifts the threshold voltage of said channel as seen by said gate electrode.

Also provided is a process as above, wherein said semiconductor layer is an AlGaN/GaN layered structure.

Also provided is a process as above, wherein said action (a) also introduces fluorine into device isolation zones.

Also provided is a process as above, wherein said action (b) is self-aligned to at least some locations where fluorine was introduced in said action (a).

Also provided is a process as above, wherein said semiconductor layer is an epitaxial structure comprising a nucleation layer of GaN or AlN, a buffer layer of GaN of AlGaN, a GaN channel, and an AlGaN barrier.

Also provided is a process as above, further comprising the additional action of forming sources and drains which can provide conduction through said channel, by depositing multiple metal layers and rapid thermal annealing; wherein said metals are selected from the group consisting of Ti, Al, Ni, and Au.

Also provided is a process as above, wherein said introducing action (a) uses a feed gas selected from the group consisting of $CF_4$, $SF_6$, $BF_3$, and mixtures thereof.

Also provided is a process as above, wherein said action (b) deposits at least one metal selected from the group consisting of Ti, Al, Ni, and Au, followed by lift-off.

Also provided is a process as above, further comprising the subsequent action of depositing a passivation material selected from the group consisting of silicon nitride, silicon oxide, polymide, and benzocyclobutene.

Also provided is a process as above, further comprising the subsequent action of a final thermal annealing at approximately the hightest temperature which will not change the Schottky barrier below the gate. According to a disclosed class of innovative embodiments, there is provided: a process for fabricating a semicondutor active device, comprising the actions of: under vacuum conditions, fluoro-etching a dielectric layer over at least some desired channel locations in a vertically inhomogeneous semiconductor layer having the general composition of $Al_xM_{1-x}Y$, where M is predominantly Ga and Y is predominantly N, and the Al fraction is higher near a surface of said layer; and after said fluoro-etch reaches and stops on said semiconductor layer, continuing fluoro-etch conditions thereafter, to introduce more than $10^{12}$ fluorine atoms per square centimeter into said semiconductor layer under plasma bombardment conditions; and positioning a gate electrode, in proximity to said surface, over a channel area of said semiconductor layer, to control conduction therethrough; wherein said fluorine atoms shift the threshold voltage of said channel as seen by said electrode.

Also provided is a process as above, wherein said semiconductor layer is an AlGaN/GaN layered structure.

Also provided is a process as above, wherein said semiconductor layer is an epitaxial structure comprising a nucleation layer of GaN or AlN, a buffer layer of GaN or AlGaN, a GaN channel, and an AlGaN barrier.

Also provided is a process as above, further comprising the additional action of forming sources and drains which can provide conduction through said channel, by depositing multiple metal layers and rapid thermal annealing; wherein said metals are selected from the group consisting of Ti, Al, Ni, and Au.

Also provided is a process as above, wherein said gate electrode is formed by depositing at least one metal selected from the group consisting of Ti, Al, Ni, and Au, followed by lift-off.

Also provided is a process as above, further comprising the subsequent action of depositing a passivation material selected from the group consisting of silicon nitride, silicon oxide, polyimide, and benzocyclobutene.

Also provided is a process as above, further comprising the subsequent action of a final thermal annealing at approximately the highest temperature which will not change the Schottky barrier below the gate.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

While the above example describes a leteral device, it is also contemplated that the various disclosed inventions can be used in merged devices including a lateral transistor element.

It is also contemplated that the disclosed inventions can be applied to some classes of vertical devices with appropriate changes.

For example, minor variations in the semiconductor composition, e.g. use of a phosphonitride instead of a pure nitride, or use of an $Al_xGa_{(1-x)}N$ over $Al_yGa(1-y)N$ heterostructure for basic HEMT structure, are contemplated as alternatives.

The present innovations provide users with the capability of making single voltage supply RFIC and MMIC. It also provides users a monolithic integration technology for implementing GaN-based digital integrated circuits that are needed for high temperature electronics.

For example, on the various device structures shown, a variety of materials can optionally be used for gate electrodes (taking into account any resulting differences in work function). In one contemplated class of embodiments, gate materials with different work functions can be used in combination with the trapped sheet charge layer provided by various embodiments described above. Similarly, various changes or substitutions can be made in the epitaxial layer doping.

Similarly, as noted above, various materials can optionally be used for the substrate.

Additional general background, which helps to show variations and implementations, may be found in the following publications, each and every one of which is hereby incorporated by reference:

Hu et al., "Enhancement mode AlGaN/GaN HFET with selectively grown PN junction gate," April 2000, IEE Electronics Letters, Vol. 36, No. 8, pp. 753-754;

Jeong S. Moon et al., "Submicron Enhancement-Mode AlGaN/GaN HEMTs," June 2002, Digest of 60th Device Research Conference, pp. 23-44;

K. J. Chen et al., "High-Performance InP-based Enhancement-Mode HEMTs Using Non-Alloyed Ohmic Contacts and Pt-based Buried-Gate Technologies," February 1996, IEEE Trans. on Electron Devices, Vol. 43, No. 2, pp. 252-257;

Akira Endoh et al., "Non-Recessed-Gate Enhancement Mode AlGaN/GaN High Electron Mobility Transistors," April 2004, Japanese Journal of Applied Physics, Vol. 43, No. 4B, pp 2255-2258;

Y. Cai, Y. G. Zhou, K. J. Chen, and K. M. Lau, "High-Performance Enhancement-Mode AlGaN/GaN HEMTs using Fluoride-based Plasma Treatment," IEEE Electron Device Letters, Vol. 26, No. 7, pp. 435-437, 2005;

Y. Cai, K. M. Lau, K. J. Chen, "Control of Threshold Voltage of AlGaN/GaN HEMTs by Fluoride-Based Plasma Treatment: From Depletion to Enhancement Mode," IEEE Electron Device Letters, Vol. 53, No. 9, pp. 2007-2215, 2006;

R. Wang, Y. Cai, Chi-Wai Tang, K. M. Lau, K. J. Chen, "Enhancement Mode $Si_3N_4$/AlGaN/GaN MISHFETs," IEEE Electron Device Letters, Vol. 27, No. 10, pp. 793-795, 2006;

M. A. Khan, Q. Chen, C. J. Sun, J. W. Yang, M. Blasingame, M. S. Shur, and H. Park, "Enhancement and depletion mode GaN/AlGaN heterostructure field effect transistors," Appl. Phys. Lett., vol. 68, no. 4, pp. 514-516, January 1996;

V. Kumar et al., "GaN HEMTs on SiC with f of over 120 GHz," IEEE Electron Device Lett., vol. 23, no. 5, pp. 455-457, May 2002;

P. K. Chu, "Recent developments and applications of plasma immersion ion implantation," J. Vac. Sci. Technol. B, vol. 22, no. 1, pp. 289-296, January/February 2004;

S. Arulkumaran, T. Egawa, H. Ishikawa, T. Jimbo, and Y. Sano, "Surface passivation effects on GaN high-electron-mobility transistors with SiO$_2$, Si$_3$N$_4$, and silicon oxynitride," J. Appl. Phys., vol. 84, no. 4, pp. 613-615, January 2004;

J. Bern, P. Javorka, A. Fox, M. Marso, H. Luth, and P. Kordo, "Effect of surface passivation on performance of AlGaN/GaN/Si HEMTs," Solid State Electron., vol. 47, no. 11, pp. 2097-2103, November 2003;

V. Kumar, A. Kuliev, T. Tanaka, Y. Otoki, and I. Adesida, "High transconductance enhancement-mode AlGaN/GaN HEMTs on SiC substrate," Electron. Lett., vol. 39, no. 24, pp. 1758-1760, November 2003;

W. B. Lanford, T. Tanaka, Y. Otoki, and I. Adesida, "Recessed-gate enhancement-mode GaN HEMT with high threshold voltage," Electron. Lett., vol. 41, no. 7, pp. 449-450, March 2005;

S. L. Rumyantsev, N. Pala, M. S. Shur, R. Gaska, M. E. Levinshtein, M. Asif Khan, G. Simin, S. Hu, and J. Yang, "Effect of gate leakage current on noise properties of AlGaN/GaN field effect transistors," J. Appl. Phys., vol. 88, no. 11, pp. 6726-6730, December 2000;

Koudymov, H. Fatima, G. Simin, J. Yang, M. Asif Khan, A. Tarakji, X. Hu, M. S. Shur, and R. Gaska, "Maximum current in nitride-based heterostructure field-effect transistors," Appl. Phys. Lett., vol. 80, no. 17, pp. 3216-3218, April 2002;

Endoh, Y. Yamashita, K. Ikeda, M. Higashiwaki, K. Hikosaka, T. Matsui, S. Hiyamizu, and T. Mimura, "Non-recessed-gate enhancement-mode AlGaN/GaN high electron mobility transistors with high RF performance," Jpn. J. Appl. Phys., vol. 43, no. 4B, pp. 2255-2258, 2004;

J.-P. Ao, D. Kikuta, N. Kubota, Y. Naoi, and Y. Ohno, "Copper gate AlGaN/GaN HEMT with low gate leakage current," IEEE Electron Device Lett., vol. 24, no. 8, pp. 500-502, August 2003;

J. Sierakowski and L. F. Eastman, "Analysis of Schottky gate electron tunneling in polarization induced AlGaN/GaN high electron mobility transistors," J. Appl. Phys., vol. 86, no. 6, pp. 3398-3401, September 1999;

M. Asif Khan, G. Simin, J. Yang, J. Zhang, A. Koudymov, M. S. Shur, R. Gaska, X. Hu, and A. Tarakji, "Insulating gate III-N heterostructure field-effect transistors for high-power microwave and switching applications," IEEE Trans. Microw. Theory Tech., vol. 51, no. 2, pp. 624-633, February 2003:

T. Hashizume, S. Ootomo, and H. Hasegawa, "Suppression of current collapse in insulated gate AlGaN/GaN heterostructure field-effect transistors using ultrathin Al$_2$O$_3$ dielectric," Appl. Phys. Lett., vol. 83, no. 14, pp. 2952-2954, October 2003;

Y. Cai, Y. G. Zhou, K. J. Chen, and K. M. Lau, "III-nitride metal-insulator-semiconductor heterojunction field-effect transistor," Appl. Phys. Lett., vol. 86, no. 3, p. 032109, January 2005;

E. J. Miller, X. Z. Dang, and E. T. Yu, "Gate leakage current mechanisms in AlGaN/GaN heterostructure field-effect transistors," J. Appl. Phys., vol. 88, no. 10, pp. 5951-5953, November 2000;

T. Hashizume, J. Kotani, and H. Hasegawa, "Leakage mechanism in GaN and AlGaN Schottky interfaces," Appl. Phys. Lett., vol. 84, no. 24, pp. 4884-4886, June 2004;

S. Karmalkar, D. M. Sathaiya, and M. S. Shur, "Mechanism of the reverse gate leakage in AlGaN/GaN high electron mobility transistors," Appl. Phys. Lett., vol. 82, no. 22, pp. 3976-3978, June 2000;

Y. Cai, Z. Cheng, C. W. Tang, K. J. Chen, and K. M. Lau, "Monolithic integration of enhancement- and depletion-mode AlGaN/GaN HEMTs for GaN digital integrated circuits," in IEDM Tech. Dig., Washington, D.C., Dec. 4-7, 2005;

V. Kumar, W. Lu, R. Schwindt, A. Kuliev, G. Simin, J. Yang, M. A. Khan, and I. Adesida, "AlGaN/GaN HEMTs on SiC with $f_T$ of over 120 GHz," IEEE Electron Device Lett., vol. 23, no. 8, pp. 455-457, August 2002.

Y. F. Wu, A. Saxler, M. Moore, R. P. Smith, S. Sheppard, P.M. Chavakar, T. Wisleder, U. K. Mishra, and P. Parikh, "30-W/mm GaN HEMTs by field plate optimization," IEEE Electron Device Lett., vol. 25, no. 3, pp. 117-119, March 2004;

J. W. Johnson, E. L. Piner, A. Vescan, R. Therrien, P. Rajagopal, J. C. Roberts, J. D. Brown, S. Singhal, and K. J. Linthicum, "12 W/mm AlGaN/GaN HFETs on siicon substrates," IEEE Electron Device Lett., vol. 25, no. 7, pp. 459-461, July 2004;

Y. Cai, Z. Q. Cheng, W. C. W. Tang, K. J. Chen, and K. M. Lau, "Monolithic integration of enhancement- and depletion-mode AlGaN/GaN HEMTs for GaN digital integrated circuits," in IEDM Tech. Dig., December 2005, pp. 771-774;

Daumiller, C. Kirchner, M. Kamp, K. J. Ebeling, and E. Kohn, "Evaluation of the temperature stability of AlGaN/GaN heterostructure FET's," IEEE Electron Device Lett., vol. 20, no. 9, pp. 448-450, September 1999;

P. G. Neudeck, R. S. Okojie, and C. Liang-Yu, "High-temperature electronics—A role for wide bandgap semiconductors?," Proc. IEEE, vol. 90, no. 6, pp. 1065-1076, June 2002;

T. Egawa, G. Y. Zhao, H. Ishikawa, M. Umeno, and T. Jimbo, "Characterizations of recessed gate AlGaN/GaN HEMTs on sapphire," IEEE Trans. Electron Devices, vol. 48, no. 3, pp. 603-608, March 2003;

M. Micovic, T. Tsen, M. Hu, P. Hashimoto, P. J. Willadsen, I. Milosavljevic, A. Schmitz, M. Antcliffe, D. Zhender, J. S. Moon, W. S. Wong, and D. Chow, "GaN enhancement/depletion-mode FET logic for mixed signal applications," Electron. Lett., vol. 41, no. 19, pp. 1081-1083, September 2005;

Y. Cai, Y. G. Zhou, K. J. Chen, and K. M. Lau, "High-performance enhancement-mode AlGaN/GaN HEMTs using fluoride-based plasma treatment," IEEE Electron Device Lett., vol. 26, no. 6, pp. 435-437, July 2005;

T. Palacios, C.-S. Suh, A. Chakraborty, S. Keller, S. P. DenBaars, and U. K. Mishra, "High-performance E-mode AlGaN/GaN HEMTs," IEEE Electron Device Lett., vol. 27, no. 6, pp. 428-430, June 2006;

Endoh, Y. Yamashita, K. Ikeda, M. Higashiwaki, K. Hikosaka, T. Matsui, S. Hiyamizu, and T. Mimura, "NOn-recessed-gate enhancement-mode AlGaN/GaN high electron mobility transistors with high RF performance," Jpn. J. Appl. Phys., vol. 43, no. 4B, pp. 2255-2258, 2004;

M. A. Khan, X. Hu, G. Sumin, A. Lunev, J. Yang, R. Gaska, and M. S. Shur, "AlGaN/GaN metal oxide semiconductor heterostructure field effect transistor," IEEE Electron Device Lett., vol. 21, no. 2, pp. 63-65, February 2000;

X. Hu, A. Koudymov, G. Simin, J. Yang, and M. A. Khan, "Si$_3$N$_4$ /AlGaN/GaN-metal-insulator-semiconductor heterostructure field-effect transistors," Appl. Phys. Lett., vol. 79, no. 17, pp. 2832-2834, October 2001;

Chini, J. Wittich, S. Heikman, S. Keller, S. P. DenBaars, and U. K. Mishra, "Power and linearity characteristics of GaN MISFET on sapphire substrate," IEEE Electron Device Lett., vol. 25, no. 2, pp. 55-57, February 2004;

M. Kanamura, T. Kikkawa, T. Iwai, K. Imanishi, T. Kubo, and K. Joshin, "An over 100 W n-GaN/n-AlGaN/GaN MIS-HEMT power amplifier for wireless base station applications," in IEDM Tech. Dig., December 2005, pp. 572-575;

Published application US20030218183, "High power-low noise microwave GaN heterostructure field effect transistor";

Published application US2005059197 "Semiconductor device and method for manufacturing the same";

Published application US30040041169 "GaN-type enhancement MOSFET using hetero structure";

Published application US20020177261 "Monolithically intergrated E/D mode HEMT and method for fabricating the same"; and Published application US19864615102 "Mehtod of producing enhancement mode and depletion mode FETs".

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "mean for" are followed by a participle.

The claims as filed are intended to be as comprehensive as possible, and NO subject matter is intentionally relinquished, dedicated, or abandoned.

What is claimed is:

1. A Group III nitride semiconductor active device, comprising:
   first and second conductive source/drain regions, separated by a channel consisting essentially of a Group III nitride compound;
   a wider-bandgap semiconductor layer, which is overlying said channel, which wider-bandgap semiconductor layer also consists essentially of a Group III nitride compound, and which has a higher fraction of aluminum than does said channel;
   a conductive gate electrode which lies above said wider-bandgap semiconductor layer, and which conductive gate electrode is capacitively coupled to said channel to control conduction therein; and
   wherein said wider-bandgap semiconductor layer comprises negatively charged fluorine ions which sufficiently shift the threshold voltage of said channel, as seen by said gate, that said channel has a positive threshold voltage at zero supplied gate voltage.

2. The device of claim 1, wherein said wider-bandgap semiconductor layer comprises dopant atoms, said channel has fewer than one-tenth as many dopant atoms per unit volume as that of said wider-bandgap semiconductor layer.

3. The device of claim 1, wherein said wider-bandgap semiconductor layer has inhomogeneous doping.

4. The device of claim 1, further comprising a gate insulator layer below said conductive gate electrode.

5. The device of claim 1, wherein said channel layer is Gallium-Nitride (GaN), and said wider-bandgap semiconductor layer is Aluminum-Gallium-Nitride (AlGaN).

6. The device of claim 5, wherein said wider-bandgap semiconductor layer comprises dopant atoms, said channel has fewer than one-tenth as many dopant atoms per unit volume as that of said wider-bandgap semiconductor layer.

7. The device of claim 1, wherein said conductive gate electrode overlies a planar portion of said wider-bandgap semiconductor layer, without any recess etch.

8. The device of claim 1, wherein said negatively charged fluorine ions are more than $10^{18}$ ions per cubic centimeter ($cm^{-3}$) in concentration.

9. A Group III nitride semiconductor active device, comprising:
   first and second conductive source/drain regions, separated by a channel consisting essentially of a Group III nitride compound;
   a wider-bandgap semiconductor layer, which is overlying said channel, which wider-bandgap semiconductor layer also consists essentially of a Group III nitride compound, and which has a higher fraction of aluminum than does said channel;
   a conductive gate electrode which lies above said wider-bandgap semiconductor layer, and which conductive gate electrode is capacitively coupled to said channel to control conduction therein; and
   wherein said wider-bandgap semiconductor layer comprises more than $10^{18}$ negatively charged fluorine ions per cubic centimeter ($cm^{-3}$).

10. The device of claim 9, wherein said wider-bandgap semiconductor layer comprises dopant atoms, and said channel has fewer than one-tenth as many dopant atoms per unit volume as said wider-bandgap semiconductor layer.

11. The device of claim 9, further comprising a gate insulator layer below said conductive gate electrode.

12. The device of claim 9, wherein said channel layer is Gallium-Nitride (GaN), and said wider-bandgap semiconductor layer is Aluminum-Gallium-Nitride (AlGaN).

13. The device of claim 9, wherein said conductive gate electrode overlies a planar portion of said wider-bandgap semiconductor layer, without any recess etch, and said fluorine ion profile and said channel structure is adjusted by a post-gate thermal annealing.

14. A Group III nitride semiconductor active device, comprising:
   first and second conductive source/drain regions, connected by a channel, all of the first and second conductive source/drain regions and the channel comprising essentially a Group III nitride semiconductor compound;
   a wider-bandgap semiconductor layer, overlying and lattice matched to said channel, which has a higher fraction of aluminum than does said channel;
   a conductive gate electrode which lies above said wider-bandgap semiconductor layer, and is capacitively coupled to said channel to control conduction therein; and
   wherein said wider-bandgap semiconductor layer comprises negatively charged fluorine ions in a concentration which shifts the threshold voltage of said channel, as seen by said gate, by at least 100 millivolts.

15. The device of claim 14, further comprising a gate insulator layer below said conductive gate electrode.

16. The device of claim 14, wherein said channel layer is Gallium-Nitride (GaN), and said wider-bandgap semiconductor layer is Aluminum-Gallium-Nitride (AlGaN).

17. The device of claim 14, wherein said conductive gate electrode overlies a planar portion of said wider-bandgap semiconductor layer, without any recess etch, and said Group III nitride semiconductor active device having reduced plasma-induced damage based in part on a post-gate thermal annealing treatment at 400-800 degrees Celsius (° C.).

18. The device of claim 1, wherein said Group III nitride semiconductor active device having reduced plasma-induced damage based in part on a post-gate thermal annealing.

* * * * *